(12) United States Patent
Vogl et al.

(10) Patent No.: US 9,076,821 B2
(45) Date of Patent: Jul. 7, 2015

(54) ANCHORING STRUCTURE AND INTERMESHING STRUCTURE

(75) Inventors: Erwin Vogl, Hallbergmoos (DE); Markus Zundel, Egmating (DE)

(73) Assignee: Infineon Technologies AG, Neubiberg (DE)

( * ) Notice: Subject to any disclaimer, the term of this patent is extended or adjusted under 35 U.S.C. 154(b) by 72 days.

(21) Appl. No.: 13/402,394

(22) Filed: Feb. 22, 2012

(65) Prior Publication Data

US 2012/0211891 A1 Aug. 23, 2012

Related U.S. Application Data

(63) Continuation-in-part of application No. 13/316,205, filed on Dec. 9, 2011, now abandoned, which is a continuation-in-part of application No. 12/112,588, filed on Apr. 30, 2008, now Pat. No. 8,084,865.

(30) Foreign Application Priority Data

Apr. 30, 2007 (DE) .......................... 10 2007 020 263

(51) Int. Cl.
| | |
|---|---|
| H01L 23/48 | (2006.01) |
| H01L 29/66 | (2006.01) |
| H01L 23/482 | (2006.01) |
| H01L 29/78 | (2006.01) |
| H01L 29/40 | (2006.01) |
| H01L 29/423 | (2006.01) |

(52) U.S. Cl.
CPC ...... *H01L 29/66734* (2013.01); *H01L 23/4824* (2013.01); *H01L 2924/00013* (2013.01); *H01L 29/407* (2013.01); *H01L 29/4236* (2013.01); *H01L 29/42372* (2013.01); *H01L 29/4238* (2013.01); *H01L 29/7811* (2013.01); *H01L 29/7813* (2013.01); *H01L 2924/0002* (2013.01)

(58) Field of Classification Search
CPC .................. H01L 29/4236; H01L 2924/00013
USPC ........................................................ 257/773
See application file for complete search history.

(56) References Cited

U.S. PATENT DOCUMENTS

| | | |
|---|---|---|
| 4,841,354 A | 6/1989 | Inaba |
| 5,075,763 A | 12/1991 | Spitzer et al. |
| 5,470,790 A | 11/1995 | Myers et al. |
| 5,475,268 A | 12/1995 | Kawagoe et al. |
| 5,614,751 A | 3/1997 | Yilmaz et al. |
| 5,831,330 A | 11/1998 | Chang |

(Continued)

FOREIGN PATENT DOCUMENTS

| | | |
|---|---|---|
| DE | 33 31 624 A1 | 3/1984 |
| DE | 199 21 015 A1 | 1/2000 |

(Continued)

OTHER PUBLICATIONS

Japanese Office Action received on Application No. 2012-015456, mailed Sep. 10, 2013, 7 pages.

*Primary Examiner* — Brett Feeney
*Assistant Examiner* — Damian A Hillman
(74) *Attorney, Agent, or Firm* — Slater & Matsil, L.L.P.

(57) ABSTRACT

An anchoring structure for a metal structure of a semiconductor device includes an anchoring recess structure having at least one overhanging side wall, the metal structure being at least partly arranged within the anchoring recess structure.

19 Claims, 36 Drawing Sheets

(56) References Cited

U.S. PATENT DOCUMENTS

| | | | |
|---|---|---|---|
| 5,877,528 A | 3/1999 | So | |
| 6,159,851 A | 12/2000 | Chen et al. | |
| 6,163,065 A | 12/2000 | Seshan et al. | |
| 6,304,001 B1 * | 10/2001 | Sekiguchi et al. | 257/797 |
| 6,495,918 B1 | 12/2002 | Brintzinger | |
| 6,613,664 B2 | 9/2003 | Barth et al. | |
| 6,639,275 B2 | 10/2003 | Ninomiya | |
| 6,812,568 B2 | 11/2004 | Horikawa et al. | |
| 6,818,947 B2 | 11/2004 | Grebs et al. | |
| 7,242,057 B2 * | 7/2007 | Tang et al. | 257/330 |
| 8,198,678 B2 | 6/2012 | Mauder et al. | |
| 2001/0053568 A1 | 12/2001 | Deboy et al. | |
| 2002/0113318 A1 * | 8/2002 | Chen | 257/777 |
| 2003/0190817 A1 | 10/2003 | Horikawa et al. | |
| 2004/0187975 A1 | 9/2004 | Suemasu et al. | |
| 2005/0056892 A1 * | 3/2005 | Seliskar | 257/348 |
| 2005/0127516 A1 | 6/2005 | Mercer et al. | |
| 2005/0146036 A1 | 7/2005 | Huang | |
| 2006/0192298 A1 | 8/2006 | Bauer et al. | |
| 2006/0209586 A1 | 9/2006 | Hirler | |
| 2007/0063318 A1 | 3/2007 | Maier et al. | |
| 2008/0265427 A1 | 10/2008 | Hirler et al. | |
| 2008/0290516 A1 | 11/2008 | Oda | |

FOREIGN PATENT DOCUMENTS

| | | |
|---|---|---|
| DE | 19843959 A1 | 4/2000 |
| DE | 101 03 966 A1 | 3/2002 |
| DE | 102 43 961 A1 | 1/2004 |
| DE | 101 96 677 T | 4/2004 |
| DE | 10 2004 004 532 A1 | 9/2004 |
| DE | 10 2005 005 749 A1 | 8/2006 |
| DE | 10 2005 008 354 A1 | 8/2006 |
| DE | 10 2005 043 914 A1 | 3/2007 |
| DE | 60126960 T2 | 11/2007 |
| DE | 102007020263 A1 | 11/2008 |
| DE | 102010062721 A1 | 6/2011 |
| DE | 10196677 B4 | 3/2014 |
| JP | 57-152130 | 9/1982 |
| JP | 63-237552 | 10/1988 |
| JP | 01-256152 | 10/1989 |
| JP | 05-041377 | 2/1993 |
| JP | 05-243318 | 9/1993 |
| JP | 05-275421 | 10/1993 |
| JP | 05-283540 | 10/1993 |
| JP | 10507315 | 7/1998 |
| JP | 11-017009 | 1/1999 |
| JP | 2000091425 | 3/2000 |
| JP | 2000277728 | 10/2000 |
| JP | 2005-45198 | 2/2005 |
| JP | 2006-100317 | 4/2006 |
| JP | 2006-216596 | 8/2006 |
| JP | 2006-310508 | 11/2006 |
| JP | 2007-027589 | 2/2007 |
| KR | 2007071617 A * | 7/2007 |

* cited by examiner

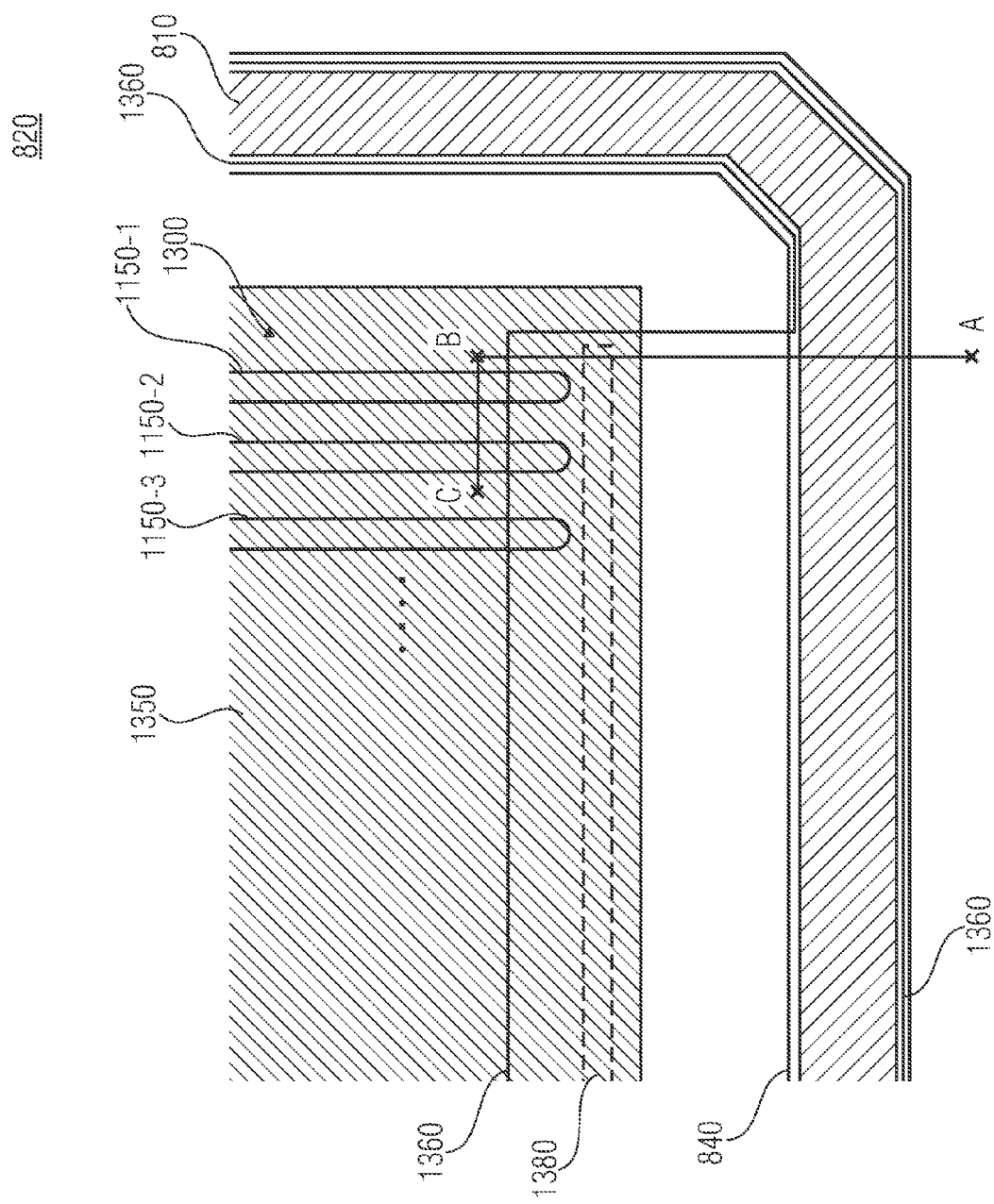

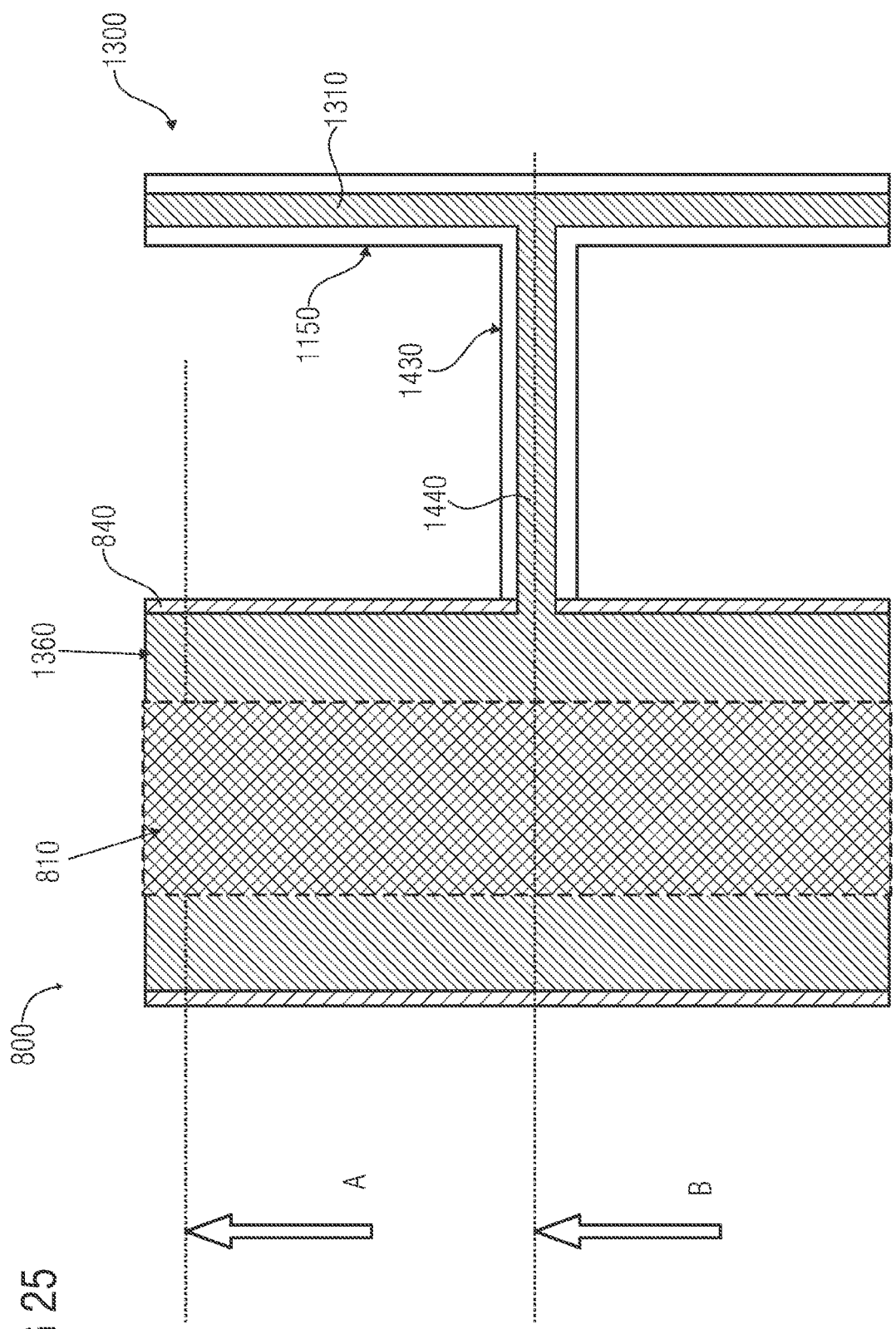

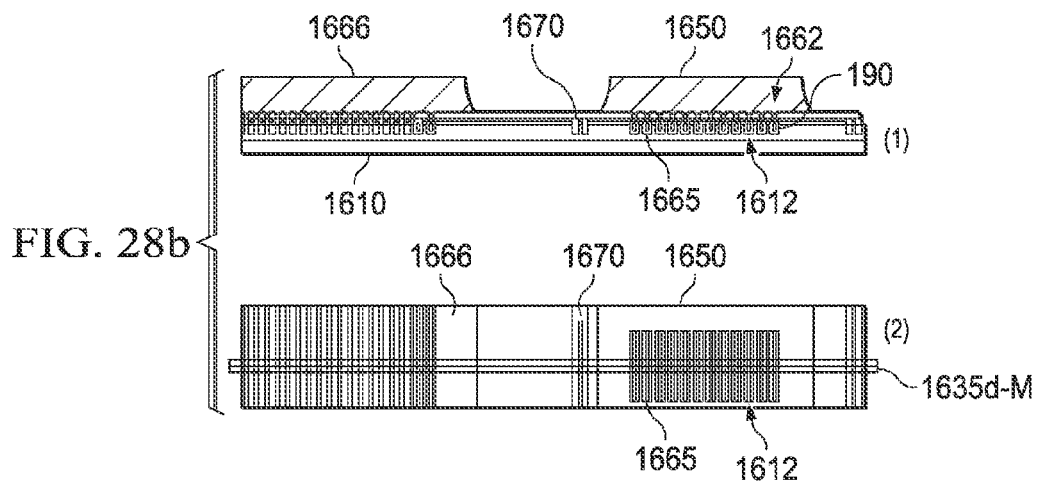

ANCHORING STRUCTURE AND INTERMESHING STRUCTURE

This application is a continuation-in-part of patent application Ser. No. 13/316,205, filed on Dec. 9, 2011, which a continuation-in-part of patent application Ser. No. 12/112,588, filed on Apr. 30, 2008, which claims priority to German Patent Application No. 10 2007 020 263.8, filed on Apr. 30, 2007, which applications are incorporated herein by reference.

BACKGROUND

The present invention relates to an anchoring structure and an intermeshing structure, or gripping structure, as may be employed, for example, in the field of semiconducting devices, for example with (vertical) transistors.

When developing new generations of semiconductor devices, for example vertical power transistors or DMOS power transistors (DMOS=double diffused metal oxide semiconductor), the provision of top quality and reliability of the components is an important goal. Therefore, the latest generations of transistors have to undergo the most stringent reliability tests before they are delivered. In this context, one important test is temperature cycling (TC). During this test, the interaction between the chip, or die, which is mostly made of semiconductor material, insulators and metals, and the housing, mostly made of plastics, is tested. In particular, in the case of this test, the behavior of the finished device after molding or after the packaging process is examined with regard to the behavior of the frequently different expansion coefficients between the semiconducting material of the die and the molding compound utilized in the packaging process.

Due to these different expansion coefficients, rim regions of a chip are frequently subject to particular load during the temperature cycling, which is also referred to as TC stress. It is especially in these regions subject to TC stress that various failure scenarios may occur which may present an increased reliability risk for the actual devices.

Such risks are to be avoided, if possible, especially in the chip rim area. For a very large number of devices, it is in the very rim area of the chip that metallic structures are arranged which are implemented, for example, for contacting functional structures of the device. With (vertical) transistors, problems occur, for example, with regard to the reliability in the area of the so-called gate runner structure, which often extends in the area of the chip rim and serves for contacting the gate electrodes of the vertical transistors. In the case of the example of a gate runner structure, it may occur that in the worst case the gate runner metal line completely detaches from and is lifted off the chip surface. This effect is also referred to as "lifted metal lines).

In addition, what may also happen is that the metal structure concerned, i.e., for example, the gate runner metal line, still remains adhered to the chip surface, but due to the TC load was shifted back and forth so much that, at the end of a respective TC test, it is noticeably shifted away from its original position in several places. This effect is also referred to as "shifted metal line".

Such shifted metal structures, or shifted metal lines, are frequently also clearly different in the cross-sectional shape. For example, at the beginning of the test they have an approximately symmetrical trapezoid shape, whereas a highly sheared trapezoid may often be observed at the end of such a test.

Such reliability risks as may quite possibly occur, for example, merely due to the heat generated in the device concerned, depending on the application of the future device, may thus lead to a total failure of the device, since individual functional areas of the device are no longer or no longer fully connected. If, for example in the case of a (vertical) transistor, the gate runner structure becomes detached or shifted, some cells in the area of the cell field of the device concerned which includes the actual transistor structures can no longer be controlled, so that the electric characteristics of the vertical transistor will change over the course of the operation.

Thus, if parts of the actual cell field of the vertical transistor fail because of metal structures that have been lifted off or have been shifted, it may occur, during further operation, that the remaining cells of the cell field become overloaded, so that eventually the vertical transistor, or the device concerned, may be destroyed during operation.

SUMMARY OF THE INVENTION

An embodiment of an anchoring structure for a metal structure of a semiconductor device includes an anchoring recess structure comprising at least one overhanging sidewall, wherein the metal structure is at least partly arranged within the anchoring recess structure.

Further embodiments of an intermeshing structure for a device comprising a cell field and formed on a substrate include an intermediate insulating layer which is structured such that an intermediate insulating layer is interrupted by at least one contact hole. The intermeshing structure further comprises a metal structure on the intermediate insulating layer for connecting the cell field and a support structure comprising polysilicon and embedded in a recess formed in the substrate and aligned with the contact hole, wherein the support structure is not part of the cell field, and wherein the metal structure extends through the contact hole up to the support structure to which the metal structure is adherently connected.

A further embodiment of an intermeshing structure comprises a substrate comprising a main surface and a mono-crystalline semiconductor abutting the main surface of the substrate. The intermeshing structure further comprises a recess formed in the mono-crystalline semiconductor within the main surface of the substrate, an insulating layer formed on the main surface of the substrate and a conductor layer structure. The conductor layer structure comprises a metal layer which is formed on the insulating layer and extends through a hole of the insulating layer into the recess, and polysilicon at a bottom of the recess, wherein the polysilicon abuts the metal layer.

Another embodiment of a semiconductor device comprises a substrate, an active area formed in same, an insulating layer formed on a surface of the substrate and a metal layer formed on the insulating layer and contacting the active area, wherein a recess is formed in the substrate and filled with polysilicon, and wherein the metal layer extends through a hole in the insulating layer and adheres to the polysilicon.

BRIEF DESCRIPTION OF THE DRAWINGS

Embodiments of the present invention will be explained below in more detail with reference to the accompanying figures, wherein:

FIG. 23B shows a top view of the device shown in FIG. 23A in accordance with an embodiment of the present invention;

FIG. 25 shows a top view of an anchoring structure in accordance with an embodiment of the present invention;

FIG. 28B exemplarily shows a further top view and a corresponding cross-sectional view of the semiconductor device according to FIG. 28A; and FIG. 28C exemplarily shows a current semiconductor device.

DETAILED DESCRIPTION OF ILLUSTRATIVE EMBODIMENTS

FIGS. 1-28 show embodiments of inventive intermeshing structures and of inventive anchoring structures as well as figures for illustrating and explaining the respective embodiments. However, before embodiments of anchoring structures and intermeshing structures are looked at and explained in more detail in connection with FIGS. 2-28, the expressions "topology edge" and "topology-forming edge" as well as the representations used within the context of the present application will initially be explained in more detail in connection with FIGS. 1A and B.

Figure 1A:
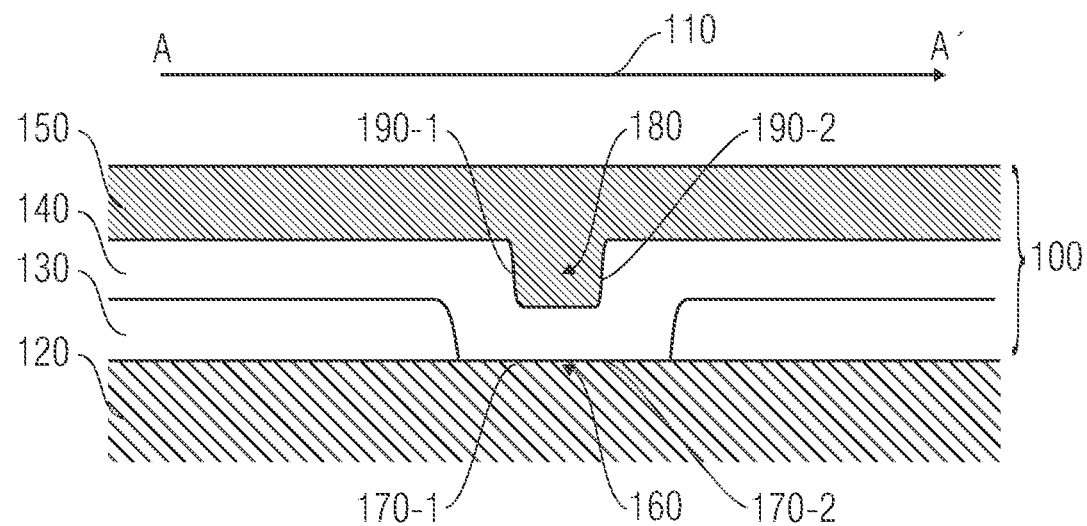
FIGS. 1A and B illustrate the terms "topology edge" and "topology-forming edge"
Figure 1B:
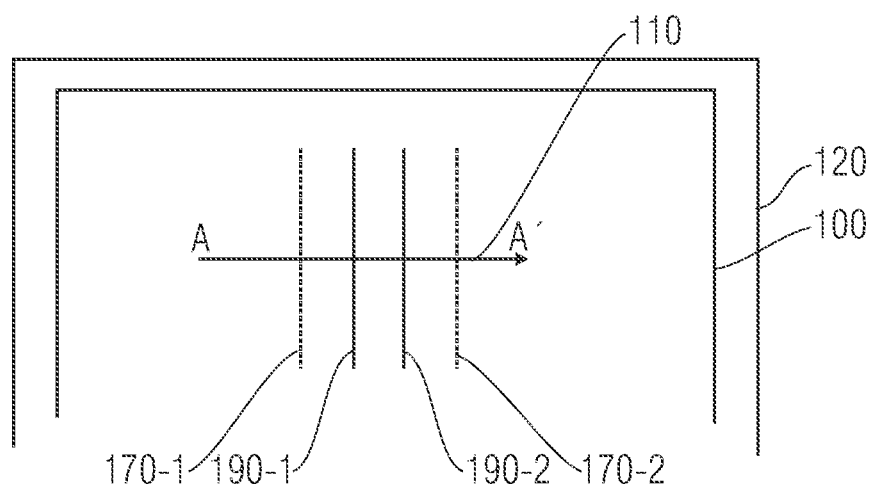

FIG. 1A depicts a cross-section through a layer structure 100, while FIG. 1B represents the respective top view of the device. Here, FIG. 1A shows the cross-section through the device along line A-A', as is illustrated by the arrow 110 in FIG. 1A. FIG. 1B, which depicts the top view of the respective device, or the respective layer structure 100, also represents the arrow 110, which represents the direction of the cross-section depicted in FIG. 1A.

The layer structure 100 as depicted in FIG. 1A is applied on a substrate 120 and includes a first layer 130 directly deposited or directly located on the substrate 120. A second layer 140, which was deposited on the first layer 130 in a conforming manner is located on the first layer 130. Again, the second layer 140 has a third layer 150 applied thereon, which unlike the underlying layers 130, 140, comprises a planarized surface.

In the area of the center of the cross-section depicted in FIG. 1A, the first layer 130 comprises a recess 160, so that the first layer 130 is interrupted in this area. As a result, two topology-forming edges 170-1 and 170-2 are formed which are also depicted in FIG. 1B in the area of the spatial arrangement of the layer structure 100 on the substrate 120.

As was explained above, in the structure shown in FIGS. 1A and 1B, the second layer 140 is deposited on the first layer 130 in a conforming manner, so that essentially the thickness of the second layer 140 is constant except for the area in the direct surroundings of the topology-forming edges 170 with regard to the surface area of the layer structure 100 within the context of the technical facts. This means that the recess 160 in the first layer 130 also leads to a recess 180 in the second layer 140, the two topology-forming edges 170-1, 170-2 leading to two topology edges 190-1 and 190-2 in the second layer 140.

For the third layer 150, which in the case of the layer structure 100 shown in FIGS. 1A and 1B is applied after the second layer 140, the topology edges 190-1, 190-2 which are caused by the two topology-forming edges 170-1, 170-2 in the first layer 130 thus represent such topology-forming layers in the second layer, said topology edges 190-1, 190-2 leading to the recess 180 already illustrated. The material of the third layer 150 will then enter into the recess 180. The material of the third layer may be filled up, for example, using the common deposition methods and manufacturing methods of thin-film technology. Thus, for the third layer 150, which may be, for example, a metal layer, the topology edges 190-1, 190-2 indeed represent edges influencing the topology, which are caused by the topology-forming edges 170-1, 170-2 in the underlying first layer 130.

Of course, it shall be noted in this context that the two topology-forming edges 170-1, 170-2 of the first layer 130 also represent topology edges for the second layer 140. The designations "topology-forming edges" and "topology edge" in the above description refer to the third layer 150. Generally speaking, they are thus typically understood to relate to a specific layer. FIG. 1B shows the location of the topology edges 190-1, 190-2 in relation to the two topology-forming edges 170-1, 170-2, which delimit the recess 160, in a representation which is not to scale.

FIGS. 1A and 1B thus illustrate in particular that, for example in the case of a conforming deposition, topology-forming edges 190 may also occur in layers which are otherwise non-structured in the area concerned, as is depicted by FIG. 1A for the case of the second layer 140. The topology edges 190 of the second layer 140 are a consequence of the conforming deposition of the second layer and of the topology-forming edges 170 which are already present in the underlying first layer 130.

On the other hand, if the surface of a respective layer is planarized, as is depicted in FIG. 1A for the case of the third layer 150, underlying topology-forming edges will no longer act as topology-forming edges or topology edges for overlying layers. In the case of the layer structure 100 shown in FIG. 1A this means, for example, that for a layer which would be deposited onto the third layer 150 with its planarized surface, the two topology edges 190-1, 190-2 would no longer act as topology-forming edges, since due to the planarization of the third layer 150 their structure, which may possibly exist due to a conforming deposition or any other topology-sustaining deposition, would be planarized, or leveled.

In the context of a structuring as may be used, for example, for producing the layer structure 100 shown in FIGS. 1A and 1B, it is not least the standard methods of semiconductor and thin-film technology that count. Thus, the layers 130, 140, 150 may be created, for example, by means of thermal evaporation, electron-beam evaporation, by a sputtering process or other physical and/or chemical deposition methods. Furthermore, there is the possibility of fabricating respective structures also by means of spin-coating, as the need may be. Depending on the material used and/or the process technology employed, the respective layers may be effected in a conforming or topology-sustaining manner, or in a non-conforming or non-topology-sustaining manner. In addition, hybrid forms are also possible, of course, which lead to partial leveling of existing structures. This may be influenced, for example, by the amount of the material to be deposited that is used, i.e. by the envisaged layer thickness.

For structuring, the common thin-film or semiconductor methods may be employed which comprise photolithographic structuring and respective wet-chemical, physical or reactive etching methods, for example. Examples are thus dipping a sample, which is adequately structured and developed, into an acid, a base or any other reactive chemical. Likewise, physical etching processes (e.g. ion beam etching, IBE) or chemically supported physical etching processes (e.g. reactive ion etching, RIE) may also be used. Also, appropriate etch-back steps or polishing processes, or lap processes may also be used for planarizing layers. One example is chemical-mechanical polishing, CMP.

As was already mentioned above, the third layer 150 may be a metal layer, for example. Typically, gold, silver, aluminum, copper, tungsten, chromium, titanium, platinum or palladium are used for such metal layers. The other two layers 130, 140 may, for example, be insulating layers made of an oxide or nitride, or may be (doped) semiconductor layers, for example a layer made of polysilicon.

Prior to describing and explaining the first embodiments of the present invention in more detail, it shall be noted that, in the context of the present application, objects, structures and components bearing identical or similar functional and/or structural features are designated by identical reference numerals. Unless not explicitly stated otherwise, in this case, passages of the description which relate to objects, structures and components bearing similar or identical functional properties and features may be interchanged. In addition, summarizing reference numerals will be used, in the further course of the present application, for objects, structures and components which come up in an identical or similar manner in an embodiment or in structures in more than one figure. For example, the summarizing reference numeral 170 was already used, in the layer structure 100 described above, for the two topology-forming components 170-1 and 170-2. Likewise, the summarizing reference numeral 190 was already used for the two topology edges 190-1, 190-2. Using summarizing reference numerals thus enables a more compact, fluent and a clearer description of the embodiments of the present invention.

Figure 2:
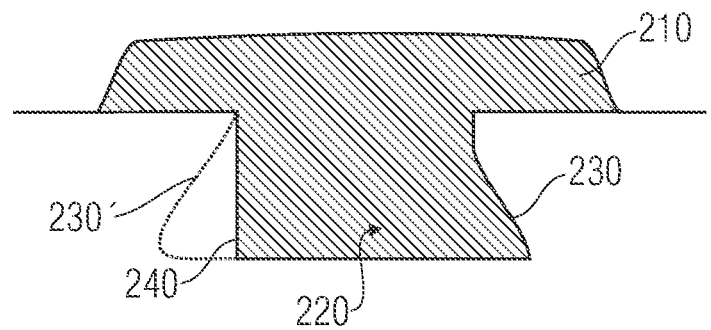
FIG. 2 illustrates a cross-section through an embodiment of an anchoring structure.

FIG. 2 shows a first embodiment of an anchoring structure 200 comprising a metal structure 210 engaging in, or dipping into, an anchoring recess structure 220 having at least one overhanging side wall. The anchoring recess structure 220 may be fabricated, for example, in a substrate material, i.e. for example silicon or any other semiconductor substrate, but may also be generated in a layer, or a combination of both. Depending on the material used for the layer, or the structure, or the substrate, wherein the anchoring recess structure 220 is to be created, different manufacturing methods may be used, which will be examined below. Possible materials for respective layers are semiconducting layers, i.e. epitaxial silicon layers or polymorphic silicon layers (poly-Si or polysilicon), insulator layers (oxide layers, nitride layers) or other, for example organic, layers (polyimide layers, polyamide layers, PMMA layers, etc.).

In addition to the overhanging side wall 230, the anchoring structure 200 shown in FIG. 2 comprises a side wall 240 which extends in an essentially perpendicular manner and is located opposite the side wall 230. Naturally, the side wall 240 may optionally also be exchanged for an overhanging side wall 230' in a further embodiment of an anchoring structure 200. However, irrespective of whether the anchoring recess structure 220 comprises one or several overhanging side walls 230, these side walls 230 anchor the metal structures 210, arranged within the anchoring recess structure 220, such that said metal structures 210 can hardly, or not at all, be lifted off and/or shifted in an attempt to influence the device concerned.

In other words, the fact that the metal structure is at least partly arranged in the anchoring recess structure with its at least one overhanging side wall 230 results in that the metal structure 210 as a whole, in the true sense of the word, is anchored with the surrounding structure within which the anchoring recess structure 220 is created. Load-induced or stress-induced tendencies which might lead to a shift in the metal structure 210 are therefore suppressed in a controlled manner, so that the quality-impairing tendencies which occur, for example, in the context of a TC cycle (TC=temperature cycling) are counteracted in a controlled manner.

Thus, by implementing an embodiment of an anchoring structure 200, the safety of operation of a device may be significantly increased without having to take additional costly measures. Embodiments of such an anchoring structure 200 therefore enable a low-cost possibility, which is generally easy to implement, of increasing the safety of operation with respect to the reliability of the devices.

Put differently, the introduction of embodiments of anchoring structures 200 may enable a significant improvement in the TC behavior of metal zones 210 or metal structures 210 in a largely cost-neutral manner. Embodiments of such anchoring structures 200 may be employed, for example, for technologies which already use trenches in the process flow anyway. If what is dealt with are vertical transistors, for example, comprising a cell field having respective trenches, one or several very wide trenches may be created, for example, below the metal structures 210 to be anchored during the same process step in which the cell field trenches are created. These trenches or recesses are therefore also referred to as anchoring trenches or anchoring recess structures 220.

Appropriate measures may be implemented in an extremely cost-efficient manner, since what needs to be done for this purpose is to essentially only adapt the layout of the finished device below the metal structures 210. More specifically, it is possible to introduce a trench, which is to serve as an anchoring recess structure 220 and has the trench width matching the respective technology, into the layout below the respective metal structures 210. If what is dealt with are vertical high-power transistors, for example, it is also possible to determine the width of the respective anchoring trenches or anchoring recess structures 220, depending on the voltage class envisaged, apart from a depth of the anchoring recess structure which is determined in the simplest manner by the trench depth envisaged in the cell field.

In other words, apart from the target depth, which, e.g., in the simplest example results from the trench depth in the actual cell field of the vertical transistor, or its device, the precise geometry of the anchoring recess structure 220 may additionally be modified by means of the width, laid down in the layout of the respective device, of the anchoring recess structure 220 (trench width). For the layer thicknesses for a power metallization as the metal structure 210, which are frequently used in this context and are approximately 5 µm thick, the envisaged depth of the trenches of the anchoring structure 200 therefore ranges between approximately 3 µm and 7 µm. Of course, there is also the possibility of realizing or manufacturing the anchoring recess structures 220 in separate process steps.

As this discussion has already shown, the potential details relating to process engineering highly depend on the process in which a manufacturing method for an embodiment of an anchoring structure 200 is to be implemented or integrated. Prior to explaining further possibilities of creating a respective overhanging side wall 230 or an anchoring recess structure 220, two further embodiments of an anchoring structure 200 will therefore be explained, with reference to FIGS. 3 and 4, for the case of a so-called gate runner as a metallic structure for contacting the gate electrodes of field-effect transistors.

Figure 3:
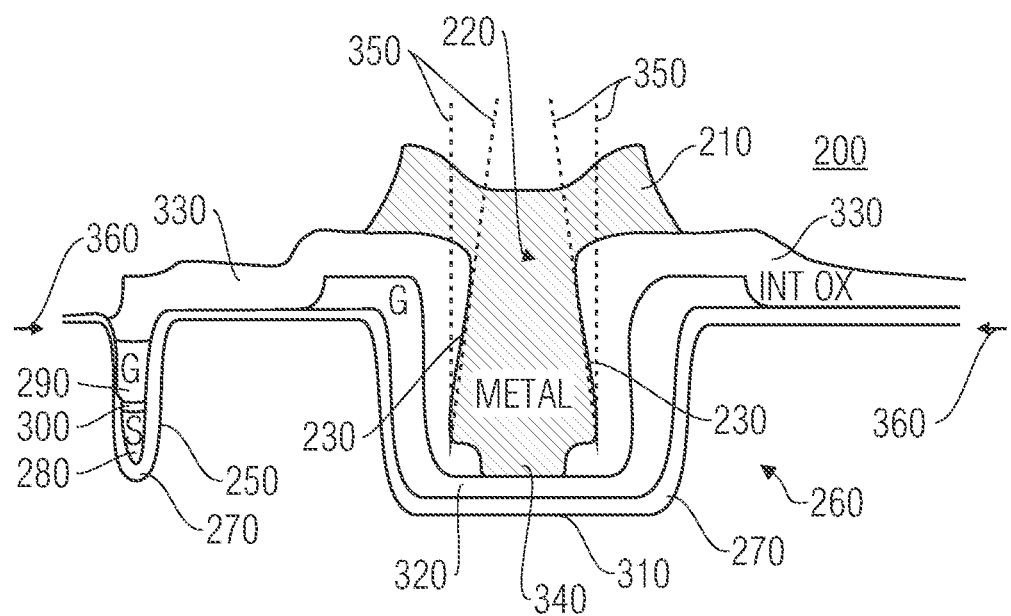
FIG. 3 illustrates a cross-section through a further embodiment of an anchoring structure.

FIG. 3 shows such a cross-section through an embodiment of an anchoring structure 200 the case of a vertical field-effect transistor comprising a plurality of trenches, the first trench 250 of which being shown in the left-hand section of FIG. 3. Here, the device in the form of the vertical field-effect transistor is manufactured on the basis of a monocrystalline silicon substrate which subsequently had an epitaxial silicon zone 260, into which the trench 250 was structured, applied thereto. The epitaxial silicon zone here represents a support layer structure for the actual device and the embodiment of the anchoring structure 200. The trench 250 is lined with an insulating layer 270, into which a lower electrode 280 of polysilicon (poly-Si) is deposited. An upper electrode 290, which may also be made of polysilicon and is electrically insulated from the lower electrode 280 by a thin insulating layer 300, is arranged above the lower electrode 280 within the trench 250.

In this context, the insulating layer 270 at the level of the upper electrode 290 in the left-hand area of the first trench 250 is embodied to be thinner than in the underlying bottom area of the first trench 250. Because of this tapering of the insulating layer 270, the characteristic properties of the conductive channel forming in this area between the trenches may be influenced via the upper electrode 290, which is a gate electrode of the vertical transistor, by means of a relatively low control voltage or gate voltage. Since the upper electrode 290 thus also acts as a gate electrode, it is also designated by the letter "G" in FIG. 3.

By contrast, with the design of a vertical transistor which is shown in FIG. 3, the source potential is applied to the lower electrode 280, which is why the lower electrode 280 is designated by "S" in FIG. 3. The lower electrode 280 is also referred to as a field plate, since it influences the electrostatic field in the area between the trenches.

In addition to the first trench 250, which represents the rim of the cell field of the respective device, the embodiment shown in FIG. 3 of an anchoring structure 200 comprises an anchoring trench 310, or trench 310, which is also arranged in the epitaxial zone 260 above the monocrystalline silicon substrate. Just like the first trench 250, the anchoring trench 310 is also lined with an insulating layer 270 which electrically insulates the overlying layers from the epitaxial zone 260. In addition, for completeness' sake it shall be mentioned that the insulating layer 270 also extends in the area between the anchoring trench 310 and the first trench 250 as well as on that side of the anchoring trench 310 which faces away from the first trench 250, and there also ensures electrical insulation of the overlying layers from the epitaxial zone 260.

Within the anchoring trench 310, a feed structure 320 is arranged above the insulating layer 270, the feed structure 320 extending on a bottom of the anchoring trench 310 across the side walls thereof into the area outside the anchoring trench 310. The feed structure 320 is typically also made of polysilicon and contacts the upper electrode 290 in the trenches (also in the first trench 250) via a structure extending outside the sectional plane shown in FIG. 3. To mark this, the feed structure 320 is also identified by the letter "G" in FIG. 3 and is frequently also referred to as "poly-G" or as "poly gate". In other words, the poly gate 320 contacts the upper electrode 290 in the trenches, which also include the first trench 250, via a structure most of the time fabricated from polysilicon and extending through the device outside the sectional plane shown in FIG. 3.

Within the anchoring trench 310 and at the side walls thereof, the poly-G 320 is covered by an intermediate oxide 330 also referred to as "INT OX" in FIG. 3. The intermediate oxide 330 additionally also extends within the area within which the poly-G 320 does not extend, based on the cross-section shown in FIG. 3. Thus, the intermediate oxide 330 also covers, inter alia, the upper electrode 290 located in the first trench 250 which serves as a gate electrode.

In the area of the bottom of the anchoring trench 310, the intermediate oxide 330 comprises a contact hole 340 via which the poly-G 320 is in direct, electrically conductive contact with the metal structure 210 of the embodiment of the anchoring structure 200. As was already mentioned above, the metal structure 210 here is part of the so-called gate runner structure which runs along in the outer area of the chip and serves to contact the feed structures, or the poly-G 320. The precise course of a gate runner will be explained in more detail in the context of FIG. 6.

The metal structure 210 of the embodiment of the anchoring structure 200 here is arranged inside the anchoring trench 310. The anchoring recess structure 220 in this case is formed by a recess in the intermediate oxide layer 330. Thus, in the embodiment shown in FIG. 3, the side walls 230 of the anchoring recess structure 220 formed by the intermediate oxide 330 have an overhanging profile, as is also illustrated by the phantom lines 350 in FIG. 3. In addition, the topology shown in FIG. 3 results in a slightly sagging surface of the metal structure 210, which additionally supports the anchoring effect of the embodiment of the anchoring structure 200.

In the embodiment of an anchoring structure 200, shown in FIG. 3, the metal line 210 is formed, with a significant volume fraction, below the silicon surface (Si surface) marked by an arrow 360 and marking the beginning of the epitaxial zone 260. In other words, as a possible implementation of a shape of a cross-section to be anchored, in the embodiment shown in FIG. 3 a significant portion of the metal volume of the conductor line 210 is lowered into the trench structure, or the anchoring trench 310, and there causes the anchoring intended. The metal line 210 thus cannot be lifted off (lifted metal lines), and due to the resulting sagging shapes of the metal structure 210 at its upper edge in the area above the trench 310, the laterally acting shifting forces have only a partially shifting effect. Partly, they even cause the metal line 210 to be pressed even deeper into the trench 310. What is characteristic for the formation of the anchor shape of the metal structure 210 is the fact that the intermediate oxide 330 forms at the anchoring trench side wall, so that the overhanging side walls 230 of the anchoring recess structure result.

Unlike metal lines or metal structures located above the silicon surface or above the insulating layer 270, which is also referred to as a first oxide, as a result of which they have a large lateral area of attack for the loads, or stresses, resulting from the TC stress, so that in this case there is a very high risk of shifted or lifted-off metal structures (shifted/lifted metal lines), this risk may be significantly decreased by using an embodiment of an anchoring structure 200. Thus, embodiments of a respective anchoring structure 200 have a significantly higher resistance to TC loads than such metal lines which are essentially located above the silicon surface.

Before a further embodiment of an anchoring structure 200 is explained in connection with FIG. 4, it is worth noting that the surface or silicon surface marked by arrow 360 is frequently also referred to as an interface between silicon and the first oxide 270. In addition, the insulating layer 270 is also referred to as first oxide and/or gate oxide as a function of the area of the device which is under consideration. The lower electrode 280 in the first trench 250 and in the further trenches not shown in FIG. 3 is also referred to as polysilicon or poly-S in the trench, or as a source field plate. That polysilicon 290 in the trench 250 which is located closer to the surface of the device forms the gate electrode, as was explained above.

An anchoring structure 200 in accordance with an embodiment of the present invention for a metal structure 210 of a semiconductor device comprises an anchoring recess structure 220 comprising at least one overhanging side wall 230, the metal structure 210 being at least partly arranged within the anchoring recess structure 220. In such an anchoring structure 200, the metal structure 210 may be at least partly arranged within the anchoring structure 220 in such a manner that a substantial volume fraction of the metal structure 210 is lowered into the anchoring recess structure 220, and that the metal structure 210 fills the anchoring recess structure 220 up to a substrate surface.

In further anchoring structures 200, the anchoring recess structure 220 may be arranged, as part of an insulating layer 330, on a support layer structure 320, and the metal structure 210 may extend at least partly in an area on the support layer structure 320 below the overhanging side wall of the anchoring recess structure 220. With such an anchoring structure 200, a volume fraction of at least 20% of the metal structure 210 may be arranged within the anchoring recess structure 220.

In embodiments of anchoring structures 200, the metal structure 210 may comprise a main surface which at least partly lies exposed. The anchoring recess structure 220 may here be an anchoring trench structure. With an anchoring recess structure 220, the anchoring trench structure may comprise a trench with regard to a main surface of a support layer structure 260, which has the trench arranged therein, the trench being covered, at least in part of that side wall which faces the main surface 360, by an oxide layer 330 such that a thickness of the oxide layer 330 decreases as the depth within the trench increases, so that the oxide layer 330 arranged on the side wall of the trench forms the overhanging side wall 230 of the anchoring trench structure 220. With one anchoring structure 200, an electrically conductive contact structure layer 320 may additionally be arranged, within the trench, between the oxide layer 330 and the trench, the oxide layer 330 comprising, on a side facing a bottom area of the trench, a recess 340, so that the metal structure 210 is in direct contact with the contact structure 320. The device may comprise a further trench 250 in the support layer structure 260, said trench having a width, a maximum width of the anchoring trench structure 220 comprising at least three times the width of the further trench 250.

Figure 4:
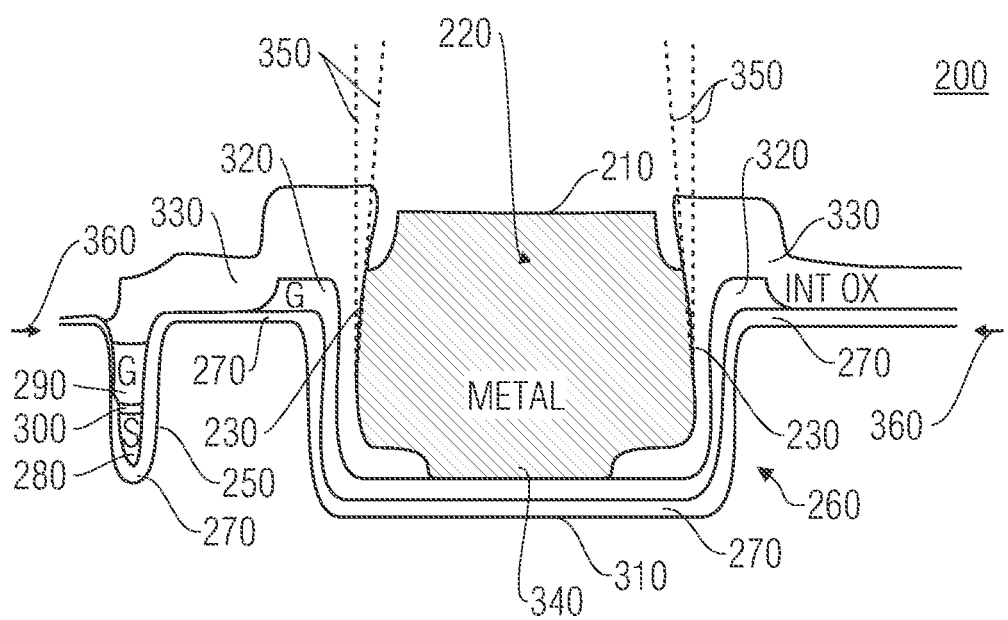
FIG. 4 depicts a cross-section through a further embodiment of an anchoring structure.

FIG. 4 shows a further embodiment of an anchoring structure 200 which differs only slightly from the overall structure shown in FIG. 3 both in terms of the actual anchoring structure as well as with regard to the transistor structure. For this reason, as far as the description of the individual structures, components and objects is concerned, reference shall be made to the description with regard to FIG. 3. More specifically, the embodiment of an anchoring structure 200 shown in FIG. 4 differs from the embodiment shown in FIG. 3 essentially only in terms of the width of the anchoring trench 310 and the layer thickness of the metal structure 210. For example, the metal structure 210 or the metal line 210 of the gate runner structure only slightly projects beyond the silicon surface of the device which is marked by arrows 360. Consequently, the embodiment of an anchoring structure 200 shown in FIG. 4 results in that the metal line 210 is located such that its largest volume fraction is below the silicon surface. Since in this embodiment, the metal line 210 was placed almost entirely below the silicon surface, the metal structure 210 differs from the metal structure 210 shown in FIG. 3 also in that the former does not comprise the distinct anchor shape with the sagging surface, as is shown by FIG. 3 in the case of the metal structure 210.

Along with the overhanging side walls 230, which are formed by the intermediate oxide 230 also in this embodiment of an anchoring structure 200, the forces occurring in the context of a TC load or any other operation-dependent or test-dependent load can no longer laterally act upon the metal line 210. In addition, also because of the metal line 210, which is placed lower down as compared to the embodiment shown in FIG. 3, in combination with the laterally overhanging side walls 230, forces which tend to be able to lift off the metal line 210 can no longer move same from its fundamental position. Thus, the cross-sectional shape, depicted in the cross-sectional sketch of FIG. 4, represents the shape of the overhanging side wall of the anchoring recess structure 220, which leads to the anchor-shaped cross-section of the metal structure 210, and the arrangement of the metal structure 210, which is almost completely under the surface or silicon surface, which is indicated by arrows 360, as a combination.

As was already explained above in the context of a potential process integration for manufacturing embodiments of a corresponding anchoring structure, for example in the embodiments of an anchoring structure 200 which are shown in FIGS. 3 and 4, the anchoring trench 310 may be created in the same process step as the actual trenches of the cell field, which include, among others, the first trench 250. In this case, the target depth of the anchoring trench 310 roughly corresponds to that of the further trenches (among others, trench 250). As was mentioned above, and as is clearly illustrated by the two embodiments shown in FIGS. 3 and 4, however, there is the possibility of designing the anchoring trenches 310 with different widths both with regard to the actual cell trenches and with regard to the different implementations of the anchoring trenches 310. The embodiment shown in FIG. 3, for example, depicts an anchoring trench 310 which is indeed significantly broader than the cell field trenches (e.g. trench 250), but is clearly narrower as compared to the anchoring trench 310 of FIG. 4.

Now that the trenches of the cell field have been prepared, along with the anchoring trench 310, in the context of process integration, their depths typically ranging between 3 and 7 μm as a function of the voltage class used, in the further process flow the cell field trenches may be filled with oxides and polysilicon electrodes which lead, for example, to the lower electrode 280 and the upper electrode 290.

The question of whether, as a deviation from the embodiments of an anchoring structure which are depicted in FIGS. 3 and 4, the anchoring trenches 310 are also to be filled with all field plates 280, 290, or whether only the respective relevant polysilicon is introduced in the form of the feed structure 320 may be solved individually in a cost-neutral manner via the layout of the poly-structures concerned. For the embodiments contemplated in FIGS. 3 and 4, which are a gate runner structure, as was explained above, it may be advisable to implement a relatively thick first oxide in the area of the anchoring trench 310 so as to make the gate/drain voltage, which drops via the insulating layer 270, or the first oxide 270, drop over a larger distance so as to eventually achieve an improved gate/drain dielectric strength. As with the plurality of the vertical transistors, the drain potential is applied to the back of the device, which may differ significantly from the gate voltage and the source voltage in the case of a high-voltage device. Depending on the voltage class selected, voltages in the range of 10 V and below may be present between the gate voltage and the source voltage, while voltages of several 10 V-100 V may be present between the drain terminal on the back of the device and the terminals for the gate potential and the source potential.

In addition, it may also be advisable, in the case of the gate runner structure contemplated in FIGS. 3 and 4, to not only use a relatively thick first oxide in the anchoring trench 310, but further to also implement the gate polysilicon or the poly gate 320 in the anchoring trench 310 so as to ensure the gate/drain dielectric strength, on the one hand, and to create contacting between the gate polysilicon 290 in the trenches of the cell field (cell field trenches) and the metallic gate runner 210, on the other hand.

In the embodiments shown in FIGS. 3 and 4, within the context of the process step of the intermediate oxide formation, which thus results in the intermediate oxide 330, the characteristic anchoring structure or anchoring recess structure 220 with its at least one overhanging side wall 230 is then created. In the context of the manufacturing step, the intermediate oxide 330 is created with a slight to medium overhang of the side walls 230 at the anchoring trench side wall. This may be achieved, e.g., in the context of TEOS deposition (tetraethyl orthosilicates for depositing silicon dioxide SiO2). Alternatively or additionally, this may also be effected in the context of a process step of re-flowing BPSG (borophosphosilicate glass), while heating above a specific threshold temperature which depends on the material (typically ranging between 700° C. to 1200° C.). Basically, it is also possible to employ the corresponding intermediate oxide formation in the context of using a stack of both materials in the context of a combination.

Alternatively or additionally, the overhang may also be achieved by a tilted damage implantation into the intermediate oxide 330, which results in that an etching rate of a subsequent etching step may be increased or reduced, depending on the etchant used, for example hydrofluoric acid (HF; HF etches), and possibly further process-relevant parameters. Alternatively or additionally, such an overhang may also be effected by a (damage) implantation into a side wall of an etched silicon structure, and a subsequent (thermal) oxidation step. Depending on the specific configuration of the process, for example an oxidation rate of the thermal oxidation may be changed, by a corresponding (damage) implantation, as a function of the (damage) implantation dose, which in turn may result in corresponding overhanging side walls, or flanks.

Subsequently, by means of a standard contact-hole production, the intermediate oxide 330 may be opened as a contact hole 340 in a sub-range of the anchoring trench bond, so as to contact the gate polysilicon 320. An ensuing metallization or ensuing metallizations are then able to fully seal the anchoring trench 310, so that a metal anchor which in the area of the trench bottom is wider than in the upper trench area is created as the metal structure 210. In the context of sealing, formation of potential pockets, i.e. cavities or bubbles, may basically occur via subsequent metallization steps, said cavities, however, frequently playing no significant part in the event of a complete sealing at the top of the metallization, which is why they may be neglected.

Naturally, this method may serve not only to contact a feed structure 320 for a gate electrode 290 via the gate poly 320, but may basically also be used for contacting other feed structures, such as a source poly, of course.

Depending on the specific implementation of the overall process, the subsequent metal structuring may be designed such that the situation depicted in FIG. 3 arises, wherein the metal flanks of the metal structure 210 are located above and outside the anchoring trench 310. As is shown by the embodiment of an anchoring structure 200 shown in FIG. 4, the metallization or structuring of the metallization may alternatively be implemented such that the metal flanks are located in the area of the anchoring trench side wall within the anchoring trench 310. Thus, in the case depicted in FIG. 4 the situation arises where the metal line 210 is fully "lowered" into the anchoring trench and is thus no longer exposed to the lateral TC stress.

Thus, embodiments of the present invention enable significant improvements in the field of TC performance of metal zones by introducing so-called anchoring structures which may be realized in a largely cost-neutral manner. Basically, embodiments of anchoring structures for metal zones may be evenly applied for all devices. Naturally, this may be realized in a particularly cost-neutral manner if corresponding trenches or trench structures or other recesses are already integrated in the context of the process for manufacturing these devices. Thus, embodiments of corresponding anchoring structures may be implemented in a highly advantageous manner particularly in the case of trench transistors.

Generally, the layout of the anchoring trench 310 or—depending on the specific implementation—the shape of the anchoring recess structure 220, i.e. of the wide trench which at least partly receives the metal line 210, may take on any form. For example, it may be formed only partly below the metal line 210, or it may be present fully along the entire metal line. In addition, it may also comprise intermeshing structures at the rim so as to be additionally resistant to longitudinal forces, as will be explained in more detail in the further course of the present application.

The width of the anchoring recess structure 220 or of the anchoring trenches 310 (trench structures), wherein the metal lines 210 may be anchored or into which the metal lines 210 may be lowered, may be selected as desired and may be adapted in an optimum manner to the respective technology or to the respective subsequent process flow. As a rule, no (significant) additional cost arises in this context, since the structure may be implemented by the process technology which is already present for the devices concerned anyhow. In the case of trench transistors, for example, the corresponding structure may be manufactured using the trench photo technique and trench etching technique which already exist anyhow. The anchoring of the metal structure 210 in this case results from the remaining process flow of the respective technology.

In addition, the respective metal structures 210 may not only be formed below metal lines, such as below a gate runner structure, but it is basically also possible to anchor any type of a metallization, i.e., for example, metal pads for bonding (bond pads) or for other purposes, using embodiments of inventive anchoring structures 200. It is thus basically possible to provide a corresponding anchoring recess structure 220 as a corresponding metal structure 210 underneath each metallization, such as metal pads or bond pads, so that the metal structure 210 has a significantly improved resistance to, for example, TC-induced loads.

Embodiments of respective anchoring structures thus include respective anchoring structures, wherein, for example, more than 20% of the metal volume of the metal structure 210 to be anchored is lowered down underneath the silicon surface or underneath the first oxide 270. Thus, in addition, the intermediate oxide 320 in the anchoring trench 310 may form an overhang, for example. Depending on the specific implementation, the anchoring trench 310 or the anchoring recess structure 220 may be three times as wide as a respective cell field trench, which is shown, for example, as the first trench 250 in FIGS. 3 and 4. As was previously explained, in many manufacturing processes the anchoring trench 310 may be advantageously manufactured in the same process step as the corresponding cell field trenches.

Cross-sections as are schematically represented in FIGS. 3 and 4 may thus be obtained, for example, after opening the housing, and possibly after a corresponding lift-off of the metal by means of a microscopic image, or possibly by means of an SEM cut (SEM=scanning electron microscope).

As is partly shown in FIGS. 2 to 4, the metal layer 210 may both extend over the main surface marked by the arrows 360 and may remain below same. Depending on the specific implementation, the recess 220 may be fully or only partly filled in terms of its width at least in that part of the metal layer 210 which is arranged below the surface marked by the arrows 360. By the term "lateral" is meant relating to a direction which is perpendicular to a direction of extension of the recess 220 and parallel to the above-mentioned surface. The metal layer 210 may or may not fill the recess 220 over the entire height or depth thereof. Rather, it is sufficient for a specific proportion of the height of the respective recess 220 to be filled by the metal layer 210, i.e. approximately more than 20%, more than 30%, more than 50%, or more than 75%.

Depending on the specific implementation, the respective metal layer 210 may also fill a cross-sectional area of the recess 220 up to a specific minimum extent. For example, the metal layer 220 may fill the cross-sectional area of the recess 220, which is perpendicularly to the direction of extension of the recess 220, at 20% or more, 30% or more, 50% or more, or 75% or more. However, there is also the possibility for the respective metal layers to line the respective trench or the respective recess entirely or to any of the extents mentioned.

As was also shown by FIGS. 3 and 4, recesses 220 may be implemented, for example, on the basis of a trench 310 or an anchoring trench 310. In addition to the recess 220 or the associated anchoring trench 310, the respective devices frequently include further trench structures. An example of this is the first trench 250 shown in FIGS. 3 and 4. In embodiments of the present invention, the recesses 220 frequently comprise a width perpendicular to a direction of extension of the respective recess 220, which at least has double, triple, five times or a higher multiple of the width of another trench structure. This other trench structure may be a cell field trench, such as the first trench 250, for example.

It shall be noted at this point that the statements made above may not only be applied to the above-described recess 220 and the metal structure 210 lowered into same, but also to a multitude of further embodiments of the present invention, as will be discussed in the further course of the description. In addition, it is also useful to note at this point that an anchoring recess, anchoring recess structure or any other recess frequently is based on a trench structure or a recess structure within a substrate, substrate material, layer or other device structure. However, they may differ from the underlying trench structures in that the recess possibly takes into account a geometry influenced by additional layers (e.g. insulating layers, semiconducting layers, metal structures and contact holes). Unlike the underlying trench, thus a recess in many cases is to be considered, within the context of the present invention, as that free space within which the respective layer is to be arranged. While, therefore, the term "trench" in many cases designates a structure within a film or substrate which has been prepared by an etching process or any other structurizing measure, the term "recess" in the context of the present description in many cases designates an area defined by edges and structures.

Figure 5A:
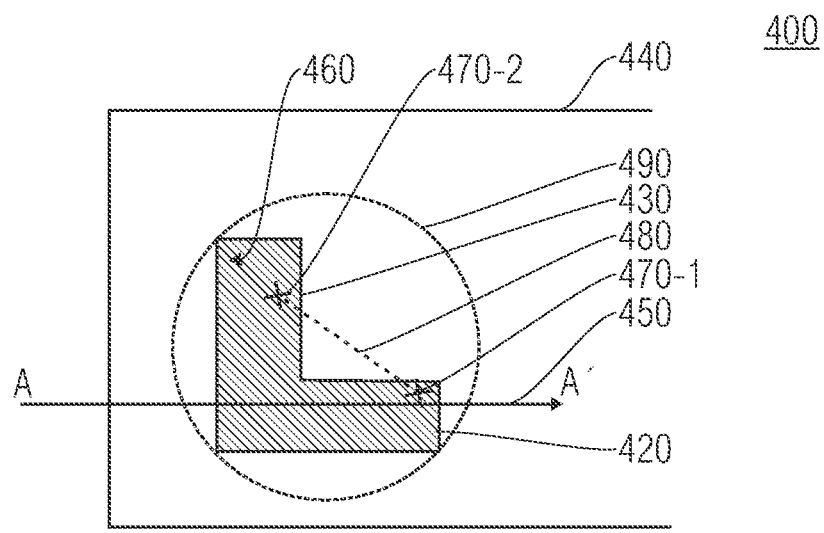
FIGS. 5A and 5B show a top view and a cross-section of an embodiment of an intermeshing structure.
Figure 5B:
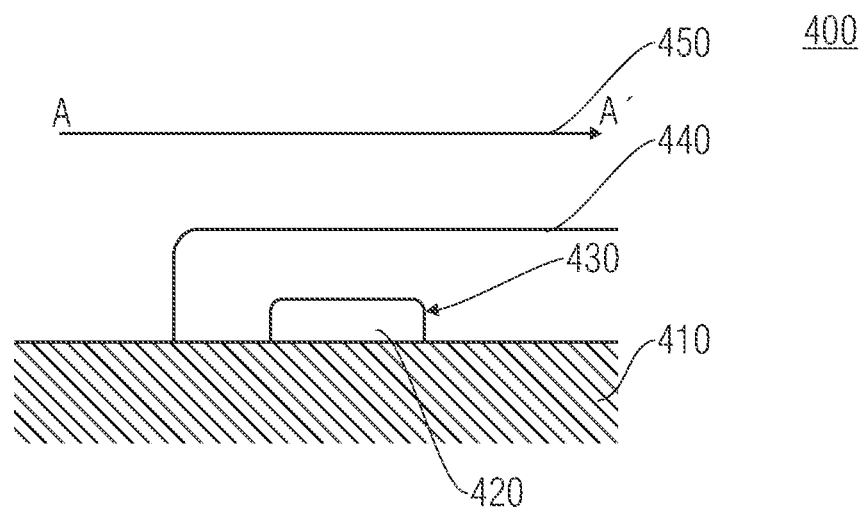

FIG. 5 shows an embodiment of an intermeshing structure for a device on a substrate. Here, FIG. 5A depicts a top view of a respective embodiment of an intermeshing structure 400, whereas FIG. 5B represents a schematic cross-section through the embodiment shown in FIG. 5A. A substrate 410, which is represented in the cross-section in FIG. 5B, has a structured device layer 420 applied to it which may be, e.g., an insulator layer, a semiconductor layer or any other layer. In the embodiment depicted in FIGS. 5A and 5B, the structured device layer 420 is an L-shaped layer projecting beyond a main surface of the substrate 410 and thus forming a topology edge 430 for a layer which at least partly covers the structured device layer 420. In the embodiment shown in FIGS. 5A and 5B, the structured device layer 420 specifically is covered by a metal structure 440, so that the metal structure 440 on the structured device layer 430 extends at least across part of the topology edge 430 of the structured device layer 420.

As was already explained in the context of FIG. 1, FIG. 5B shows a cross-section through the device along a direction shown by an arrow 450 in FIGS. 5A and 5B. Thus, FIG. 5B shows a section along the direction A-A' schematically represented in FIG. 5A.

Because of the structure of the embodiment shown in FIGS. 5A and B, the topology edge 430 of the structured device layer 420 represents, with regard to the metal structure 440, also referred to as metal layer 440, a topology edge as defined by the explanations in connection with FIG. 1. If this topology edge 430, over which the metal structure 440 extends, is projected into a plane which may be located, for example, parallel to the main surface of the substrate, the topology edge 430 in this plane will form at least one contiguous line which, due to the nature of the representation in FIG. 5A, corresponds to the line 430. In this context it is useful to point out that, in the context of the present application, a line is not limited to a straight line. The line may rather comprise corners, edges, curvatures or other shapes deviating from a straight line.

FIG. 5A thus depicts precisely a corresponding projection into a plane parallel to the main surface of the substrate, which as the contiguous line 430 shows the topology edge 430 of the structured device layer 420. The line 430 is so contiguous that it delimits a zone 460 which is not convex, or—put positively—non-convex, or concave. In this context, a convex zone or area shall be understood to mean, as also in mathematics, such a quantity of points that for any two points of the area or the zone it is true that any point of the direct straight connecting line between these two points may belong to the zone or the area. In other words, if the zone 460 represents a non-convex zone or area, since due to the L-shaped structure, for example with regard to the two points 470-1, 470-2 marked by an "X" in FIG. 5A, the defined straight connecting line 480 extends outside the zone 460 in the area of the "bend" of the L-shaped structure. Areas, zones and quantities which are not convex shall consequently be referred to as non-convex zones, areas and quantities. Another designation for non-convex zones, quantities and areas is that of concave zones, quantities and areas.

In addition, the zone 460 or, in the embodiment shown in FIG. 5A, the entire structured device layer 420 may be fully included in a smallest circle 490 having a diameter of less than or equal to 50 μm, 20 μm or 10 μm. Thus, the structured device layer 420 has a maximum diameter of 50 μm, 20 μm or 10 μm.

In the embodiment of an intermeshing structure shown in FIGS. 5A and 5B, the zone 460 delimited by the contiguous line 430 comprises a typical structural width in the range of about 200 nm (0.2 μm) to about 2000 nm (2 μm). The term structural width generally relates to a direction in the plane of the substrate 410 which extends perpendicularly to the direction into which the structure in the respective point extends. In a mathematical sense, the structural width, for example, designates the width of the structure in one point of the rim of the structure, with regard to a direction perpendicular to the rim. Frequently, structural widths are particularly readily determinable using cross-sections such as the one shown in FIG. 5B.

The embodiment shown in FIGS. 5A and 5B of an intermeshing structure 400 for a device on a substrate now enables the very metal structure 440 to intermesh the topology edge 430 of the structured device layer such that forces laterally acting on the metal structure, as occur, for example, in the context of the TC stress, cannot or cannot easily laterally move same on the main surface of the substrate. In other words, the topology edge or edges 430 of the structured device layer 420 of the metal structure 440, or of the metal line 440, of the metal zones 440 offer(s) the possibility of transferring forces which laterally act upon the corresponding metal structure 440 to the substrate 410 via the structured device layer 420 and its topology edge 430. Thus, an embodiment of an intermeshing structure as is depicted, for example, in FIGS. 5A and 5B enables an improvement in the resistance of a metal structure 440 in the context of major temperature differences as are applied to the corresponding metal lines, for example in the area of a TC test.

As will be illustrated in more detail by the following explanations of further embodiments, this may be achieved by simple layout measures, for example introducing a device layer 420 which is structured accordingly. However, an independent structured device layer 420 may or may not be introduced in a controlled manner, but an already existing device layer may rather be developed further or processed further to become the structured device layer 420 by means of appropriate design measures.

While in the embodiment of an inventive intermeshing structure shown in FIGS. 5A and 5B the topology edges 430 were created by a structured device layer 420 projecting beyond the main surface of the substrate 410, embodiments of an intermeshing structure 400, wherein the topology-forming edges 430 are formed by recesses in the device layer, so that this device layer represents the structured device layer 420, will be described and explained in connection with FIGS. 6 and 7A and 7B.

Figure 6:
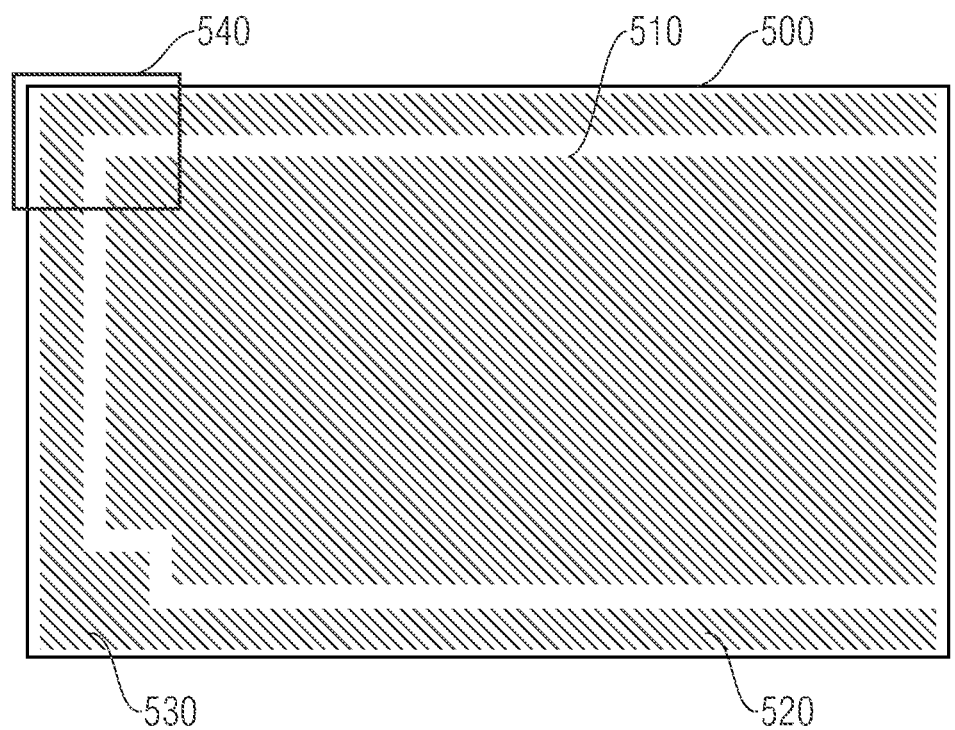
FIG. 6 illustrates a top view of a chip.

FIG. 6 schematically shows a layout view of a current chip 500, or of a corresponding chip layout. More specifically, the chip 500 is a chip which in a cell field not drawn in FIG. 6 includes a multitude of vertical high-power transistor structures which, on account of the design of the chip 500, are connected in parallel and thus act as a vertical high-power transistor. More specifically, FIG. 6 shows a top view of the corresponding chip 500, so that an electrode located on the back of the chip 500, or a terminal located on the back of the chip 500, is not shown in FIG. 6. This terminal is commonly the drain terminal of the vertical high-power transistor effectively formed.

In particular, FIG. 6 shows two metal zones 510, 520, which are a source metallization field 510 and a gate metallization field 520. The two metallization fields 510 and 520 thus represent the corresponding terminals for the vertical high-power transistor structures of the chip 500. The two metallization zones 510, 520 are spatially separated by distances between the respective metals.

While the source metallization zone 510 may be used as a bond pad or, contacting pad, because of its size and the underlying topology alone, the gate metallization zone 520 additionally comprises, as a bond pad or contacting pad, a so-called gate pad 530, via which the gate electrodes of the vertical high-power transistor structures may be contacted using corresponding bond wires. The gate metallization zone 520 is also referred to as a gate runner structure, or gate runner, because of its U-shaped configuration. Typically, such a gate runner 520 has a structural width ranging from 10 μm to about 500 μm, it being possible, for example, to reach the upper value in the area of the gate pad 530.

In the area of the gate runner, the feed structures made of polysilicon, which are located below the surface of the chip 500, are contacted with the gate pad 530 in an electrically conductive manner through corresponding contact holes in the context of a corresponding contact-hole layout. Thus, the gate runner 520 represents, via a corresponding contact-hole layout, the gate contact to an external circuit to which the chip 500 is to be connected.

In addition, FIG. 6 shows a mark 540 in an area of the chip corner where there are typically the highest loads during a TC test. The following illustrations 7A and 7B represent corresponding zoom-ins of the area identified by the mark 540 in order to elucidate details.

Figure 7A:
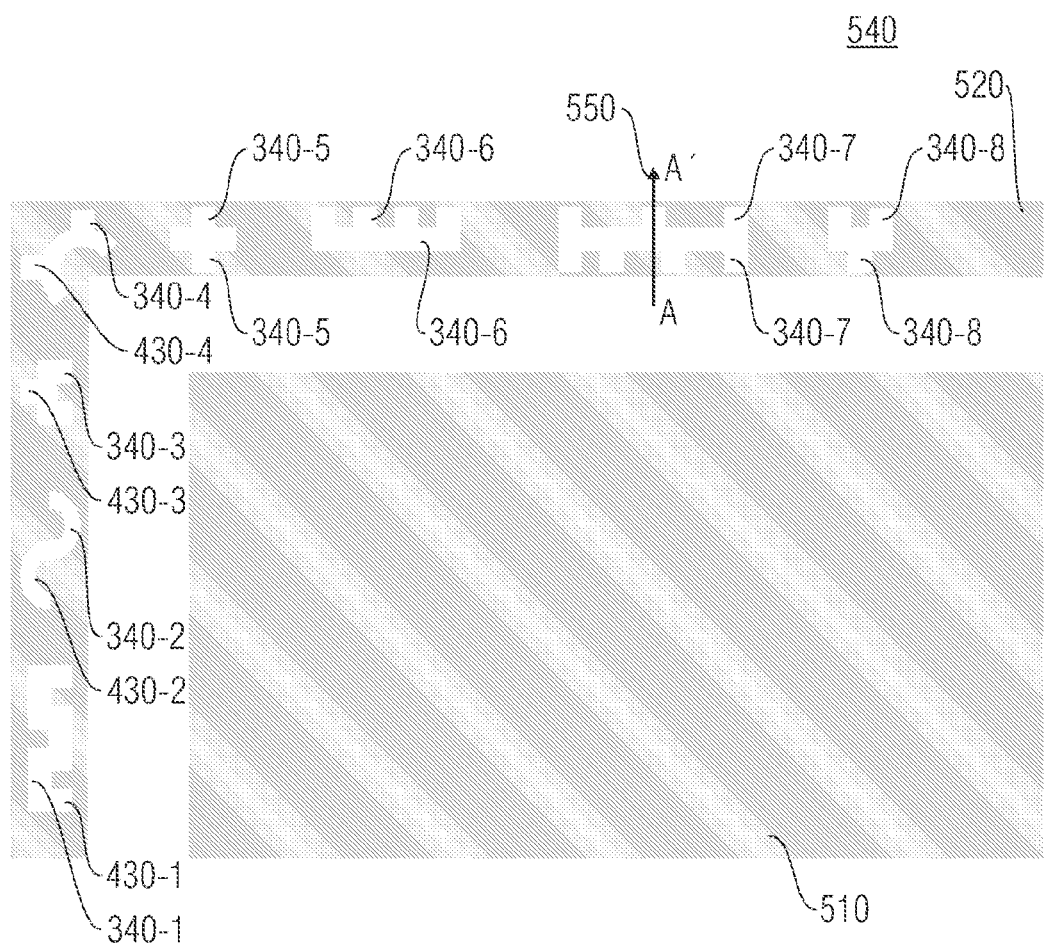
FIGS. 7A and 7B show a top view and a cross-section through an embodiment of an intermeshing structure using the example of contact holes.

FIG. 7A shows a top view of the chip 500 in the area of the mark 540, wherein, as was previously explained, typically the highest loads occur in the context of a TC test. Accordingly, FIG. 7A shows a detail of the source metallization zone 510 and a detail of the gate metallization zone 520 (gate runner). Again, both metal zones are separated from each other by a spatial distance between the metals so as to prevent an electrical short-circuit between the structures concerned.

Moreover, FIG. 7A shows various inventive embodiments of structured device layers 420, or the topology edges 430 resulting therefrom, for various embodiments of intermeshing structures 400. More specifically, FIG. 7A shows eight different topology edges 430-1, . . . , 430-8 of different embodiments of intermeshing structures, which here are realized in the contact-hole plane of the vertical transistor structure in the area of the gate runner 520. With regard to the embodiments of intermeshing structures represented, it is important to recognize that the intermeshing structures may resist shifts, in any directions, of overlying metal structures which, in the present embodiment, are fundamentally parts of the gate metallization zone 520.

Figure 7B:
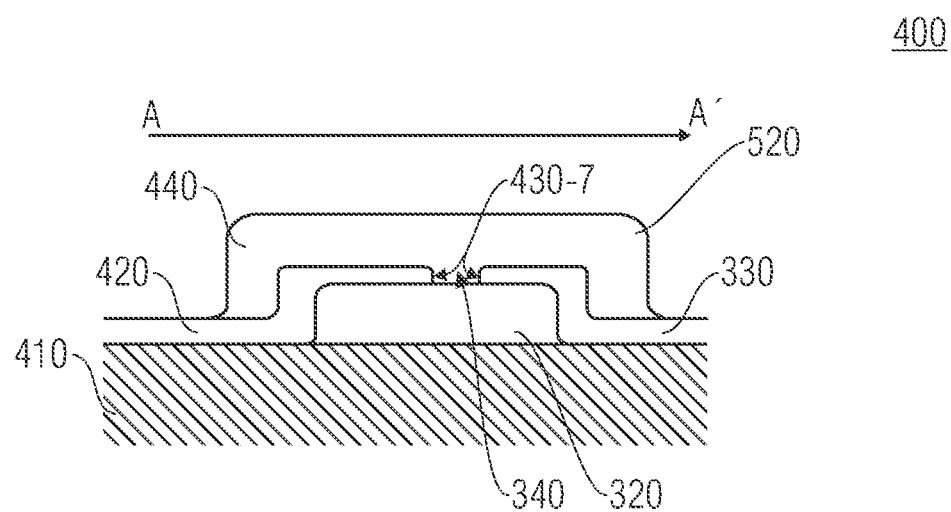

Before discussing the section shown in FIG. 7A along the direction 550 (section A-A') in connection with FIG. 7B, it shall be noted that, basically, any shapes are possible for being used as corresponding topology edges 430. These include, among others, the angular or polygonal structures 430-1, 430-3, 430-6, 430-7 and 430-8. Likewise, cross-shaped topology edges may be employed, as is shown by the topology edge 430-5, which is also polygonal. In addition, round, meander-shaped, helical or wavy shapes are also possible, as is illustrated, for example, by the topology edge 430-2. Of course, hybrid forms of the above-mentioned shapes may also be realized, as is shown, for example, by the topology edge 430-4, which is a "superposition" of two polygonal structures with a semicircular structure.

As was previously explained, what is dealt with here is thus embodiments of intermeshing structures 400 which are realized in the context of the contact-hole layout for gate contacts on the gate runner 520. To illustrate and explain this further, FIG. 7B schematically shows a section through the chip 500 which runs along the direction A-A' and is marked by the direction 550 in FIG. 7A. In the representation in FIG. 7B, the structural variety below the surface of the substrate 410 and possibly of a first-oxide layer (cf., e.g., insulating layer 270 of FIGS. 3 and 4) is not rendered in order to simplify the representation. Of course, corresponding structures which may be used for the functioning of the device may exist in a real implementation. Thus, FIG. 7B merely represents a simplified representation of a cross-section along the direction A-A' for a real implementation of a chip 500.

The precise architecture of the cross-section shown in FIG. 7B through the chip 500 is not unlike the cross-sections shown in FIGS. 3 and 4, since the devices involved in all of these cases are very much related. Apart from the further layers and structures in the area of the substrate 410, which have already been previously discussed and are not shown in order to simplify the representation of FIG. 7B, the chip 500 again comprises a feed structure 320 which may be made, for example, of polysilicon and may be used for contacting the actual gate electrodes of the vertical transistor structures in the cell field of the chip 500. The feed structure 320 again has an intermediate oxide 330 deposited thereon, into which the contact holes 340, which are also shown in FIG. 7A, are inserted. Thus, the intermediate oxide 330, which may comprise, for example, typical layer thicknesses of between 100 nm and 1000 nm, represents the topology edges 430-7, which have already been shown in FIG. 7A, and thus acts, in the embodiment shown in FIGS. 7A and 7B, as a structured device layer 420. The intermediate oxide 330 then has the gate metallization zone 520 or the gate runner 520, which represents the metal structure 440, deposited thereon.

Thus, in the embodiment depicted in FIGS. 7A and 7B, the contact holes 340-1 to 340-8, which are also shown in FIG. 7A, form, via their side walls, the topology edges 430 for the overlying metal structure 440, or for the gate runner 520. By means of the topology edges 430 (or the topology edge 430-7 in FIG. 7B), the structured device layer 420 thus enables the overlying metal structure 440 to divert any laterally occurring forces, which are suited to shift the metal structure 440 on the surface of the substrate 410, into the substrate 410 via the structured device layer 420. Thus, in particular the topology edges 430 of the structured device layer 420 enable the overlying metal structure 440 to achieve good intermeshing with regard to lateral forces, so that the lateral forces which significantly endanger the reliability of the chip 500 may be reduced without causing a shift of the metal structure 440 or of the gate runner 420 in the embodiment shown in FIG. 7B.

Using an embodiment of an inventive intermeshing structure 400 enables, in particular, a significant improvement in the reliability in the context of the TC behavior of metal lines and/or metal zones, which may be achieved by very simple layout measures in an entirely cost-neutral manner. The reason for this is that, basically, structures which may be used for the functioning of the finished device may be replaced by a defined geometry which enables this intermeshing of the metal structures 440 at the substrate 410 via the structured device layer 420.

Two types of intermeshing or embodiments of intermeshing structures will be represented and explained here, which are represented and explained, on the one hand, in FIGS. 5-7, and on the other hand, in connection with FIGS. 8-11. The first type basically consists in providing a structured device layer 420 which enables a metal structure 440 arranged above it to resist any tendencies of a metal shift in any direction in the plane of the substrate. The embodiments of the first type which are depicted in FIGS. 6 and 7 show a possibility of creating structures, using the contact-hole plane (intermediate oxide 330), which resist any potential metal shift in any direction parallel to the surface of the substrate 410. The formation of an intermeshing in the contact-hole plane is basically "directed inward" in the embodiments shown in FIGS. 6 and 7. This means that the interior of the gate runner 520 or of the metal conductor line, metal surface or of the metal zone or of the metal structure is intermeshed.

An intermeshing structure 400 in accordance with an embodiment of the present invention for a device on a substrate 410 thus comprises a structured device layer 420 on the substrate 410 comprising at least one topology edge 430 and a metal structure 440 on the structured device layer 420, which extends at least over part of the topology edge 430 of the structured device layer 420, topology edges 430, over which the metal structure 440 extends, forming at least one contiguous line 430 in a projection into a plane. Here, the line 430 delimits at least an area 460 in the plane of projection, the area 460 being non-convex, and a diameter of a smallest circle 490, which fully comprises the area 460, being smaller than or equal to 50 μm.

With intermeshing structures 400, an electrically conductive contact structure 320 may be arranged between the structured device layer 420 and the substrate 410, the structured device layer comprising an insulating layer 330, and the structured device layer 420 comprising at least one contact hole 340 within the insulating layer 330, so that the metal structure 440 is in direct contact with the contact structure 320, and so that the recess 340 in the device layer 420 forms the topology edge 430. With such an intermeshing structure 400, the area 460 or a sub-area of said area, may be round, bent, cross-shaped, polygonal, meander-shaped or wavy. Similarly, with an intermeshing structure 400, the metal structure 440 may comprise a main surface which at least partly lies exposed.

With an intermeshing structure 400, the line 430 delimiting the area 460 may comprise a first straight portion and a second straight portion, a direction of the first straight portion and a direction of the second straight portion forming an angle of between 70° and 110° with each other. Likewise, with intermeshing structures 400 in accordance with an embodiment of the present invention, the area 460 may comprise a typically structural width of between 200 nm and 2000 nm. With such an intermeshing structure 400, the device may comprise a further stack of layers 320', 680 between the substrate 410 and the structured device layer 420, the further stack of layers including a topology-forming edge 430, so that the metal structure 440 at least partly extends over a topology edge 430 which is based on the topology-forming edge of the further stack of layers.

With an intermeshing structure 400, the further stack of layers may thus include a further contact structure 320' and an insulating layer structure 680 on the further contact structure 320', the contact structure 320 being at least partly arranged on the further stack of layers. The structured device layer 420 may include an insulating layer 330, the structured device layer 420 being arranged on the contact structure 320.

Figure 8A:
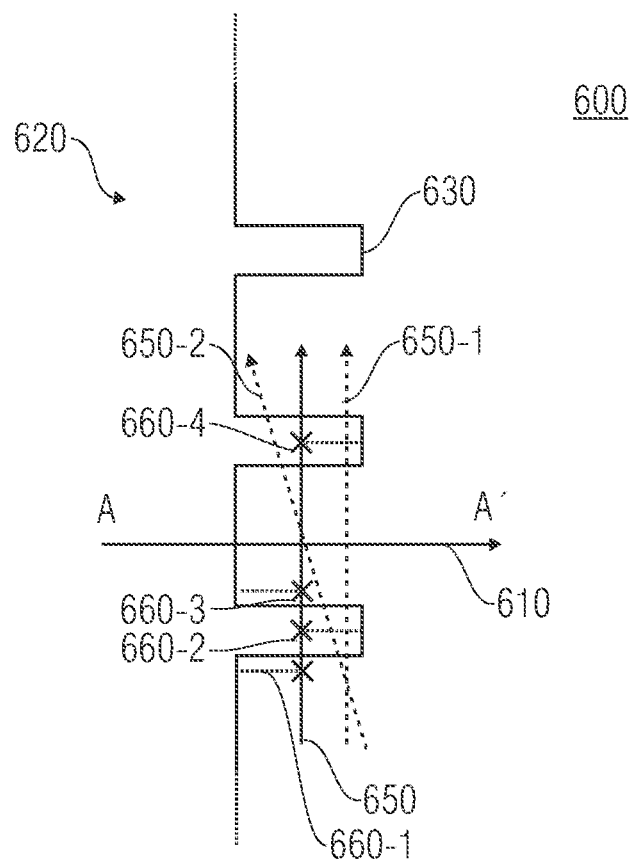
FIGS. 8A and 8B show a top view of and a cross-section through an embodiment of an intermeshing structure.
Figure 8B:
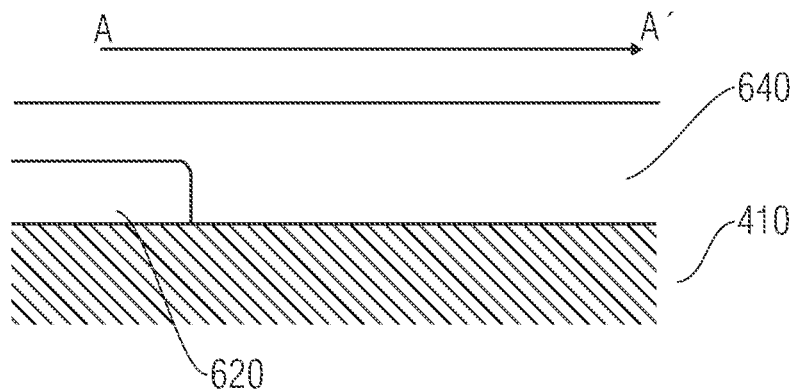

FIGS. 8A and 8B show an embodiment of an intermeshing structure 600 for a device on a substrate 410. FIG. 8A shows a top view of a corresponding device, while FIG. 8B shows a schematic cross-section A-A' along a direction 610, which is also drawn in FIG. 8A.

FIG. 8A again shows a structured device layer 420 arranged on the substrate 410 and comprising at least one topology edge 630. In the embodiment depicted in FIG. 8A, the topology edge 630 is implemented in a saw tooth-shaped manner. A metal structure 640 is applied on the structured device layer 620, which extends at least over part of the topology edge 630. In the embodiments of an intermeshing structure 600 shown in FIGS. 8A and 8B, the metal structure 640 extends over the entire area shown in FIG. 8A, which is why same is not drawn in FIG. 8A in order to simplify the figure.

As was already explained in connection with the embodiments of an intermeshing structure 400 shown in FIGS. 5A and B, the representation depicted in FIG. 8A at the same time represents a projection of the topology edge 630 into a plane running parallel to the main surface of the substrate 410. As is indicated by the points in FIG. 8A, which indicate a continuation, the topology edge 630 clearly projects beyond the portion represented in FIG. 8A. In the plane, or projection plane, of FIG. 8A, the topology edge 630 forms a contiguous line, reference again being made, in this context, to the above explanations with regard to the difference between a straight line and a line.

As is illustrated by FIG. 8A by way of example of a straight line 650, it is now possible to define a straight line, which has a length of between 19 μm and 42 μm, along the contiguous line, so that with regard to a first point 660-1 on the straight line 650 and to a third point 660-3 on the straight line 650, the line is located on a first side of the straight line 650, and with regard to a second point 660-2 and a fourth point 660-4 on the straight line (650), it is located on a side which is opposite the first side. The second point 660-2 is located between the first point 660-1 and the third point 660-3, and the third point 660-3 is located between the second point 660-2 and the fourth point 660-4. In further embodiments it may additionally be possible and/or advisable to define a straight line, as a function of the respective circumstances of a specific implementation, having a length of between 19 μm and 21 μm (length 20 μm+/−5%), a length of between 23 μm and 27 μm (length 25 μm+/−8%), a length of between 28 μm and 32 μm, a length of between 33 μm and 37 μm, a length of between 38 μm and 42 μm (length 40 μm+/−5%), or a length of between 20 μm and 40 μm (length 30 μm+/−33%) along the contiguous line, so that the respective points may be defined, as is described above.

In other words, a straight line 650 may be defined which crosses the contiguous line 630, which in the representation selected in FIG. 8A coincides with the topology edge 630, such that at a second and a third point 660-1, 660-3 the contiguous line runs on one side of the straight line 650, whereas the contiguous line 630 runs on the other side of the straight line 650 in the areas of the second and fourth points 660-2 and 660-4. The four points 660-1 to 660-4 are distributed along the straight line 650 in an ascending order. More specifically, a straight line which is perpendicular to the straight line 650 crosses the straight line 650 in the four points 660-1, 660-4 on the one side or on the other side of the straight line 650, respectively.

It shall be noted in this context that a respective straight line 650 is definable, but is not unambiguously definable, as is illustrated, for example, by the straight lines 650-1 and 650-2 which are also drawn in FIG. 8A and for which points 660-1 to 660-4 are selectable accordingly, so that the statements made above also apply to these points. The straight lines 650-1 and 650-2 differ from the straight line 650 in that, with regard to the straight line 650-1, said straight line has emerged from the straight line 650 on account of a parallel shift. By contrast, the straight line 650-2 has emerged from the straight line 650 due to a slight tilt or twist. Irrespective thereof, the remarks previously made on the subject of the course of the contiguous line 630 with regard to the four points 660 may be transferred from the straight line 650 to the other two straight lines 650-1, 650-2 drawn in FIG. 8A by way of example. It is only for clarity's sake that the points which belong to the other two straight lines 650-1, 650-2 have not been plotted in FIG. 8A.

Due to the fact that, on the one hand, the line 630 is contiguous, i.e. steady in a mathematical sense, and, on the other hand, has a course which comprises the features described with reference to the straight line 650, this inevitably results in that the topology edge 630 underlying the contiguous line 630 comprises such topology edges 630, with regard to the structured device layer 620, that the metal structure 640 running over the structured device layer 620 again may, in the plane of the substrate 410, exert forces on the structured device layer 620 with regard to two mutually perpendicular spatial directions. Thus, the metal structure 640 may in turn resist laterally acting forces by means of the structured device layer 620 which counteract a shift of the metal structure 640 in relation to the surface of the substrate 410. It is important to note in this context that, even though the topology edges 630 are able to counteract force components in relation to two mutually perpendicular spatial directions with regard to the surface of the substrate 410, they actually need not necessarily form an angle of 90° relative to each other. Rather, it is already sufficient for the topology edge 630 to comprise portions which run in the plane of the substrate 410 and essentially do not extend in parallel, or, in more mathematical terms, which do not run in a co-linear manner. On account of the above explanation with regard to the contiguous line 630 in connection with the features of the straight line 650, this case results in that corresponding forces acting upon the metal structure 640 may be dissipated to the substrate 410 via the structured device layer 620.

Figure 9:
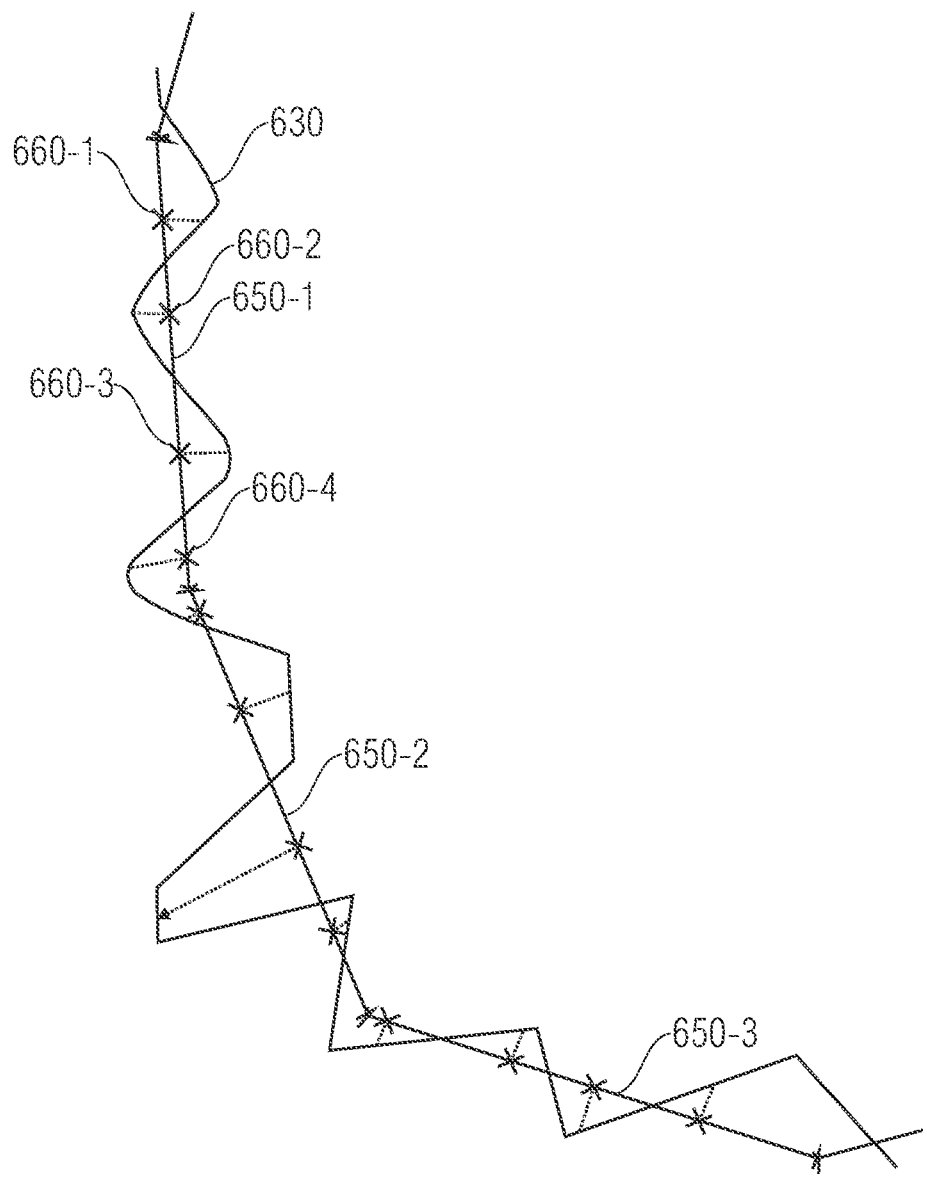
FIG. 9 shows a top view of an embodiment of an intermeshing structure.

FIG. 9 shows a representation, comparable to FIG. 8A, of a topology edge 630 on a substrate, said topology edge 630 being formed by a structured device layer 620. However, the topology edge 630 shown in FIG. 9 differs from the topology edge 630 shown in FIG. 8A in that the former has a substantially more complex course and is not given by a succession of portions which are essentially perpendicular to one another. Thus, the topology edge 630 of FIG. 9 shows both rectangular and rounded-off portions which form most varied angles relative to one another. In addition, FIG. 9 shows a clearly longer fragment of the topology edge 630 as compared to the representation selected in FIG. 8A.

As was previously explained, the topology edge 630 also corresponds to a contiguous line 630 which results on the basis of the topology edge if same is mapped onto, or projected into, a corresponding plane running parallel to the surface of the substrate, for example. The topology edge, or the contiguous line 630, represented in FIG. 9, after the projection comprises a length significantly larger than the length of 19 μm to 42 μm discussed above in connection with the straight line 650, or than the length of the straight line discussed in connection with further embodiments. For this reason it is possible to approximate the contiguous line 630 by a polygon comprising a plurality of respective straight lines 650-1, 650-2, 650-3. Each of the straight lines 650 comprises a length which ranges between 19 μm and 42 μm or is within the range of the further lengths discussed. Since the straight line 650 defines the respective polygon, an endpoint and a starting point, respectively, of two adjacent straight lines 650 coincide, as is illustrated, for example, in FIG. 9, by the endpoint, marked by the arrow, of the straight line 650-1, and by the starting point, marked by the vertical stroke, of the straight line 650-2. Naturally, in the case of a non-closed polygon, this does not apply to the first straight line 650 and the last straight line 650.

By way of example of the straight line 650-1 in FIG. 9, the four points 660-1 to 660-4 are again drawn in, with regard to which the contiguous line 630 has the course already explained above. Thus, the contiguous line 630 runs, with regard to the first point 660-1 and the third point 660-3, on the one side of the straight line 650-1, while with regard to the second point 660-2 and the fourth point 660-4, the contiguous line 630 runs on that side of the straight line 650 which is opposite the first side. Again, the second point 660-2 is arranged between the first point 660-1 and the third point 660-3, and the third point 660-3 is arranged between the second point 660-2 and the fourth point 660-4, on the straight line 650-1.

As was previously discussed, each straight line 650 has a length ranging from 19 μm to 42 μm. As was explained above, each straight line 650 may alternatively have any of the other lengths, i.e., for example, a length ranging from 19 μm to 21 μm, which corresponds to a length of the straight line 650 of 20 μm+/−5%.

The course of such a polygon with the straight lines 650 may be defined, for example, in that a corresponding minimization of the square of the distance of the contiguous line 630 from the respective straight line 650 in relation to the length of the straight line 650 is determined. Alternatively or additionally, the precise course of such a straight line 650 may also be determined in that while considering the sign of the distance, the sum of the distances disappears, or is set to zero, depending on which one of the two sides of the straight line 650 the contiguous line 630 runs on. Of course, other minimization methods or optimization methods may also be used for determining the course of the polygon, or for determining the course of the straight line 650.

If what is dealt with is, for example, a contiguous line 630 which delimits, i.e. fully encloses, a zone in the projection plane, it is possible to approximate, as a criterion for the course of the individual straight lines 650, while taking into account the predefined and above-mentioned lengths of the individual straight-line pieces 650, the surface area of the zone enclosed by the contiguous line 630 by means of the polygon. One termination criterion or a target criterion selected for a specific optimization may be that the surface area of the resulting polygon ranges between 90% and 110% or between 95% and 105% of the surface area of the zone enclosed by the contiguous line 630.

Basically, deviating lengths of the straight lines 650 may also be admitted in the context of the above-described embodiments. For example, it is possible to define that the individual straight lines 650 comprise lengths of between 9 μm and 11 μm, i.e. which correspond to lengths of the straight lines 650 or 10 μm+/−10%. In addition, especially in the context of the embodiment of an intermeshing structure 600 shown in FIG. 9, it is important to mention that, typically, not each straight line 650 needs to meet the respective features with regard to points 660-1 to 660-4. Basically, it is sufficient for one individual straight line 650 of the respective polygon to fulfil the above-described features with regard to the course of the contiguous line 630. Rather, in the embodiment shown in FIG. 9, the three straight lines 650-1, 650-2 and 650-3 which are fully represented, fulfil the respective features in terms of the four points 660 drawn, respectively. However, to simplify the representation, an inscription of the respective points with the reference numerals 660-1 to 660-4 has been effected only in connection with the straight line 650-1. However, the points ("X") of the two straight lines 650-2 and 650-3, which are plotted in FIG. 9, show that they also meet the conditions defined above.

Figure 10:
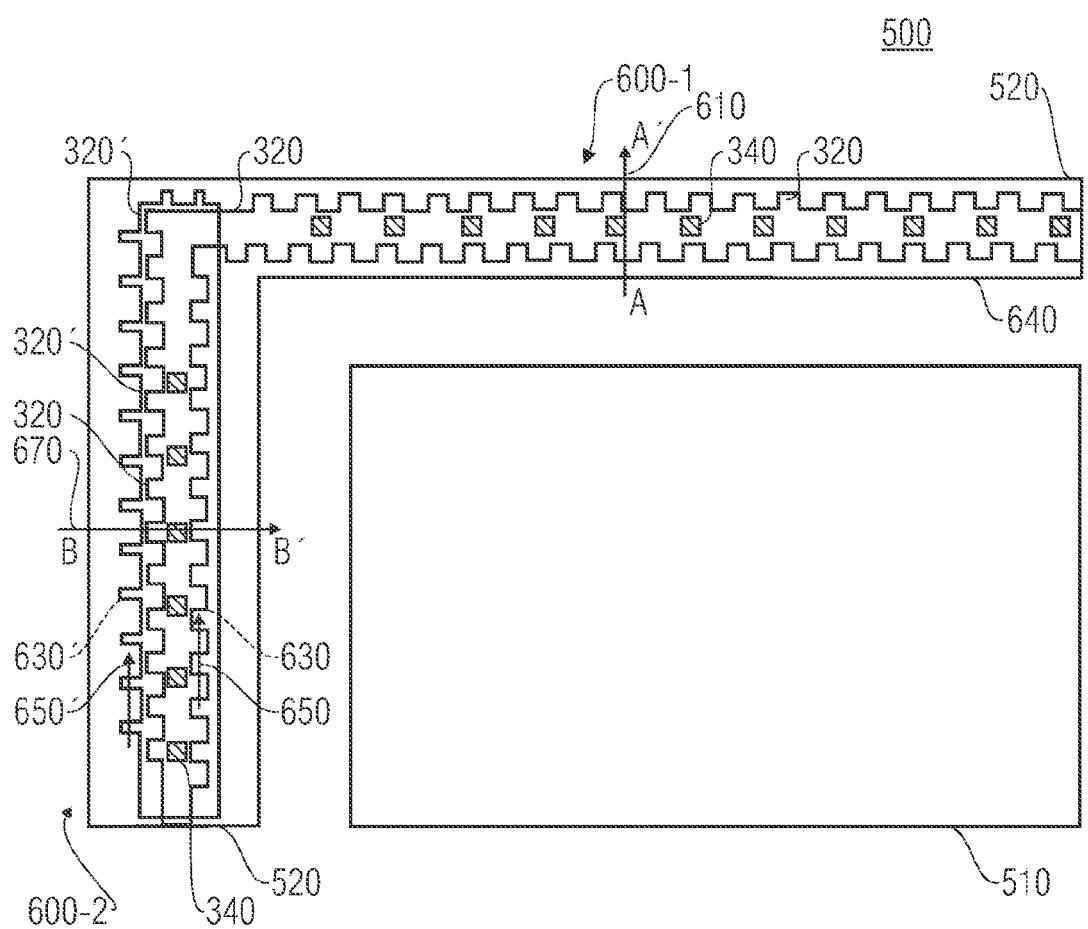
FIG. 10 shows a top view of an embodiment of an intermeshing structure.

FIGS. 10 and 11 illustrate two embodiments of respective intermeshing structures 600-1, 600-2, which in turn are explained in connection with a semiconductor device in the form of a vertical high-power transistor. As was previously represented in connection with FIGS. 6 and 7A, FIG. 10 shows a top view of a chip 500, which in turn comprises a source metallization zone 510 and a gate metallization zone 520, or a gate runner 520. In the chip 500 shown in FIG. 10, in turn, the gate runner 520 is protected by two different embodiments of intermeshing structures 600 against a shift along the surface of the substrate 410, which is not drawn in FIG. 10. As was explained above in connection with FIG. 6, here, too, the gate runner has a typical structural width of 10 μm to 500 μm.

The first embodiment of an intermeshing structure 600 is shown in the upper area of FIG. 10, more specifically in the upper area of the gate runner 520. What runs below the gate runner 520 is a feed structure 320 which may be made, for example, of polysilicon and which enables, by means of contact holes 340 in the intermediate oxide 330 not shown in FIG. 10, an electrically conductive contact between the gate runner 520 and the feed structure 320, which is also referred to as poly gate or poly-G. The feed structure 320 has a sawtooth shape, as was already shown, for example, in connection with FIG. 8A. It is to be noted that the feed structure 320 is shaped in this manner on both sides of the contact holes 340 which are arranged on a straight line.

For the gate runner 520, which in the embodiment of an intermeshing structure 600 shown in FIG. 10 above represents the metal structure 640, the poly gate 320 thus represents the structured device layer 620, so that the outer shape of the feed structure 320 forms the topology edge 630. To explain this in more detail, FIG. 11A shows a cross-section A-A' along the direction 610 drawn in FIG. 10, with which cross-section A-A', in turn, structures and layers in the area of the substrate 410, and a potentially existing first oxide are not shown in FIG. 11 in order to simplify the representation.

Figure 11A:
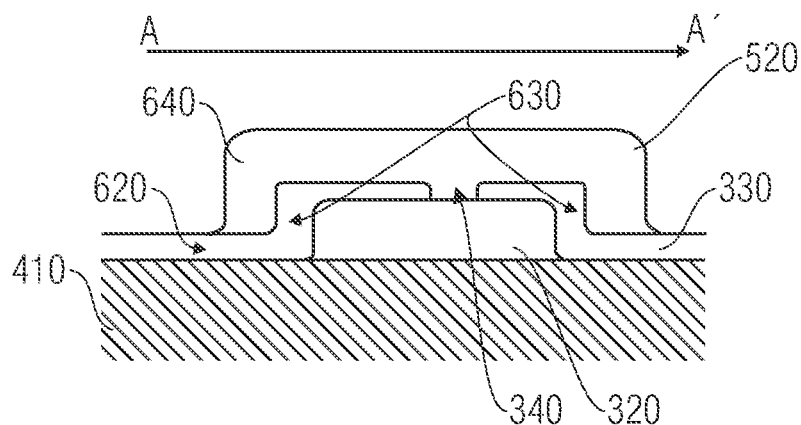
FIGS. 11A and 11B each show a cross-section through the embodiment, depicted in FIG. 10, of an intermeshing structure.

On the substrate 410, FIG. 11A shows the feed structure 320 (poly gate), which in this case acts as a structured device layer 620 and which may be fabricated from polysilicon, for example. As was already explained in connection with FIGS. 3 and 4, the feed structure 320 has an insulating layer deposited thereon as the intermediate oxide 320, which in turn has the gate runner or the gate metallization zone 520 deposited thereon. The gate runner 520 represents the metal structure 640 of the embodiment of the intermeshing structure 600. As the recess, the intermediate oxide 330 comprises the contact hole 340, which enables an electrically conductive contact between the gate runner 520 and the poly gate 320.

As was already mentioned above, in the embodiment of an intermeshing structure 600-1 shown in cross-section in FIG. 11A, the poly gate 320 approximately represents the structured device layer 620, so that the topology edges 630 of the intermediate oxide 330 and the topology-forming edges of the poly gate 320 are defined by the topology or the structure of the poly gate. The metal structure 640 (gate runner 520) is now able, on account of the structure of the topology edge 630 depicted in the upper area of FIG. 10, to release forces and force components, which act upon the metal structure 640 in the plane of the substrate or in a parallel plane, to the substrate 410 in all spatial directions in the plane via the topology edges 630, and thus to achieve intermeshing. More specifically, the poly gate 320 forms the topology-forming edges for the topology edge 630 of the intermediate oxide 330 (INT OX).

As will also be illustrated in more detail by the cross-sectional drawing represented in FIG. 11A, the outer shape or the structure of the poly gate 320 represents the topology-forming edges, which become the topology edges 630 by means of the intermediate oxide 330 on the poly gate 320. With regard to the typical lateral dimensions in comparison with the typical layer thicknesses of the intermediate oxide, however, the topology-forming edges may approximately be put on a level with the topology edges 630 formed by the intermediate oxide.

Since the topology edge 630, as is shown in FIG. 10 above in connection with the poly gate 320 as structured devices 620, was already explained in connection with FIG. 8A, the discussion of the straight lines 650 and of the contiguous line 630, which results in a projection into a plane parallel to the surface of the substrate 410, may be dispensed with in connection with this figure. Rather, reference shall be made, in this context, to the respective description passages provided in connection with FIG. 8A. What typically results in such a case are structural widths of an area or a zone which is (at least partly) delimited by the contiguous line such that a structural width ranging from 10 μm to 500 μm may be defined.

In addition, in its left-hand sub-area, FIG. 10 shows a second embodiment of an intermeshing structure 600-2 arranged in the area of the gate runner 520. In this area, the further inventive embodiment of an intermeshing structure 600-2 comprises, in addition to the gate runner 520 (gate metallization zone 520), the feed structure 320 (poly gate), the contact holes 340 in the intermediate oxide (not shown in FIG. 10), and a further feed structure 320' which is also frequently made of polysilicon and is also referred to as a poly source or poly-S on account of its functional property.

Figure 11B:
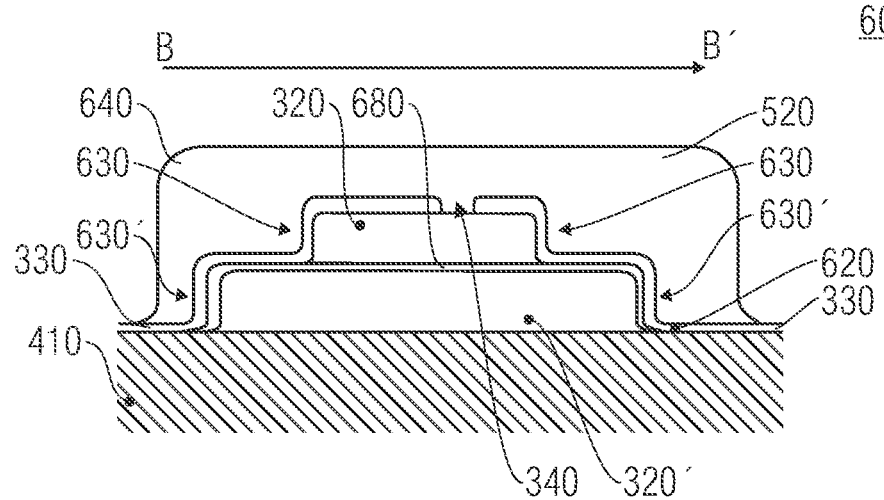

However, before the precise mode of operation of the embodiment of the intermeshing structure 600-2 is discussed, the structure of the device in this area will be explained in more detail initially with reference to a cross-section B-B' depicted in FIG. 11B, the section shown in FIG. 11B being the direction 670 drawn in FIG. 10 which extends across the metal zone of the gate runner 520 into the distance between the two metal zones 510, 520. FIG. 11B shows a cross-section B-B' through a substrate 410 wherein, again for simplifying the representation, any structures, doping profiles or similar objects and structures which are located below the substrate surface are also not drawn in, such as a first oxide (cf. insulating layer 270 of FIGS. 3 and 4). The feed structure 320' is initially applied to the substrate 410 and structured, the feed structure 320' frequently also being referred to as a poly source or poly-S especially in the field of vertical high-power transistors, since electrodes which, during operation of the respective device, have source potential applied thereto are frequently contacted via the feed structure 320'. Examples of these electrodes are the lower electrodes 280 of FIGS. 3 and 4.

For electrically insulating the feed structure 320' from further electrically conductive structures, said feed structure 320' is covered by an insulating layer 680, at least in the cross-section B-B' shown in FIG. 11B. The insulating layer 680 in turn has the feed structure 320 (poly gate) applied thereon, which is covered by the intermediate oxide 330, except for the area of the contact hole 340. By means of known methods of thin-film technology and semiconductor technology, the contact hole 340 is structured into the intermediate-oxide layer. In addition, the intermediate oxide 330 covers the poly gate 320 not only in the area of the cross-section in FIG. 11B, but rather also covers the insulating layer 680 in the area where the underlying poly source 320' extends across the area of the poly gate 320. In addition, the intermediate oxide 330 extends across the entire cross-section shown in FIG. 11B and thus represents an (additional) insulation of the overlying structures from the underlying substrate 410. In addition, FIG. 11B shows that the gate runner 520, which is typically made of metal, covers the entire area of the underlying poly gate structure 320 and of the poly source structure 320'.

As was already discussed above in the context of FIG. 11A and the embodiment of an intermeshing structure 600-1 depicted there, the intermediate oxide 330 represents the actual structured device layer 620 in this embodiment, too. The intermediate oxide 330, or the structured device layer 620, forms two separate topology edges 630, 630' for the overlying gate runner 520, which in the embodiment shown in FIG. 11B represents the metal structure 640.

Here, the topology edge 630 is essentially formed by the shape of the feed structure 320 (poly gate) with its rim structures acting as topology-forming edges. By contrast, the topology edges 630' eventually go back to the shape and structure of the feed structure 320' (poly source) with its topology-forming edges. It is to be noted in this context, however, that the topology-forming edges of the poly source structure 320' are in turn switched, or transferred, to the intermediate oxide 330 by the topology-forming edges of the insulating layer 680 surrounding same.

Thus, in the embodiment of an intermeshing structure 600-2, as is shown in the cross-section in FIG. 11B, the topology edges 630, 630' basically form two contiguous lines, in a projection into a plane parallel to the surface of the substrate 410, for which the features discussed in connection with FIGS. 8A and 9 with regard to definable straight lines shall apply. The outer structure of the two feed structures 320, 320' may be approximately identified in turn in FIG. 10 on account of the typically small thickness of the oxide layers or insulating layers 330, 680 with the topology edges 630, 630', as is also approximately represented in FIG. 10. By way of example, a straight line 650 for the (approximated) topology edge 630, and a straight line 650' for the approximated topology edge 630' are drawn in and marked accordingly in FIG. 10 on the basis of this approximation.

On account of the fact that, in this area, the structures of the topology edges 630, 630' are very similar to those shown in FIG. 8A, a more detailed discussion of the respective features and properties of the two straight lines 650, 650' may be dispensed with while referring to the respective description of FIG. 8A. Rather, reference will be made to the respective description passages and to FIGS. 8A and 9. The statements made above with regard to the length shall also apply to the two straight lines 650, 650'.

Unlike the two embodiments of intermeshing structures which have been discussed, the two embodiments for intermeshing structures 600-1, 600-2 which are represented in FIGS. 10, 11A and 11B are not based on the contact-hole layout (contact holes) for the gate contacts on the gate runner 520, but rather on the implementation of the gate polysilicon layout and the source polysilicon layout 320, 320'. Therefore, what is represented here are further intermeshing structures 600-1, 600-2, which are based on a different principle, however. The metal area in the form of the gate runner 520 is laid out wide enough to laterally extend at least beyond one topology stage. In the case of the first embodiment 600-1, this is shown at the upper gate runner area. The gate polysilicon 320 creates an additional topology stage in the form of the topology edges 630, the lateral boundary of which now being additionally provided with intermeshing structures as may be defined by means of the projection in connection with the straight lines 650.

A double topology stage is represented, by way of example, in the area of the second embodiment 600-2, i.e. at the left-hand gate runner 520, the layer sequence here being represented in the cross-section shown in FIG. 11B on the basis of the substrate 410. More specifically, the layer sequence here is defined by the order of the source poly 320-gate poly 320'—intermediate oxide 330 (INT OX)—metallization 520 (gate runner), while neglecting additional insulating layers (insulating layer 680). The intermeshing structures in the form of the topology edges 630, 630' here are approximately defined by the combined edges of the source poly 320' and the gate poly 320.

The second type of embodiments of intermeshing structures 600-1, 600-2, which, by way of summarizing, are also referred to as intermeshing structures 600, is created using existing topology stages. To this end, from a practical point of view, the metal layout of the respective metal structures (e.g. gate runner 520) may initially be drawn across the topology stages, defined by the feed structures 320, 320', far enough for a metal volume to be provided which is able to be intermeshed. Subsequently, the topology stage edge (topology edges 630, 630') is not laid out or drawn in as a straight line, but, in turn, any intermeshing shapes may be formed, as are represented, by way of example, as a type of saw tooth, among other things, in FIGS. 8-11. If there are several topology stages in the vicinity of the corresponding metal line, as was shown in connection with the cross-section in FIG. 11B and the embodiment 600-2, it is also possible to form combinations of intermeshings of both or several topology stages. Of course, especially the second embodiment of the intermeshing structure 600-2 which is shown in connection with FIGS. 10 and 11B is not limited to two topology stages or topology edges 630, 630', but may basically be expanded to any number of topology edges or topology stages.

On principle, the intermeshing structures may be adapted in an optimum manner to the respective stress or the loads present in each case and to the respective directions of travel of the loads also by means of (numerical) simulations. Frequently, there are completely different intensities of stress or intensities of loads and directions of load present in the chip corners than at a longitudinal side of the chip 500. This results in an optimum intermeshing structure shape for each position on the chip 500 as a function of the respective position (X coordinate, Y coordinate), as a function of adjacent metal areas, as a function of adjacent topology stages, and other parameters dependent on the design of the respective device and its manufacture. In the ideal target design, a variety of intermeshing shapes and combinations of the various embodiments shown, for example, in FIGS. 7 and 10, may result so as to achieve as efficient a relief as possible for the respective metal structures from lateral forces acting along the surface of the substrate.

In conclusion, it is useful to note that any, or complete, combinations of intermeshings in accordance with the embodiments of intermeshing structures 400 (cf. FIG. 7) and embodiments of intermeshing structures 600 (cf. FIG. 10) are possible. Basically, there is additionally the possibility of employing each topology-forming edge or the topology edge resulting therefrom, which may then be completely covered with metal, for intermeshing by applying respective structures. Embodiments of such intermeshing structures 400, 600 are applicable, for example, for gate runner structures in the area of any transistors, i.e. not only vertical high-power transistors, which were put in the foreground for exemplary purposes only, so as to protect these metal structures against shifts (shifted metal lines). After opening the housing and after possibly employing a metal lift-off, the structures may typically be determined and optimized using a microscopic image.

It shall also be noted that any combinations of embodiments of intermeshing structures and anchoring structures may also be implemented together. To mention only one example, the embodiments of intermeshing structures shown in FIGS. 10 and 11 may be combined with the embodiments of anchoring structures such as are depicted, for example, in FIG. 2. Depending on the specific implementation, two- or multi-sided anchoring may thus be employed.

The embodiments of the present invention described in the context of FIGS. 5 to 11 in many cases are embodiments wherein the respective structure-forming edges, contact holes or other openings are electrically active, i.e. are suited to transport electrical signals, potentials and currents on account of their being lined with a conductive material (e.g. metal or semiconducting material). Especially in the case of contact holes (e.g. contact hole 340 in FIG. 11B), there is the possibility of transferring an electrical signal (voltage or current) from a metal structure to a semiconducting structure or from a semiconducting structure to another, or from a metallic structure to another metallic structure, the two electrically conductive structures involved otherwise being separated by an insulating layer or insulating barrier.

An intermeshing structure 600 in accordance with an embodiment of the present invention for a device on a substrate 410 comprises a structured device layer 620 on the substrate 410, the device layer 620 comprising at least one topology edge 630, the structured device layer 620 comprising an insulating layer and a multitude of contact holes, and a metal structure 640 on the structured device layer 620, which extends at least over part of the topology edge 630 of the structured device layer 620. In a projection into a plane, the part of the topology edge 630 forms at least one contiguous line 630, a straight line 650 having a length of between 19 μm and 42 μm being definable along the contiguous line 630, so that the line 630 is located, with regard to a first point 660-1 and a third point 660-3 on the straight line 650, on a first side of the straight line 650, and is located, with regard to a second point 660-2 and a fourth point 660-4 on the straight line 650, on a side of the straight line 650 which is opposite the first side. The second point 660-2 is located between the first point 660-1 and the third point 660-3. The third point 660-3 is located between the second point 660-2 and the fourth point 660-4.

With some intermeshing structures 600, the straight line 650 comprises a length of between 19 μm and 21 μm. With an intermeshing structure 600 in accordance with an embodiment of the present invention, the contiguous line 630 comprises at least one first straight portion and one second straight portion which are adjacent to each other, a direction of the first straight portion and a direction of the second straight portion forming an angle of between 70° and 110° with one another. Likewise, with such an intermeshing structure 600, the contiguous line 630 may be round, bent, cross-shaped, polygonal, meander-shaped or wavy. Likewise, with the intermeshing structure 600, the contiguous line 630 may delimit an area comprising a typical structural width of between 10 μm and 500 μm. In some embodiments of intermeshing structures 600, such a contiguous line 630 comprises a plurality of straight lines which polygonally approximate an area enclosed by the contiguous line, so that a difference between the enclosed area and an area of the polygon amounts to a maximum of 20% of the area enclosed. In other embodiments, the difference amounts to a maximum of 10%, 5%, 2% or 1%.

In embodiments of an intermeshing structure 600, an electrically conductive contact structure 320 may be arranged between the structured device layer 620 and the substrate 410, the structured device layer 620 comprising an insulating layer 330, and the structured device layer 620 comprising at least one recess 340 in the insulating layer 330, so that the metal structure 640 is in direct contact with the contact structure 320. The device may comprise a further stack of layers 680, 320' between the substrate 410 and the structured device layer 420, the further stack of layers comprising a topology-forming edge, so that the metal structure 640 at least partly extends over a topology edge 630' which is based on the topology-forming edge of the further stack of layers.

The further stack of layers may comprise a further contact structure 320' and an insulating layer structure 680 on the further contact structure 320', the contact structure 320 being at least partly arranged on the further stack of layers. The structured device layer 420 then includes an insulating layer 330, the structured device layer 420 being arranged on the contact structure 320. With such an intermeshing structure 600, the metal structure 640 may comprise a main surface which at least partly lies exposed.

Figure 12:
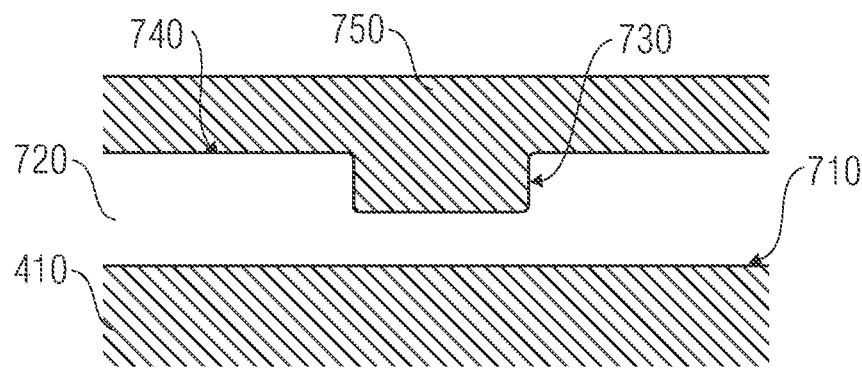
FIG. 12 shows a cross-section through an embodiment of an anchoring structure.

FIG. 12 shows a further embodiment of an anchoring structure 700-1 for a device on a substrate 410. Again, for simplification purposes, in the cross-sectional representation of a respective device shown in FIG. 12, any structural details such as doping profile, additional insulating layers (e.g. first insulating layer), or other details, which may possibly be present in the area of the substrate 410, are not drawn in.

The substrate 410 comprises a main surface 710 which has a structured device layer 720 comprising at least one topology structure and a main surface 740 facing away from the substrate 410 applied thereon. In the embodiment of an anchoring structure 700-1 shown in FIG. 12, the topology structure 730 is a recess in the structured device layer 720 which comprises a depth smaller than the thickness of the structured device layer 720, so that an area comprising a finite thickness of the structured device layer 720 extends below the recess as the topology structure 730.

Depending on the specific implementation of the respective embodiment of an anchoring structure 700-1, the structured device layer 720 may be one which comprises one or several electrically insulating layers or which comprises only one semiconducting layer having a single or no specific doping.

In addition, the embodiment of an anchoring structure 700-1 as is shown in FIG. 12 comprises a metal structure 750 applied or arranged on the structured device layer 720. More specifically, the metal structure 750 is arranged on that main surface of the structured device layer 720 which faces away from the substrate 410.

On account of the topology structure 730 in the structured device layer 720 it is now possible for the metal structure 750, in turn, to release lateral forces along the surface of the substrate 410 via the structured device layer 720 to the substrate 410 and thus to release a corresponding, for example thermally induced, stress to the substrate 410 without there being a shift of the metal structure 750 on the surface of the substrate or parallel to the surface of the substrate.

Figure 13:
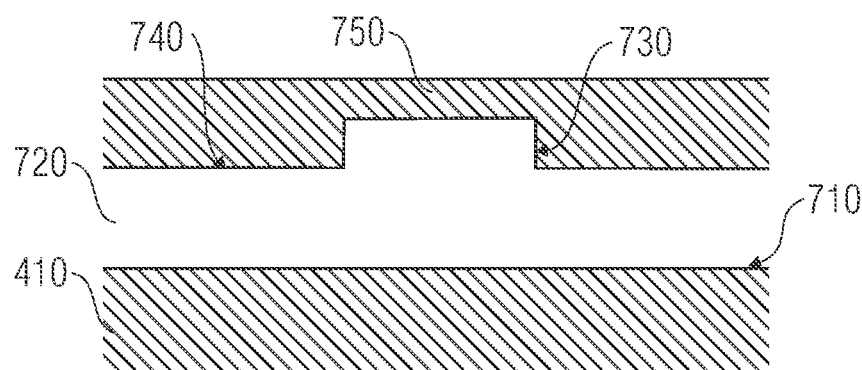
FIG. 13 shows a cross-section through a further embodiment of an anchoring structure.

FIG. 13 shows a further embodiment of an anchoring structure 700-2 which is very similar to the embodiment 700-1 of FIG. 12. In the embodiment 700-2 shown in FIG. 13, too, a substrate 410 (shown in a simplified manner in FIG. 12) initially has a structured device layer 720 applied thereon on a main surface 710 of the substrate, said structured device layer 720 comprising a topology structure 730 on a main surface 740 facing away from the substrate 410. The structured device layer 720 then has a metal structure 750 applied thereon which extends at least over part of the topology structure 730 of the structured device layer 720.

Unlike the embodiment of an anchoring structure 700-1 shown in FIG. 12, wherein the topology structure 730 extended below the main surface 740 of the structured device layer 720 in the form of a recess, in the embodiment 700-2 shown in FIG. 13 the topology structure 730 is a structure projecting beyond the main surface 740 of the structured device layer 720. In the embodiment shown in FIG. 13, too, the topology structure 730 enables the metal structure 750 to release forces which laterally act on it to the substrate 410 via the structured device layer 720. Thus, the embodiment of an anchoring structure 700-2 shown in FIG. 13 allows releasing laterally acting forces as occur, for example, in the context of temperature cycling, to the substrate 410 and thus to prevent or counteract a shift in the metal structure 750.

FIGS. 12 and 13 show cross-sectional representations of embodiments of anchoring structures 700. In their lateral expansions, the topology structures 730 may basically take on any form. Examples are cylinder-shaped recesses or cylinders projecting beyond the main surface of the structured device layer 720, as well as corresponding cuboid-shaped, cubic, polygonal or differently-shaped topology structures 730. Likewise, corresponding topology structures may basically also be configured as oblong structures running, for example, along a straight line, comprising an alignment leaning on a polygonal continuous line, or comprising a spiral, meander, wavy or any other shape which is bent appropriately. Naturally, L-shaped, U-shaped, V-shaped or cross-shaped structures are also feasible and possible.

Depending on the specific configurations of implementations of corresponding embodiments of anchoring structures 700, same may advantageously be realized, for example, not individually but as a plurality of corresponding topology structures. In this case, the topology structures 730 in their entirety enable an improved possibility of receiving lateral forces, and thus enable improved protection against shifts in the metal structure 750 as compared to a single topology structure 730. Thus, these may be implemented, for example, in two-dimensional, regular arrangements.

Especially in the field of two-dimensionally regularly arranged topology structures 730 it may be advisable to implement comparatively small topology structures 730. It may be advisable in this case, for example, to realize the topology structures 730 such that in the case of a projection into a plane parallel to the main surface of the substrate 710, they delimit an area, a diameter of a smallest circle which fully includes the area in question being smaller than or equal to 100 µm, 50 µm or 20 µm. A corresponding design was already explained in connection with FIG. 5A, which is why at this point a specific explanation along with a further image may be dispensed with. For this reason, reference shall be explicitly made at this point to the respective description passages in connection with FIG. 5A (and possibly FIG. 5B).

Likewise, it may also be advisable in this case to realize the topology structures 730 such that they delimit a non-convex area after the projection into the respective projection plane. As was explained in connection with the embodiments of intermeshing structures 400, improved resistance to lateral shifts or lateral forces may be achieved in this manner.

In the case of the embodiments of anchoring structures 700-1 shown in FIG. 12, the structured device layers 720 may be, for example, a single insulating layer or a plurality of insulating layers introduced into the respective semiconductor device or device to serve quite different purposes. Examples of such insulating layers introduced are layers implemented for electrical insulation, or chemical passivation or for mechanical protection. Likewise, functional layers such as membrane layers may basically also be used in this context, as are employed, for example, with pressure sensors or other micromechanical devices. Typical material combinations or materials employed in the field of the structured device layers 720 are oxide layers, nitride layers or other (organic) insulating layers such as BPSG, PMMA or other polymers.

However, if in the embodiment 700-1 shown in FIG. 12, the structured device layer 720 is a semiconducting layer comprising a single or no specific doping, it may be, for example, polysilicon which may possibly be provided with a single doping. Examples are, in particular, polysilicon layers and polysilicon structures as may be employed, for example, in connection with vertical high-power transistors. It is feasible, for example, to provide the feed structures 320 shown in FIGS. 3, 4, 7, 10 with a corresponding topology structure 730 so as to achieve additional protection against lateral movements of the metal structures deposited thereon, even in the case of relatively large contact holes having dimensions of several 10 µm or several 100 µm. In this case it is useful, for example, to restrict the topology structures 730 to the area of the contact holes 340.

Even in the case of the embodiments of anchoring structures 700-2 depicted in FIG. 13, wherein the topology structure 730 projects beyond the main surface 740 of the structured device layer 720, the above-mentioned materials and material combinations may basically be employed. In addition, however, more complex structured device layers 720 may also be employed in these embodiments, which, for example, comprise more than one doping or comprise a combination of metallic, insulating and/or semiconducting layers. In these embodiments, too, several, possibly two-dimensional, regularly arranged topology structures 730 may be used. In this case, too, it may be advisable, depending on the specific implementation, to employ comparatively small topology structures 730 for which the statements made above with regard to the diameter of a smallest circle are valid in the projection into a plane parallel to the main surface 710 of the substrate 410.

Irrespective thereof, it may be advisable also with this embodiment of anchoring structures 700-2 to restrict same to the area of the contact hole 340 in the case of an implementation within a contact hole 340, so as not to unnecessarily introduce thick, possibly even obstructing topology edges or topology-forming edges into a device. In addition, it is to be noted that all embodiments of anchoring structures 700 as are depicted in connection with FIGS. 12 and 13 may be employed as combinations of the above-mentioned embodiments of anchoring structures and intermeshing structures.

In addition to the regular arrangement discussed above, in embodiments of the present invention, irregular arrangements of respective structures for intermeshing in the form of recesses and elevations may also be arranged in a unidimensionally or two-dimensionally irregular manner. Depending on the specific implementation, a total number of respective topology structures of 10 or more, 20 or more, 50 or more or 100 or more may be implemented so as to allow respective intermeshing of the overlaying metal structure. In addition, depending on the specific implementation, for example, a proportion of 20% to 40%, or 20% to 30%, based on a surface area of the respective underlying structured device layer, may be part of a respective topology structure.

An anchoring structure 700 for a device on a substrate 410 in accordance with an embodiment of the present invention comprises a structured device layer 720 on the substrate 410, the structured device layer 720 comprising at least one topology structure 730, and comprises a main surface 740 facing away from the substrate 410, and a metal structure 750 on the structured device layer 720 extending over at least part of the topology structure 730, the structured device layer 720 comprising only one or several electrically insulating layers, and the topology structure 730 comprising a recess, in the structured device layer 720, having a depth which is smaller than a thickness of the structured device layer 720. Alternatively, with an anchoring structure 700, the structured device layer 720 may comprise only a semiconducting layer without doping or with a single doping, and the topology structure 730 may comprise a recess, in the structured device layer 720, having a depth which is smaller than the thickness of the structured device layer 720. As a further alternative, the topology structure 730 may also comprise a structure projecting beyond the main surface 740 of the structured device layer 720.

With such an anchoring structure 700, the structured device layer 720 may comprise a plurality of topology structures 730. Likewise, with such an anchoring structure 700, the plurality of topology structures 730 may be arranged on the substrate 410 in a two-dimensionally regular or irregular manner.

With an anchoring structure 700 in accordance with an embodiment of the present invention, that part of the topology structure 730 over which the metal structure 750 extends, may delimit an area in a projection into a plane, a diameter of a smallest circle, which fully comprises the area, being smaller than or equal to 50 µm. With such an anchoring structure, that part of the topology structure 730 over which the metal structure 750 extends may delimit a non-convex area in a projection into a plane. With an anchoring structure 700, the structured device layer 720 may comprise a polysilicon layer, and the topology structure 730 may comprise a recess, within the polysilicon layer, having a depth which is smaller than the thickness of the polysilicon layer. Alternatively or additionally, the topology structure 730 may comprise a main surface 740, facing away from the substrate 410, of the polysilicon layer. With such an anchoring structure 700, the metal structure 750 may comprise a main surface which at least partly lies exposed.

Figure 14:
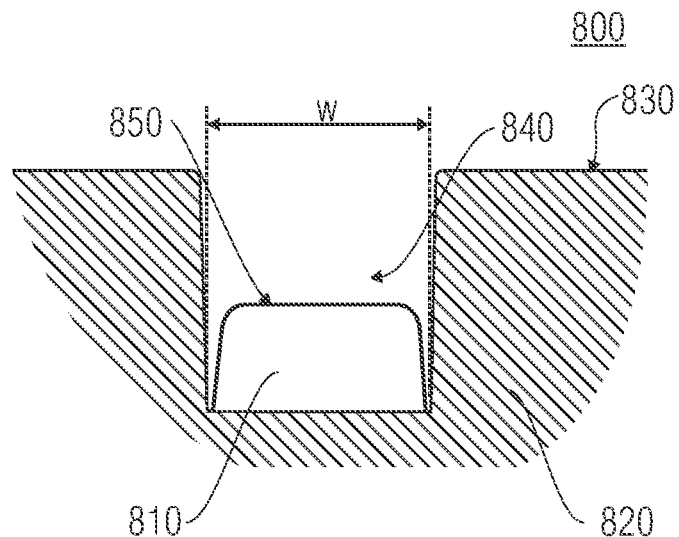
FIG. 14 shows a cross-section through an embodiment of an anchoring structure.

FIG. 14 shows a further embodiment of an anchoring structure 800 for a conductor layer structure 810 in a device 820 comprising a main surface 830. The device 820 may basically be any device, i.e. a semiconductor device or any other thin-film device. To simplify the representation in FIG. 14, for the device 820 shown there, no details with regard to the functional realization or the layer structure or other functional features are depicted. Consequently, the device 820 may be, e.g., relatively simple semiconductor device structures, i.e., for example, a diode structure or a transistor structure. In addition, it is naturally also possible for the device to be relatively complex integrated circuits, application-specific integrated circuits ((ASICs), logic circuits, sensors manufactured in thin-film technology, or relatively complicated integrated circuits such as processors of any kind.

Moreover, the device 820 comprises a main surface which results, for example, during the final manufacturing process steps. For example, the finished device 820 may be covered by protective layers at least in parts or areas of same, such as by oxide layers or nitride layers.

The device 820 further comprises a recess 840 which extends into same starting from the main surface 830 of the device 820. In the device 820 shown in FIG. 14, the recess comprises essentially perpendicular side walls, so that there is an essentially constant width W, as is also drawn in FIG. 14, apart from manufacturing tolerance variations as may occur, for example, in the form of rounding-offs in the bottom area of the recess 840.

The embodiment of an anchoring structure 800 shown in FIG. 14 further comprises the conductor layer structure 810 which extends entirely, at least over a specific or predetermined length of the conductor layer structure 810, within the recess 840 below the main surface 830 of the device 820. The recess 840 typically extends, over a specific length segment, along a direction which is perpendicular with regard to the cross-sectional plane shown in FIG. 14, i.e. extends over a (certain) length. Therefore, the recess 840 typically is a trench structure which extends, in a top view, not shown in FIG. 14, of the device 820, for example along a straight line, along a polygonal continuous line or along a curved line, i.e., for example, along a helical, circular or meander-shaped line. In relation to an overall length of the conductor layer structure 810, it is typically over a length of 90% or more of the overall length of the conductor layer structure 810 that same extends fully within the recess below the main surface 830 of the device 820. Depending on the specific implementation of a respective device 820, it may also be over a length of more than 95% with regard to the overall length of the conductor layer structure 810, or even fully, that the conductor layer structure 810 extends within the recess 840 below the main surface 830 of the device 820.

The conductor layer structure 810 therefore typically comprises a width smaller than or equal to the width W of the recess 840. The widths of the conductor layer structure 810 and of the recess 840 may be widths of typically less than 5 µm in the case of narrow feed lines, depending on the envisaged application possibility of the embodiment of an anchoring structure 800. In addition, however, depending on the specific implementation, the widths of the recess 840 and of the conductor layer structure 810 may also typically be smaller than or equal to 50 µm, smaller than or equal to 100 µm or, in the case of contact structures or bond pads, range between 100 µm and 500 µm. Basically, the possibility of also using conductor layer structures 810 which are clearly narrower or less wide than the width of the corresponding recess 840 is quite relevant.

As was previously set forth in the discussion of the length of the conductor layer structure 810, which extends entirely within the recess 840, the conductor layer structure 810 may fully, i.e. based on its overall length at a proportion of 100%, run within the recess 840. In this case, for example, associated contacting pads, or bond pads, which may also be included in the conductor layer structure 810, are possibly also arranged within the recess 840, so that they are arranged entirely below the main surface 830 of the device 820. In order to enable respective contacting, or bonding, for example of such a contacting pad, the conductor layer structure therefore lies exposed with regard to a main surface 850 of the conductor layer structure, which with regard to the conductor layer structure 810 consequently faces away from a bottom of the recess 840. In particular, this means that the conductor layer structure 810 is so easily accessible, at least with regard to part of the length of the conductor layer structure 810, regarding its main surface 850, that it may be reached, for example, by a contact wire or a bond wire.

Of course, in this context, by a "surface lying exposed" is meant a surface which lies exposed, for example, prior to molding in a packaging process. In other words, covers of the conductor layer structure 810 which are realized, for example, by molding material and/or further, mostly organic, passivation layers or protective layers, are not taken into account in terms of whether or not the conductor layer structure lies exposed. In this context, the expression "conductor layer structure 810 lying exposed" refers to whether for said conductor layer structure 810, electrical contacting may be effected, i.e., for example, by means of bonding or press-contacting or spring-loaded contacting, with direct regard to the main surface 850 of the conductor layer structure 810.

Depending on the specific implementation, however, the conductor layer structure 810 may also be designed to emerge from the recess 840 so as to contact same from outside the recess 840, for example with regard to the main surface 830 of the device 820. In this case, the proportion of the length of the conductor layer structure 810 which—with regard to the length of the conductor layer structure 810 and the recess— does not extend entirely within the recess 840, i.e. below the main surface 830 of the device 820, typically amounts to less than 10% or less than 5%. In this context, a link is frequently established between the surface areas of the respective regions, so that, for example, typically a maximum of 10% or a maximum of 5% of the surface area of the conductor layer structure 810, with regard to the surface area of the recess, does not extend entirely below the main surface 830.

However, what is taken into account here is exclusively the area of the length or the surface area of the conductor layer structure 810 which extends in the area of the geometric arrangement of the recess 840. It is therefore quite possible that this conductor layer structure 810 is designed to emerge from the recess 840, for example by a bend in the conductor layer structure 810, and is continued, possibly with a broader width, on the main surface 830 of the device 820. In this case, the proportion of the length of the conductor layer structure 810 which does not extend in the geometric area of the recess 840, remains unconsidered with regard to the overall length of the conductor layer structure 810.

For completeness' sake, it should also be mentioned that, quite possibly, more than one recess may be integrated on the device 820, said recesses meeting or crossing or leading into one another, for example. Accordingly, depending on the specific implementation, more than one conductor layer structure 810, which may quite possibly be in electrical contact with one another, may be implemented on the device 820.

In addition, the conductor layer structure 810 is typically a conductor layer structure for transporting electrical signals or for supplying, leading off or contacting electrical (supply) voltages and/or electrical (supply) currents. In particular, the conductor layer structures 810 thus do not represent any waveguides for optical or electromagnetic waves or acoustic waves. Consequently, the conductor layer structure 810 comprises at least one sub-layer, for example copper, gold, silver, tungsten, platinum or palladium or aluminum. In many embodiments of an inventive anchoring structure 800, the conductor layer structure 810 additionally comprises precisely one metal layer, i.e. is identical with same at least in these embodiments.

As will be explained below in connection with the conductor layer structures depicted in FIG. 16, however, a conductor layer structure 810 as is used in embodiments of an anchoring structure 800 may quite possibly include further layers or one further layer. Depending on the specific implementation, it may thus be advantageous to integrate an optionally doped or optionally highly doped semiconductor layer in addition to a metal layer. Such a semiconductor layer may be made of polysilicon, for example.

Figure 15:
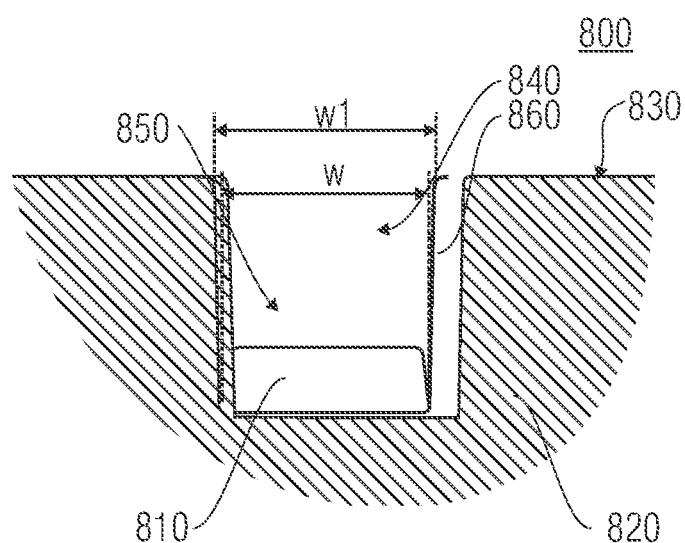
FIG. 15 shows a cross-section through a further embodiment of an anchoring structure.

FIG. 15 shows a further embodiment of an inventive anchoring structure 800 which differs from the embodiment of an anchoring structure 800 shown in FIG. 14 merely with regard to two details. For this reason, with regard to the description of the embodiment of an anchoring structure 800 shown in FIG. 15, reference shall be made explicitly to the description passage provided in connection with FIG. 14 and the embodiment shown there.

The embodiment 800 shown in FIG. 15 differs from the embodiment shown in FIG. 14 in terms of the shape of the recess 840, on the one hand, and in terms of the lining of the recess 840, on the other hand. For example, unlike the recess 840 of FIG. 14, the recess 840 comprises an optional insulating layer 860 with which the respective recess is lined in the areas of its side walls and of its bottom. The thickness of this insulating layer 860 is typically significantly thinner than the thickness of the conductor layer structure 810 and is typically clearly below 200 nm or even below 100 nm.

The insulating layer 860 explicitly shown in FIG. 15 essentially serves to illustrate that the recess, too, may comprise additional structural features, so that the recess 840 need not necessarily be realized in the substrate or substrate material (mostly silicon) of which the device 820 is made, but that, rather, the recess itself may comprise optional features or functional layers. However, these may also be regarded as part of the device 820 in the embodiment shown in FIG. 14. For example, the insulating layer 860 explicitly shown in FIG. 15 may be regarded as part in the device 820 so as to electrically insulate structures within the recess 840 from the further structures of the device 820. In other words, what is defined in the embodiment shown in FIG. 15 is that the insulating layer 860 or its side faces facing the recess 840 determine the topology or geometry of the recess 840.

The second difference between the embodiment of an anchoring structure 800 in FIG. 15 and that in FIG. 14 is that the side walls of the recess 840 no longer run essentially vertically, but form an angle which is clearly different from 0° with the normal of the main surface 830 of the device 820. Typical angles formed by the side walls of the recess with the normal of the main surface 830 of the device 820 range from inclusively 5° to 75°. Since, in the context of the present application, by essentially vertically extending side walls, flanks and other edges are meant those which have an angle of typically 5° or less with regard to a normal, in embodiments of an anchoring structure 800 the side walls of the recess 840 therefore typically form angles of between +75° and −75° with the normal of the main surface 830 of the device 820.

Since a "loss in chip surface area" may be accepted for further structural features, especially for side walls of the recess 840 which extend in a particularly flat manner, said loss in chip surface area immediately resulting by means of the common trigonometric relationships on the basis of the depth of the recess 840, as a projection face of the trench side wall, many embodiments of an anchoring structure 800 tend to envisage and implement a relatively small (absolute) angle, typically of 30° or less.

On account of the slanting side walls of the recess 840, different widths result in terms of the cross-sections of the recess which are depicted in FIG. 15. While, due to the inclination of the side walls within the recess 840, the smallest width W of the recess is present in the lower area of the recess 840, the width continually increases as the distance from the main surface 830 of the device decreases, until said width reaches its maximum W1 at the surface, or in the area of the surface. For this reason, the minimum width W is typically smaller than or equal to the maximum width W1, which frequently occurs in the area of the main surface 830 of the device 820. By contrast, the minimum width W of the recess 840 typically occurs in the area of the bottom of the recess 840.

Therefore, the width of the conductor layer structure 810 typically orients itself by the minimum width W of the recess 840. More specifically, the width of the conductor layer structure 810 is typically smaller than or equal to the minimum width W of the recess 840.

On account of the anchoring or lowering of the conductor layer structure 810 into the recess 840 underlying the main surface 830 of the device 820, the conductor layer structure 840, in turn, is extremely well protected against laterally attacking forces by the side walls of the recess 840 as topology edges. Such forces, which typically occur in connection with a TC test, but are also inevitable during normal operation of a device, depending on the type of the device, may thus be released to the device 820 or its substrate via the side walls of the recess 840. In this manner, an embodiment of an anchoring structure 800 enables, just like the other embodiments of anchoring structures and intermeshing structures which have already been described, a much higher resistance to respective loads in comparison with devices having no embodiments of inventive anchoring structures and/or intermeshing structures.

Figure 16A:
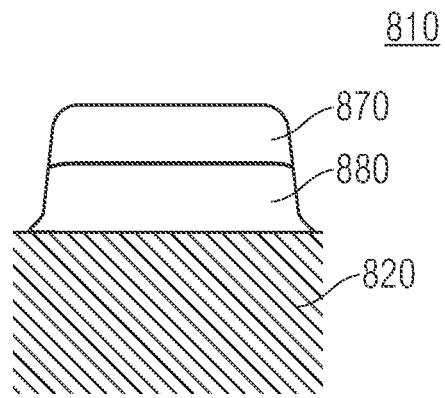
FIGS. 16A and 16B each show a cross-section through a conductor layer structure comprising a metal layer.
Figure 16B:
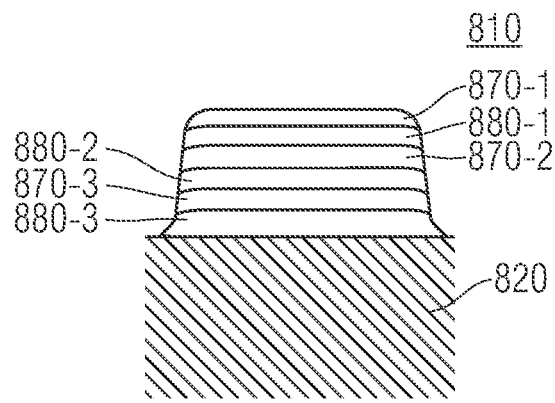

In addition to the conductor layer structures 810 already described, which include exclusively one single metal layer, FIG. 16A and FIG. 16B illustrate such conductor layer structures 810 which include at least one further layer. For example, FIG. 16A depicts a conductor layer structure 810 wherein a further layer 880 is arranged below a metal layer 870. While the metal layers 870 may be, for example, made of gold, copper, silver, platinum, palladium or aluminum, as was explained above, the further layer 880 may also be made of a metal or an alloy, for example, or of an optionally doped or optionally highly doped semiconductor material such as polysilicon, for example. In addition, it should be noted that the layer sequence, shown in FIG. 16A, of the metal layer 870 and of the further layer 880 is not compulsory. For example, the metal layer 870 may also be arranged below the further layer 880, for example. Depending on the specific implementation, it may be advantageous, for example, to arrange, as the further layer 880 below the metal layer 870, a highly doped polysilicon layer which may be used, for example, for contacting electrodes in trenches of transistor structures or other trench structures of corresponding devices. For example, this gives rise to the possibility that a parameter which is critical especially for high-power applications or high-current applications may be reduced because of the comparatively long contacting face between the metal layer 870 and the further layer 880, which results as a consequence of the parallel arrangement of the two layers in the conductor layer structure. By an implementation of a conductor layer structure 810, for example, the electrical resistance within the device 820 may be reduced, which may have a positive effect on the life expectancy and the application possibilities of the device 820.

In addition, it is possible to use more than one sequence of a metal layer 870 and a further layer 880. In addition to an alternating order of one metal layer 870 and a further layer 880 arranged underneath it, in each case, as is shown in FIG. 16B in the case of three metal layers 870-1, 870-2, 870-3 and three further layers 880-1, 880-2, 880-3, respectively, any further combination or permutation of one or several metal layers 870 with one or several further layers 880 may be effected. For example, a conductor layer structure 810, also referred to as a stack 810, may quite possibly be implemented, in such a conductor layer structure 810, with several different metallic layers 870 and/or several different further layers which may differ, for example, with regard to their dopings.

The number and mutual distribution of the different layers may also be varied as desired. For example, the embodiments of a conductor layer structure 810 shown in FIGS. 16A and 16B are meant to be examples only. It is quite possible for more than two or more than six individual layers 870, 880 to be employed. However, it is just as well possible to implement less than the respective number of layers.

Also with regard to the mutual arrangement of the different layers, two examples which are not to be taken as limiting are represented in FIGS. 16A and 16B. What is essential in this context is merely that the conductor layer structure 810, or the stack 810, comprises a metal layer which may be fabricated, for example, from one single metal or one alloy.

Also with regard to the relative thicknesses, the different layers of the stack 810 may be designed differently. For example, the thicknesses of the metal layers and of the polysilicon layers may have a ratio of about 1:2 (metal layer: polysilicon=⅓:⅔).

In further embodiments of the present invention, the respective conductor layer structures 810 may also be only partly arranged, with regard to a length, within the respective recess 840. It is possible, for example, for the respective conductor layer structure 810 to project beyond the main surface 830 of the respective device 820, and to therefore be not fully arranged within same. In this connection, it shall be noted that, basically, the conductor layer structure may also extend in a direction which is perpendicular to the direction of extension of the recess and is perpendicular to a main surface of the respective device. However, such an extension of the conductor layer structure 810 is limited, with regard to the above-defined length, to a maximum of 50% of the cross-sectional area of the conductor layer structure. In this context, it shall be noted that the above-defined length does not necessarily represent an overall length of the respective conductor layer structure or an overall length of the respective recess, but rather represents only a fraction of the respective overall length.

Figure 17:
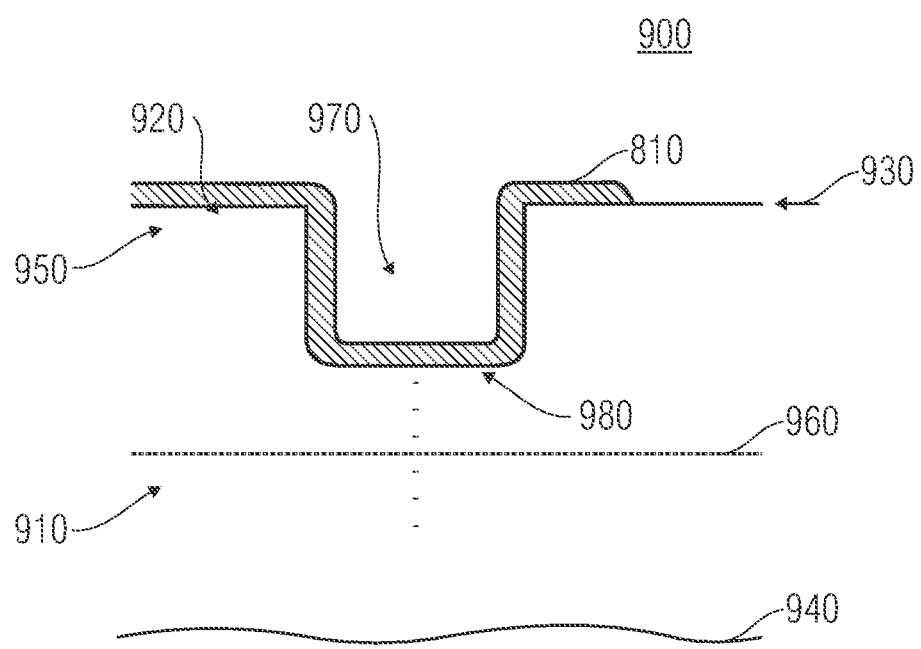
FIG. 17 shows a cross-section through an embodiment of an anchoring structure.

FIG. 17 shows an embodiment of an anchoring structure 900 comprising a substrate 910 having a main surface 920, which is also marked by the arrow 930 in FIG. 17. In addition to the main surface 920, FIG. 17 also shows a rear side 940, facing away from the main surface 920, of the substrate 910. The substrate 910 essentially is a monocrystalline substrate comprising silicon, for example. In this case it may be, for example, a substrate 910 which is possibly obtained from a silicon wafer and wherein a monocrystalline area or an epitaxial area 950 extends to the main surface 920 of the substrate 910. If this area 950 is an epitaxial area, which is typically deposited onto a monocrystalline area, there will be an interface 960 existing between the monocrystalline area of the substrate 910 and the epitaxial area 950, onto which interface 960 the respective epitaxial area 950 was deposited in the production of the substrate 910.

If the substrate is, as was previously explained, a silicon substrate 910, and if the area 950 is an epitaxial area 950, the latter will frequently have been produced, in the case of silicon, by means of chemical vapor deposition (CVD). The wafer underlying the substrate 910 will mostly have been obtained from a silicon monocrystal, which will frequently have been obtained using the Czochralski method.

Irrespective of whether the area 950 is a monocrystalline area, for example a wafer on the basis of a monocrystal, or an epitaxial area, it will nevertheless extend as far as the main surface 920 of the substrate 910. In addition, the embodiment of an intermeshing structure 900 comprises a recess 970 in the monocrystalline or epitaxial area 950 at the main surface 920 of the substrate 910. Additionally, the embodiment of FIG. 17 of an anchoring structure comprises a conductor layer structure 810 on the main surface 920 of the substrate, said conductor layer structure 810 extending into the recess 970 as far as a bottom 980 of the recess.

The conductor layer structure 810 again is a lateral layer structure as was described and discussed in connection with the embodiments of an anchoring structure 800 in FIGS. 14 and 15 and in connection with FIG. 16. In other words, the conductor layer structure 810 typically comprises at least one metal layer, which is a metal layer made of gold, silver, copper, platinum, palladium or aluminum, for example. However, the conductor layer structure 810 may also comprise further layers which may also be made of metal, for example, or may possibly include an optionally doped or optionally highly doped semiconductor material, for example polysilicon.

The conductor layer structure 810 comprising at least one metal layer on the main surface 920 of the substrate extends at least as far as the bottom 980 of the recess 970, as is also shown by FIG. 17. As is indicated in the left-hand part of FIG. 17, it may extend, outside the recess 970, over a further area, or, as is depicted in the right-hand part of FIG. 17, it may comprise only a slight overlap with the main surface 920 of the substrate or of the area 950 adjacent thereto. Depending on the specific implementation of an embodiment of an anchoring structure 900, the conductor layer structure 810 is in electrically conductive contact, at least in the area of the bottom 980 of the recess 970, with the monocrystalline or epitaxial area 950, so that the area 950 may be electrically contacted via the conductor layer structure 810 extending at the bottom 980 of the recess 970.

In many cases, the recess 970 is arranged to be insulated from further structures and structural elements. In some embodiments of the present invention, it is defined by a trench which is located in an area outside a chip and which is not covered by further conductive or insulating layers of layer structures, apart from being covered by the conductor layer structure 810. In other words, the recess 970 in many cases is a recess which indeed is not separated from a conductive substrate by an oxide or any other insulating layer. The recess 970 may be only partly filled by the conductor layer structure, as is represented in FIG. 17, or may also be fully lined by same.

Embodiments of an anchoring structure 900 allow, again, on account of the recess 970 in the monocrystalline or epitaxial area 950 of the substrate 910, realizing increased and significantly improved resistance to loads of the conductor layer structures 810 which are suited to typically lift off the conductor layer structures 810 from the main surface of the substrate 920, or to shift them along the main surface 920 of the substrate 910. Thus, embodiments of anchoring structures 900, too, provide a significant improvement in the resistance to loads as may occur, for example, during temperature cycling or also during normal operation of the future devices.

An anchoring structure 900 in accordance with an embodiment of the present invention comprises a substrate 910 having a main surface 920, a monocrystalline area 950 or an epitaxial area 950 extending as far as the main surface 920 of the substrate. It further includes a recess 970 in the monocrystalline or epitaxial area 950 at the main surface 920 of the substrate 910, and a conductor layer structure 810 comprising a metal layer on the main surface 920 of the substrate, the conductor layer structure 810 extending into the recess 970 as far as a bottom 980 of the recess.

At least at the bottom 980 of the recess 970, the conductor layer structure 810 may be in direct contact with the monocrystalline or epitaxial area 950, so that there is an electrically conductive contact between the monocrystalline or epitaxial area 950 and the conductor layer structure 810. In addition, with an anchoring structure 900, the conductor layer structure 810 may comprise a further metal layer or a semiconductor layer. Likewise, the conductor layer structure 810 may comprise polysilicon or doped polysilicon, or highly doped polysilicon. With an anchoring structure 900, the conductor layer structure 810 may also comprise a main surface which at least partly lies exposed.

The above-described embodiments of the present invention thus comprise measures for avoiding or minimizing TC risks. The embodiments of intermeshing structures and anchoring structures which were discussed above may be implemented, for example, in poly layers (e.g. polysilicon layers) and/or in contact-hole structures. Furthermore, the embodiments shown above comprise such embodiments wherein, for example, entire metal conduits or metal zones may be arranged in very wide and deep trenches, which represents a very attractive method of minimizing the TC loads, since the entire metal line or the entire metal zone is thus placed lower down, and tensile and compressive stresses act at the level of the substrate surface (e.g. silicon surface) or above it. In particular, these tensile and compressive stresses thus no longer act upon the plane of the metal line itself.

In the embodiments of the present invention which have been described so far, conductor layer structures, metal structures and metal lines, such as a gate runner, have been fully, largely, or at least partly lowered into semiconductor material (e.g. silicon (Si)) for intermeshing. It is this very lowering that is realized by forming very wide and deep recesses and trenches, into which the metal line, conductor layer structures or metal layer structures are lowered or anchored. Thus, in the embodiments previously described, metal lines are partly provided within trenches.

However, depending on the technology used for providing the respective wide trench structures, it may happen that same are subject, in trench etching, to the risk of so-called black silicon, which is not to be underestimated. Black silicon is understood to mean silicon pins which remain upright in the area of the actual trenches or recesses. This may be a consequence, for example, of an occurring micro-masking in the area of the silicon needles/pins which remain upright later on.

Once such silicon pins have come into being, generally they can only be removed again at high technological expense, if at all. They may result in that leakage currents flow over same, or that short-circuits occur from the lowered metal line, metal structure or conductor layer structure to the semiconductor environment surrounding same.

In the above-described embodiments of intermeshing structures and anchoring structures in accordance with embodiments of the present invention, in the above-designated wide trenches no intermeshings are provided in the trench bottom area and at the trench side walls with regard to lateral shifts with regard to the main surface of the respective substrates. The embodiments of the present invention which shall be described with regard to FIGS. 18 to 22 below are based on accomplishing anchoring or lowering of metal structures, conductor layer structures or metal lines—i.e., for example, the gate runner in the case of a vertical trench transistor—in very wide trench structures by means of many small, narrow trenches which at the end of the manufacturing process or at the end of the process flow are merged into a contiguous wide trench structure. By avoiding one single, very wide trench, and by replacing this single, wide trench by many narrower and therefore smaller trenches, it may be possible to greatly reduce the risk of the formation of the above-mentioned black silicon. In this manner it is possible to increase the reliability of the manufacturing process, and thus the yield and the process safety.

At the same time, a further intermeshing face forms at a bottom, or trench bottom, or in corresponding areas, as will be explained and described below. In addition, it is possible to achieve an additional variation of the width of the forming common trench by means of a controlled interruption of a trench at a rim (rim trench) or by varying a width of a rim trench within the context of the design process. This, too, may lead to further intermeshing or anchoring. Likewise, it is possible to vary, within the context of the design, a depth of a trench or of a recess of a single or several small trenches as compared to one or several other trenches, so as to enable additional intermeshing to a side face of the merged, or forming, wide trench structure.

Figure 18:
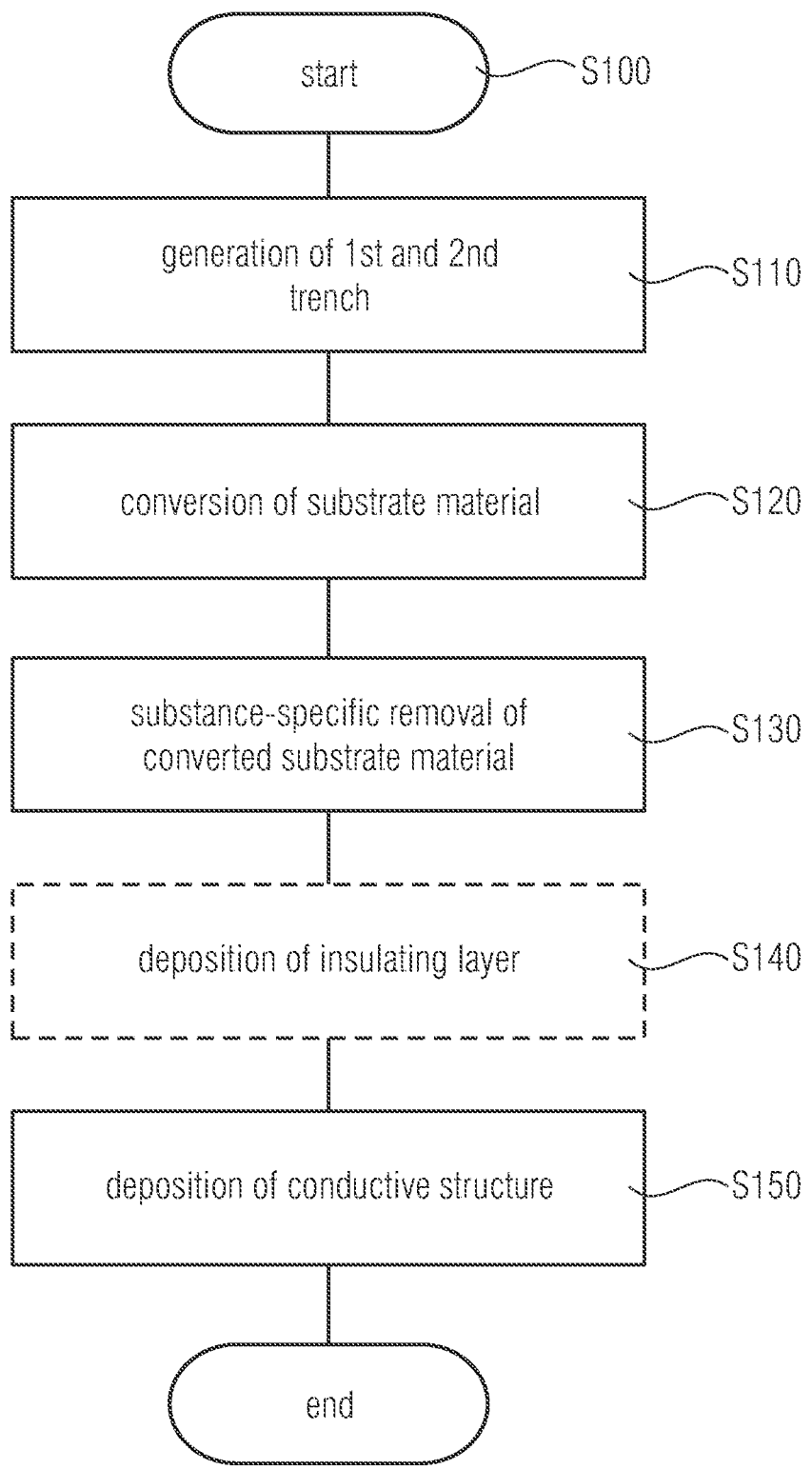
FIG. 18 shows a flow chart of a method for producing an intermeshing structure or anchoring structure for a conductor layer structure in accordance with an embodiment of the present invention.

FIG. 18 shows a flowchart of a method for producing an intermeshing structure for a conductor layer structure in accordance with an embodiment of the present invention. The conductor layer structure comprises at least one metal layer or metal alloy layer, as may also be implemented within the context of different embodiments of the present invention which are described. In addition, a conductor layer structure may comprise one or several further conductive layers, i.e. metal layers, alloy layers, optionally doped or highly doped semiconductor layers.

After a start of the method in step S100, a plurality of (small) recesses or trenches are created, initially within the context of a step S110, with a first trench and a second trench being located at a surface of a substrate material. The first trench and the second trench are arranged in parallel with and at a distance from each other, so that a mesa area of the substrate material remains between the two trenches. The trenches may be created by means of conventional techniques, i.e., for example, by means of ion beam etching (IBE), reactive ion beam etching (RIE) or by means of chemical etching methods, such as on the basis of anisotropic chemical etching of silicon. The different etching processes comprise different isotropies or anisotropies. For example, the IBE process frequently is highly anisotropic, whereas chemical wet etching tends to lead to a more isotropic removal of material.

Figure 19A:
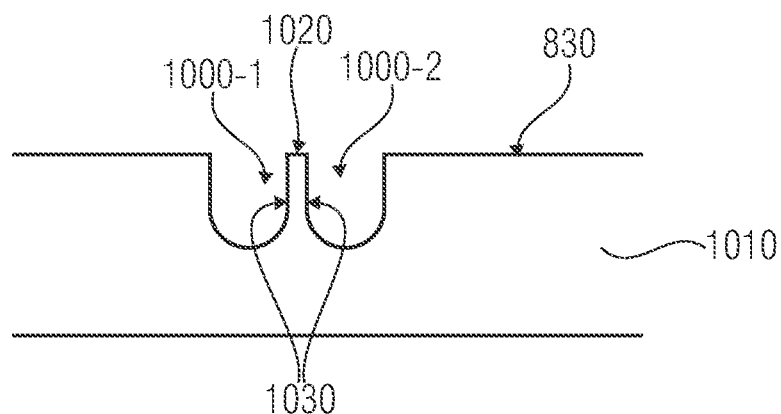
FIGS. 19A-19E show cross-sections through a device comprising an anchoring structure in accordance with an embodiment of the present invention, in various phases of manufacturing.

To illustrate this further, FIGS. 19A to 19E schematically show a cross-section through a device 820 comprising an anchoring structure 800 in different phases of manufacturing in accordance with an embodiment of the present invention. FIG. 19A shows the device 820 comprising a main surface, or surface, 830 with a first trench 1000-1 and a second trench 1000-2 which have been introduced into a substrate material 1010 such that a mesa area 1020 remains between the two trenches 1000-1, 1000-2.

Within the context of a step S120 of the flowchart in FIG. 18, a chemical and/or physical conversion of the substrate material 1010 at a surface 1030 of the mesa area 1020 is performed. This chemical conversion of the substrate material 1010 may be brought about, for example, in the context of an oxidation. This results in an oxide layer 1040 in the area of the surface 1030 of the mesa area.

Figure 19B:
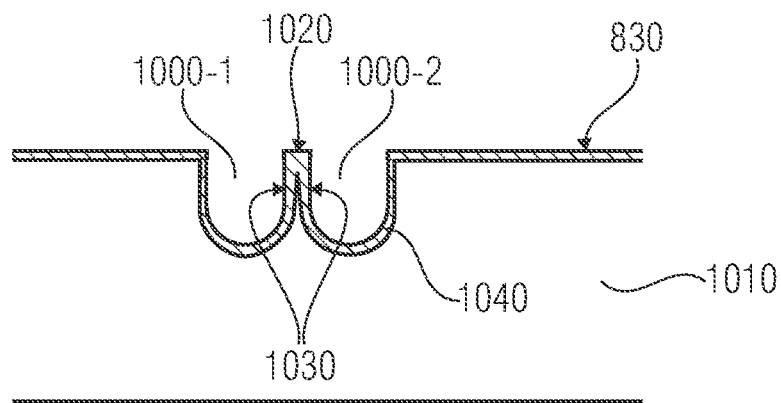

FIG. 19B shows the resulting situation for the device 820 after performing the substance conversion within the context of step S120, as was already shown in FIG. 19A. By the oxidation in the context of performing the substance conversion (step S120), the oxide layer 1040 in the area of the mesa 1020 has thus formed at the surface 1030 of the mesa area. In addition, however, in the situation depicted in FIG. 19B, the oxide layer has also formed in the area outside the two trenches 1000-1, 1000-2 and in the area of the side walls and in the area of the bottom area of the trenches.

In addition to an oxidation in the context of performing the substance conversion (step S120), other chemical or physical processes may naturally also be used for achieving a respective conversion of the substrate material 1010. For example, corresponding nitration for forming a corresponding nitride layer, or even a more complex chemical conversion, may be implemented.

Figure 19C:
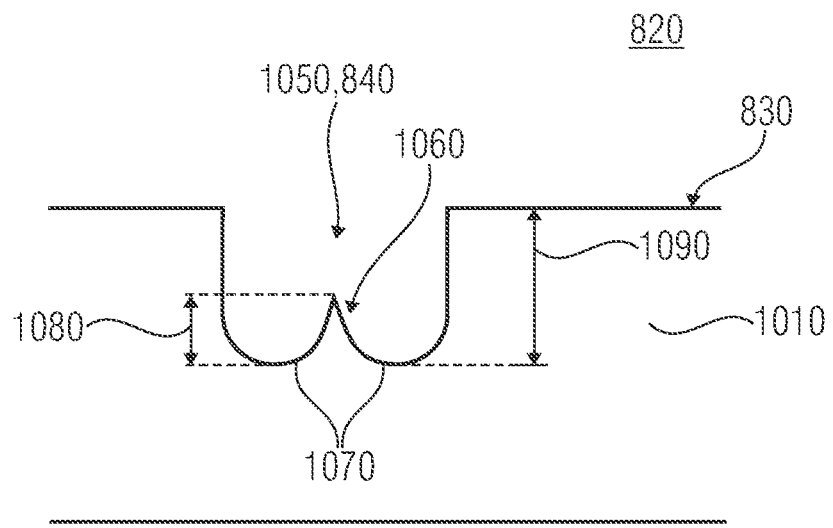
Figure 19D:
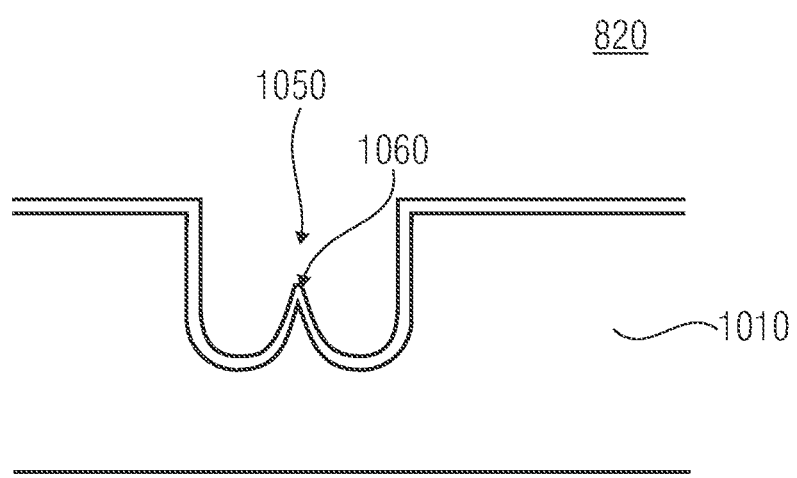

After performing the substance conversion in step S120, the converted substrate material 1010 is removed at the surface 1030 in the mesa area 1020 in a step S130 (see FIG. 18), so that the first trench 1000-1 and the second trench 1000-2 merge into a common trench 1050. The situation which results after performing the substance-specific removal is schematically shown in FIG. 19C.

Thus, a projection 1060 forms in the original mesa area 1020 as a result of the distance of the two trenches 1000-1, 1000-2 extending in parallel, and of a layer thickness of the oxide layer 1040, or of the respective layer, which forms within the context of performing the substance conversion S120, at the surface 1030 of the mesa area 1020 in the case of a substance conversion other than an oxidation. Thus, the projection 1060 has a difference in height 1080 relative to a bottom 1070 of the common trench 1050 comprising a deepest point of the bottom 1070 with regard to the main surface 830, said difference in height 1080 amounting to at least 200 nm or at least 5% of a depth 1090 of the common trench 1050 with regard to the main surface 830. In deviating embodiments, the difference in height 1080 and the depth 1090 may also be implemented, for example, with regard to respective surfaces of a recess which is formed differently. In particular, the common trench 1050, as is shown, for example, in FIG. 19C, comprises only one possible shape of a recess 840 of an anchoring structure 800.

Thus, the difference in height 1080 may be adjusted within a very wide range, while considering process-typical parameters when performing the substance conversion within the context of step S120 and of the substance-specific removal of the converted substrate material in the context of step S130. For example, because of the specific conditions in performing the substance conversion and of a selected width of the mesa area 1020, i.e. of the distance between the two trenches 1000-1 and 1000-2, the shape as well as the difference in height 1080 of the projection 1060 in relation to the bottom 1070 of the common trench 1050 may be controlled in a targeted manner in the context of the usual process variations. In addition, both the shape and the difference in height 1080 of the projection 1060 may be adjusted by influencing further parameters as will at least partly be explained in the further course of the description.

Since, in the context of the substance-specific removal (step S130) in the case of an oxidation as the step S120 (performing the conversion of the substrate material 1010), the oxide layer 1040 formed is removed again, such an oxidation is also referred to as sacrificial oxidation. If the substrate material 1010 is silicon, i.e. if the substrate is a silicon wafer, for example, the material-specific removal of the silicon dioxide (SiO2) which has formed may be performed, for example, in a wet-chemical manner by means of buffered hydrofluoric acid (HF) with NH4F as a buffer. Using such an etching step, nitride layers (Si3N4) may possibly also be removed in a substance-specific manner.

In an optional step S140 (see FIG. 18) of depositing an insulating layer 1100 at the side walls of the common trench 1050 and/or of the bottom 1070 and/or in the area of the projection 1060, electrical insulation of a conductor layer structure—applied in the further course of manufacturing—from the underlying substrate material 1010 may also be achieved.

Such a deposition may be effected, for example, in the case of an oxide layer 1100 envisaged as an insulating layer, by thermal oxidation, by means of a chemically induced oxidation (e.g. TEOS=tetraethyl orthosilicate) or by directly depositing the respective oxidic material. Accordingly, also in the case of nitride layers, these may possibly be achieved by means of nitrating or depositing the respective material accordingly.

Figure 19E:
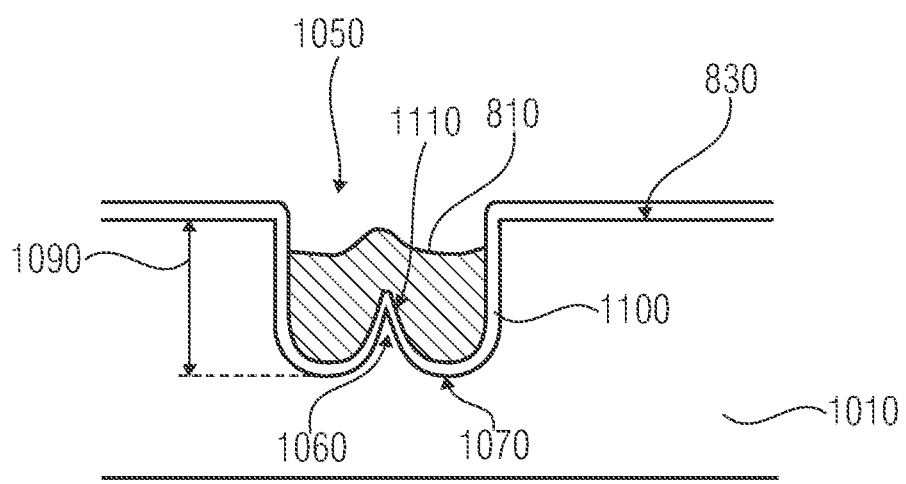

In the context of a step S150 (see FIG. 18) of depositing a conductor layer structure 810, a situation depicted in FIG. 19E is finally achieved. In the embodiment of an anchoring structure for a device 820, shown in FIG. 19E, the conductor layer structure 810 is a single metal layer or metal alloy layer. The metal layer 810 has been deposited, in the common trenches 1050, onto the insulating layer 1100, so that the projection 1060 of the common trench 1050 is transferred, as a structure-providing object, into the insulating layer 1100. The insulating layer 1100 in the bottom area 1070 of the common trench 1050 thus represents a structure-providing edge, so that finally an indentation 1110 is opposite the conductor layer structure or the metal layer 810. On account of a typical conforming deposition of the insulating layer 1100, such a structure will form in the bottom area of the trench, so that the conductor layer structure 810 may form, within the common trench 1050, the very indentation 1110 on account of the existence of the projection 1060.

In the context of the deposition of the conductor layer structure 810, as is also illustrated in connection with FIG. 19E, the conductor layer structure 810 is fully arranged within the recess 840 which has formed on account of the trench, or is fully arranged within the common trench 1050. In addition, the conductor layer structure fills the common trench 1050 at least 20% of the depth 1090 of the trench 1050, at least with regard to a distance from the bottom 1070. In the present case, the conductor layer structure 810, or in the present case the metal layer 810, fills even 50% or more or even 75% or more than the depth 1090 of the common trench 1050.

In addition, however, the conductor layer structure 810 may quite possibly fill the trench so completely that the conductor layer structure 810 extends above the main surface 830 of the device 820. Such an embodiment of the present invention is illustrated in more detail in FIGS. 20A and 20B, for example.

Figure 20A:
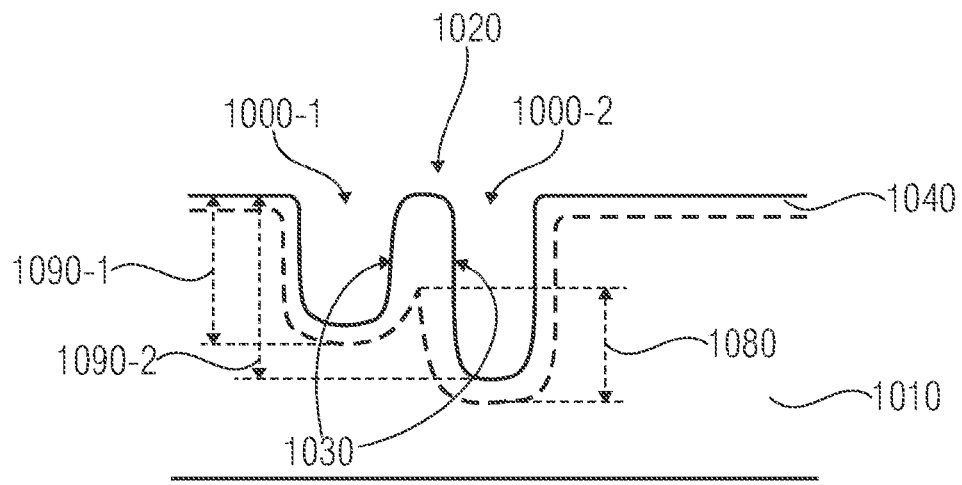
FIGS. 20A and 20B show cross-sections through a device in accordance with an embodiment of the present invention, in different phases of manufacturing.

FIG. 20A shows a further cross-section through a device 820 comprising an anchoring structure in accordance with an embodiment of the present invention. More specifically, FIG. 20A shows a device 820 comprising a first trench 1000-1 and a second trench 1000-2, which extend at a parallel distance from each other and form a mesa area 1020 between them. Thus, the representation of FIG. 20A approximately corresponds to the representation of FIG. 19A.

Unlike the device 820 of FIG. 19A, the first trench 1000-1 has a smaller depth 1090-1 as compared to the second trench 1000-2 having a depth 1090-2. In the context of the further process steps as are illustrated in FIG. 18, this gives rise to additional, lateral anchoring or intermeshing of the conductor layer structure 810 which is deposited in the further course.

If, in the context of the process step S120 of performing a substance conversion, the substrate material 1010 at the surface 1030 of the mesa area 1020 is converted chemically or in any other manner, the (oxide) layer 1040 indicated in FIG. 20A will form and will be removed in the context of the substance-specific removal of the converted substrate material, as a result of which the common trench 1050 will form. The different depths 1090-1, 1090-2 of the two trenches 1000-1 and 1000-2 thus result in a larger difference in height 1080 as compared to the embodiment shown in FIG. 19, said larger difference in height 1080 possibly enabling additional anchoring or intermeshing of the conductor layer structure 810 to be deposited.

Figure 20B:
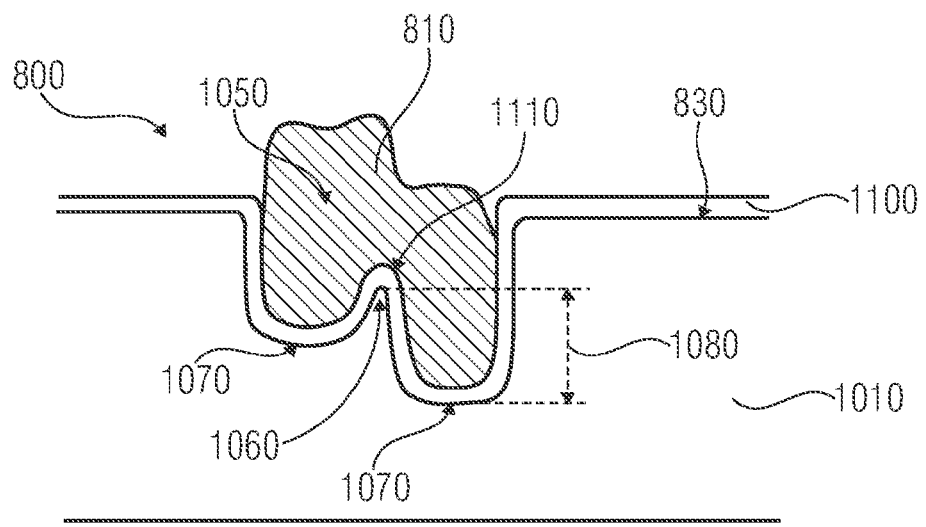

FIG. 20B shows an embodiment of an anchoring structure 800 in accordance with an embodiment of the present invention, as approximately corresponds to the representation in FIG. 19E. Here, too, the conductor layer structure 810, for example in the form of a single metal layer or metal structure, has been deposited onto an insulating layer 1100, which in turn lines the bottom, the side walls and the projection 1060 which has formed due to the substance-specific removal of the converted substrate material 1010.

Due to the fact that the optional insulating layer 1100 is deposited in a conforming manner, the corresponding projection 1060 will form, as a structure-providing edge, within it, so that an indentation 1110 of the conductor layer structure 810 again is opposite the projection 1060.

On account of this bottom anchoring or bottom intermeshing structure comprising the difference in height 1080, which is again depicted in FIG. 20B, anchoring or intermeshing of the conductor layer structure 810 with regard to impacts of lateral forces on the conductor layer structure 810 is achieved. As was already indicated above, the conductor layer structure 810 in this embodiment projects beyond the main surface 830 of the device 820, so that the conductor layer structure 810 entirely fills the common trench 1050, i.e. fills its entire width with regard to a cross-sectional area of the common trench 1050. The conductor layer structure thus extends, within the common trench 1050, not only in the area of a single trench 1000 which existed before. It extends at least over a projection 1060 which has formed.

Figure 21A:
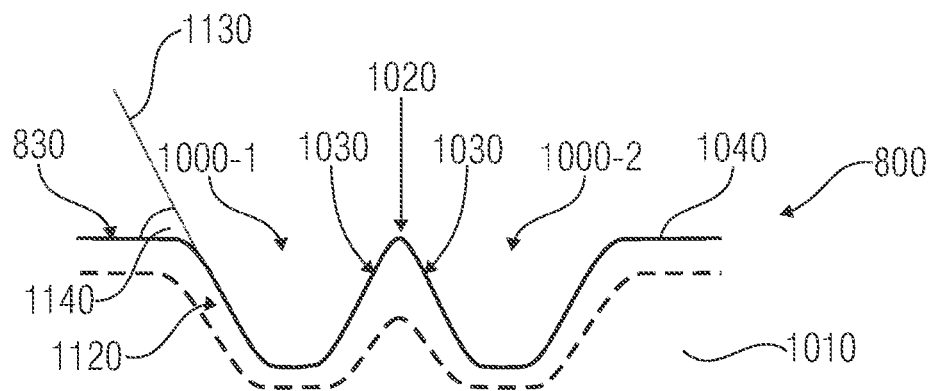
FIGS. 21A and 21B show cross-sections through a device in accordance with an embodiment of the present invention.

FIG. 21A shows a further cross-section through a device 820 comprising an anchoring structure 800 in accordance with an embodiment of the present invention. FIG. 21A is similar to the representation of FIGS. 20A and 19A, so that with regard to common features reference shall be made, in terms of a description, to these two embodiments. Unlike the embodiments previously described, however, the two trenches 1000-1 and 1000-2 comprise side walls 1120 having an angle in relation to the main surface 830 of the device 820, said angle clearly deviating from 90°. More specifically, an extension 1130 of the side wall 1120 of the first trench 1000-1 forms, with the main surface 830, an angle 1140 ranging from 20° to 75°. In some embodiments, the angle 1140 is in a range typically starting at between 20° and 30° and ending at between 45° and 60°.

In other words, the first trench 1000-1 comprises a slanting side wall 1120. Since not only the side wall 1120 forms a corresponding angle with the main surface 830, but since also the surface 1030 of the mesa area 1020 forms a comparative angle with the main surface 830, the first trench 1000-1 thus is an essentially V-shaped trench as may also be achieved, for example, by anisotropic etching of silicon using TMAH (tetramethylammonium hydroxide). However, other manufacturing processes may also be used for manufacturing corresponding V-shaped trenches 1000. These include, among others, the IBE and RIE methods already mentioned, a corresponding angle, which need not necessarily match the angle 1140, having to be maintained between the incoming ion beams and the main surface 830 of the device 820 during the etching process.

Since in many cases the two trenches 1000-1 and 1000-2 are prepared in a same manufacturing step, it is not only the first trench 1000-1, but also the second trench 1000-2 that comprises a corresponding slanting side wall 1120. Of course, the two trenches 1000-1 and 1000-2 may basically also be prepared, in different manufacturing steps or by other measures, such that the two trenches 1000-1, 1000-2 may possibly form different angles 1140 with the main surface 830 of the device 820.

The surface 1030 of the mesa 1020 comprises, just like the side wall 1120 of the corresponding trenches 1000, an angle with regard to the main surface 830 which clearly deviates from 90°. Consequently, the mesa area becomes wider as the depth into the substrate material 1010 increases, i.e. as the distance from the main surface 830 increases. The fact that the mesa area 1020 becomes wider as the depth from the main surface 830 increases results in a profile of the layer 1040 forming within the context of step S120, as is indicated in FIG. 21A. The fact that, in the context of performing the conversion of the substrate material 1010, said conversion is performed starting from the surface 1030 and continuing into the material up to a distance which is typical for the respective process plays quite an important part in this context.

Figure 21B:
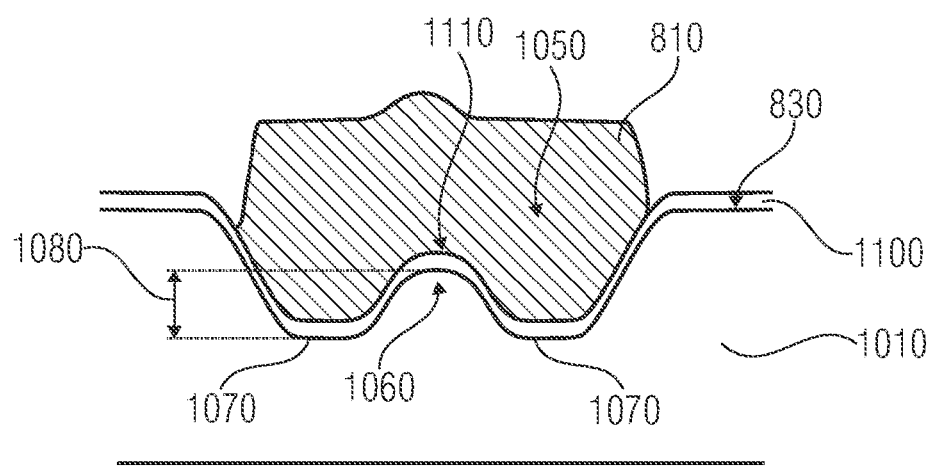

After the substance-specific removal of the converted substrate material 1040 at the surface 1030 of the mesa area 1020, after the optional deposition of the insulating layer 1100 and the deposition of the conductor layer structure 810, the cross-section, depicted in FIG. 21B, through the device 820 results. Due to the slanting surface 1030 of the mesa area 1020, there is thus the possibility of varying the projection 1060—more specifically, its difference in height 1080 and possibly its width and shape—by varying the respective angle, with process parameters otherwise kept constant, while performing the substance conversion (step S120) and the substance-specific removal (step S130).

Thus, there is the possibility, at the bottom 1070 of the common trench 1050, of specifying the projection or the projections with regard to their geometric configuration by varying the distance between the underlying trenches 1000-1, 1000-2, by adapting the angles of the surface 1030 and of the side walls 1120, and possibly by varying the depths 1090 of the respective trenches 1000. The geometry includes, among others, the difference in height 1080 which has already been defined, as well as the width of the projection 1060 at the bottom 1070 of the common trench 1050.

For completeness' sake, it shall be mentioned at this point that the conductor layer structure 810 as is depicted in FIG. 21B also entirely fills the common trench 1050 and extends beyond the surface, or main surface 830 of the device 820.

Even if, in the context of the embodiments discussed above, an insulating layer 1100 has basically been inserted between the conductor layer structure 810 and the substrate material 1010, this nevertheless is an optional layer which is created in the context of the optional process step S140 of depositing the insulating layer 1100. For example, if a direct electrical contact between the electrical layer structure 810 and the underlying substrate material 1010 is envisaged, this step S140 and the associated insulating layer 1100 may also be dispensed with. In addition, the insulating layer 1100 may naturally also take on shapes other than that shown in FIGS. 19 to 21. Also, one or several additional insulating, semiconducting, half-metallic or conducting layers and conductor layer structures may be arranged between the conductor layer structure 810 and the substrate material 1010. An example of this shall be given in the further course of the description.

Thus, the embodiments of anchoring structures 800 which are shown in FIGS. 19 to 21 have in common that the conductor layer structure 810 is lowered into a very wide trench structure of the common trench 1050 by means of several or many small narrow trenches 1000, so as to anchor the conductor layer structure 810 in this manner. The conductor layer structure 810 may also comprise, for example, only one single metal line, e.g. one gate runner. At the end of the manufacturing process, which is also referred to as a process flow, the many small narrow trenches 1000 are merged into a contiguous wide trench structure in the form of the common trench 1050.

Figure 22A:
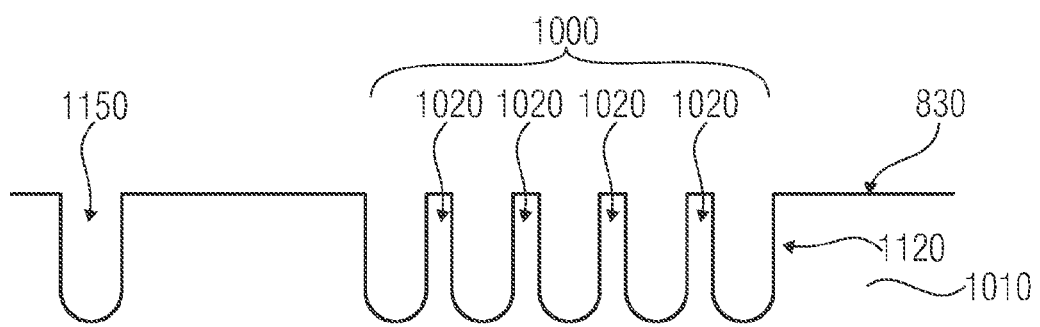
FIGS. 22A to 22C show cross-sections through an embodiment of the present invention, in different phases of manufacturing.
Figure 22B:
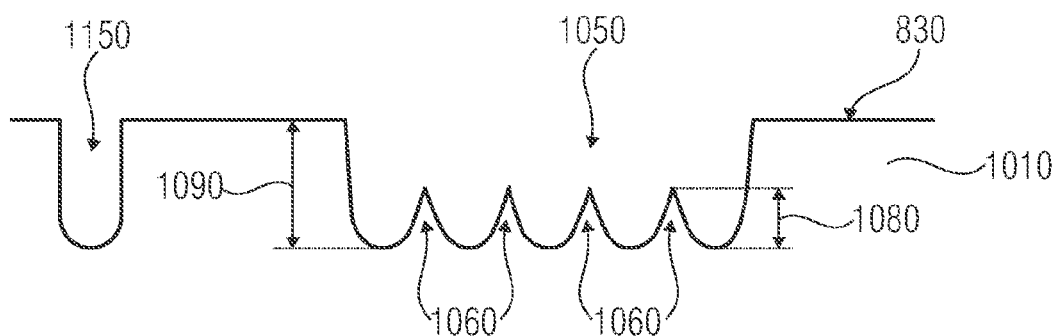
Figure 22C:
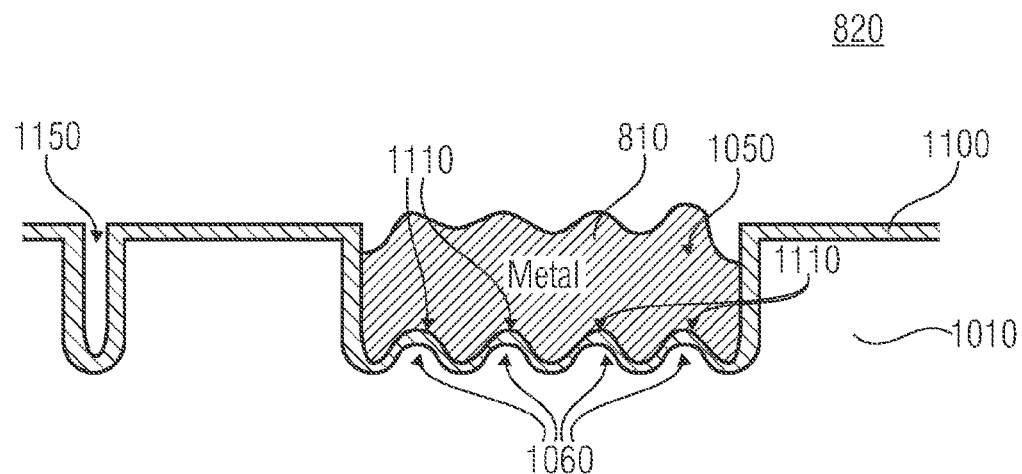
Figure 22D:
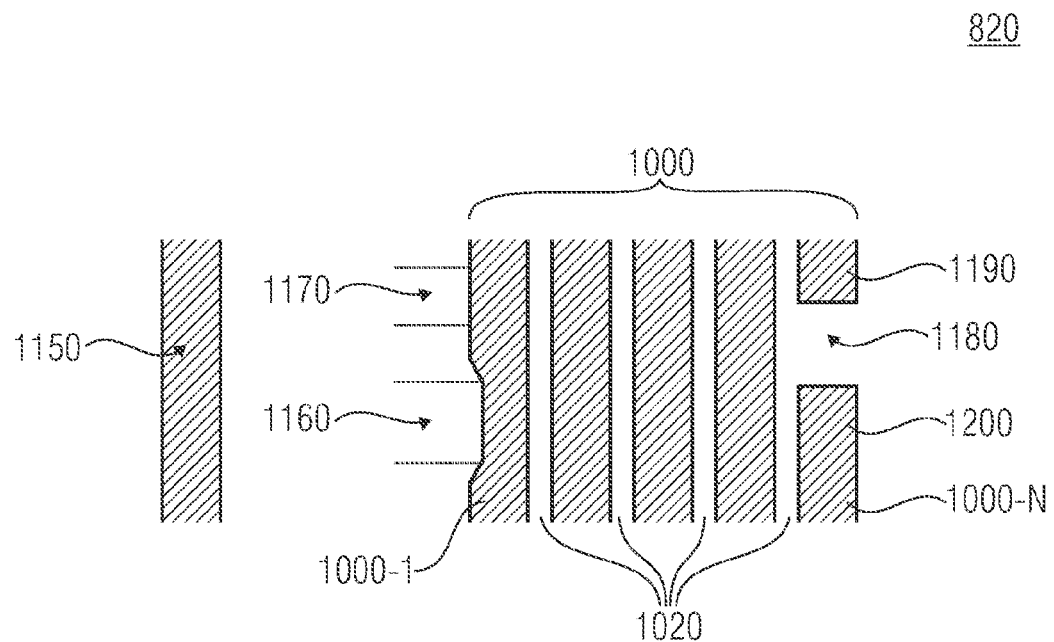
FIG. 22D schematically shows a top view of the layout of the device shown in FIG. 22A in accordance with an embodiment of the present invention.

FIGS. 22A to 22C show cross-sections through devices comprising further anchoring structures 800 in accordance with an embodiment of the present invention, whereas FIG. 22D shows a top view, associated with FIG. 22A, of a layout. The embodiment of an anchoring structure 800, shown in FIGS. 22A to 22D, in its different manufacturing phases here is an embodiment which is taken from the field of trench transistors.

FIG. 22A shows a device 820 comprising a main surface 830, into which a plurality of relatively narrow trenches 1000 are driven into the substrate material 1010 starting from the main surface 830. This plurality of trenches 1000 serves to form the wide trench structure in the form of the common trench 1050 with the bottom intermeshing structures in the form of a plurality of projections for conductor layer structures, i.e. metal lines. In addition to trenches 1000, FIG. 22A also shows a further trench 1150 which may belong, for example, to a cell field of the trench transistor 820. In the further course of the manufacturing process, the further trench 1150 may receive one or several electrodes, one of which, for example, is connectable to a gate potential or source potential.

The trenches 1000 shown in FIG. 22A may be manufactured, in the case of such a device 820, by exploiting the trench manufacturing process, which with trench transistors is present anyhow. The plurality of small trenches 1000, five of which are shown in FIG. 22, may be arranged, in the layout, closely spaced apart from one another, so that respective mesa areas 1020 will form between the individual trenches 1000. In the case of trench transistors or other devices 820 having a respective trench structure, the existing process flow may thus be used for creating a wide trench structure from several or many narrow trenches 1000.

The mutual distance of the individual trenches 1000 is selected as a function of the process parameters for the individual process steps of the manufacturing process such that the subsequent sacrificial oxidation will at least partly remove the thin mesa zones 1020 between the trenches 1000. Depending on the manufacturing technique used for preparing the trenches 1000 and the further trench 1150, trench etching methods may also be used, which result in deviating angles between the side walls 1120 of the trenches 1000 and the main surface 830 of the device 820. As was already described in connection with the embodiment shown in FIGS. 21A and 21B, the trenches 1000 may also be prepared with larger trench tapers, so that a mesa structure 1020 results which becomes wider in the downward direction.

FIG. 22B shows the same cross-section through the device 820 after the termination of the oxidation of the mesa areas 1020 (step S120 of FIG. 18) and of the substance-specific removal (step S130 of FIG. 18) in the form of etching the resulting oxide layer. Thus, at least one oxidation process, which, for example, was performed thermally, was conducted between the representation of the device 820 of FIG. 22A and that of FIG. 22B, said oxidation process at least partly oxidizing the mesa zones 1020 between the trenches 1000. Thereafter, oxide etching has been performed, so that the oxides zones comprising the converted substrate material, i.e. eventually the oxidized mesa zones, are removed. In this manner, the narrow trenches 1000 are merged into the common trench 1050, at the bottom area of which a projection 1060 now has formed in a pre-existing mesa zone 1020, respectively. In other words, in the embodiment of an anchoring structure 800, which is shown in FIGS. 22A and 22B, a projection 1060 forms in the mesa area 1020 of two trenches 1000, respectively.

The cross-section of the device 820 shown in FIG. 22C differs from the cross-section shown in FIG. 22B in that a deposition of an oxide or a further oxidation was initially performed, in the context of step S140 (see FIG. 18), for providing at least one electrical insulating layer 1100. The insulating layer 1100 here provides electrical insulation between the metal line introduced thereafter as an example of a conductor layer structure 810 and the semiconductor environment 110 which frequently is based on silicon.

Thereafter, the device 820 may be completed, for example, on the basis of a standard manufacturing process. This may be effected, for example, in that the metal line 810 is deposited and structured into the wide trench structure of the common trench 1050. Depending on the specific implementation of the device 820, the metal line 810 is deposited and structured in the same process step as the power-feeding metals lines of the device 820. If the device 820 is a power MOFSET (MOSFET=metal oxide field effect transistor), for example, the metal line 810 may be a metal structure which is also manufactured in the context of so-called power metal deposition and structuring. These steps are also referred to, by way of summarizing, as metallization. In the case of such a power MOSFET as the device 820, the insulating layer 1100 is also referred to as a field oxide (FOX), which may be prepared in the context of a round oxidation.

Finally, FIG. 22D shows a top view of the layout of the device 820 shown in FIG. 22A, wherein, in addition to the further trench 1050, the five trenches 1000 extending in parallel, which are used for forming the common trench 1050 in the context of the above-discussed manufacturing process, are also depicted. Between two adjacent trenches 1000, respectively, a mesa area 1020 is arranged, as is apparent from the above.

However, in the top view of FIG. 22D, the plurality of trenches 1000 have a particularity with respect to the two rim trenches 1000-1 and 1000-N of the plurality of trenches 1000. For example, the first trench 1000-1 has a variation of the trench width. Specifically, the first trench 1000-1 comprises a portion 1160 having a width which deviates from a further portion 1170. On account of the substance conversion and the substance-specific removal of the converted substrate material (steps S120 and S130), this variation in the width of the rim trench 1000-1 thus is transferred to the respective side wall of the common trench 1050. In this manner, the common trench 1050, in turn, obtains a deviation of the trench width in the area of the trench portion 1160, which in the case of a regular or irregular repetition of such a constriction leads to a wavy rim of the common trench 1050. In this manner, the conductor layer structure 810, i.e., for example, the metal structure, as is shown in FIG. 22C, may also be intermeshed with regard to forces along the direction of extension of the common trench 1050.

In addition, FIG. 22D shows a further possibility of realizing corresponding intermeshing of the conductor layer structure 810 in the context of such a wide common trench 1050. For example, the other rim trench 1000-N comprises an interruption 1180, which also leads to a variation in the width of the common trench 1050 after performing the substance conversion and the substance-specific removal (steps S120 and S130). In other words, the trench 1000-N, which is the other rim trench of the plurality of trenches 1000, comprises at least a first portion 1190 and a second portion 1200, which are spaced apart by the interruption 1180. The first portion 1190 and the second portion 1200 of the rim trench 1000-N here extend in an area around the interruption 1180 on a common straight line.

The wide trench structure as the common trench 1050 may thus be based on several small trenches 1000, which may have regular trench widths and trench distances. The trench distances here approximately correspond to the width of the respective mesa areas 1020. However, highly irregular trench widths and trench distances are also possible. As was already shown in connection with FIG. 21, different trench side angles and, as was depicted in connection with FIG. 20, different trench depths are also possible. All of these should have in common that the respective mesa areas 1020 in the wide trench structure of the future common trench 1050, into which trench structure the conductor layer structure is to be embedded later on, is at least partly converted in the context of a substance conversion. This may be effected, for example, by partial oxidization the substrate material, i.e., for example, of silicon to silicon oxide or silicon dioxide. This should be conducted, in particular, in the area toward the main surface 830 or the silicon surface. In the above-described embodiments, in particular the mesa areas 1020 between the individual trenches are substance-converted such that in the substance-specific removal, the converted substrate material is removed to such an extent that the projection 1060 comprises a difference in height 1080 which is smaller than a depth 1090 of the common trench 1050. In other words, the common trench is not interrupted by mesas, which do not extend as far as the main surface.

By using a method of creating an anchoring structure 800 in accordance with an embodiment of the present invention, bottom intermeshing structures in the form of the projection 1060 may form. Depending on the specific processing, in the case of a conforming deposition of the conductor layer structures, a respective bottom intermeshing structure may be formed, for example, at the top face of the conductor layer structure 810 deposited, since the projections 1060 of the common trench 1050 may possibly also be reflected, at the surface of the conductor layer structure, in the form of a rough (metal) surface. Such an application may be useful, for example, in the field of bond pads or other, relatively large pad surface areas for achieving possibly additional anchoring or intermeshing.

For example, by means of oxidizing trenches into one trench in order to contact or merge respective trenches 1000, an anchoring structure for metal zones or other conductor layer structures may be realized especially by means of small trenches. The respective conductor layer structure, the respective metal zone, or the respective metal line may then be lowered into such a wide trench.

The common trench 1050 which forms is based, as was also illustrated by the previous embodiments, at least on two trenches 1000 comprising an intermediate mesa area 1020. In many embodiments of the present invention, the wide trench 1050 is based on more than two trenches 1000, however. Therefore, the wide trench 1050 typically at least has a width which is larger than double a trench width of a further trench 1150 as occurs, for example, in a cell field of a trench transistor. In further embodiments of the present invention, wherein the common trenches 1050 are based on more than two trenches 1000, the common trench 1050 frequently comprises a width corresponding to at least triple, five times or a higher multiple of the width of a further trench 1150.

Especially in the field of transistors, in addition to the above-described reliability risks, further goals become apparent with regard to optimizing the design, said goals being related to the performance of the respective devices. For example, appropriate goals include realizing as low losses as possible in switched-through transistors, i.e. in the conducting case, and in respective switching operations. To this end, the on resistance Ron·A, Ron being a specific on resistance an A being a surface area of the respective transistor, as well as the figure of merit (FOM) Ron·Qgate should be minimized as far as possible, Qgate representing the gate charge of a respective field effect transistor. The gate charge Qgate is influenced, among other things, by a proportion of the capacitance value of the gate terminal of the respective transistor with regard to the drain terminal.

Embodiments of the present invention as are described in the context of FIGS. 23 to 26, thus enable avoiding or minimizing the risks with regard to TC loads as occur, for example, in a chip rim area, where the gate runner for electrically contacting the gate electrodes of the actual transistor cells is frequently accommodated. At the same time, embodiments of the present invention may enable optimizing or improving the above-mentioned figure of merit in that an appropriate shielding structure is provided. A potential method of manufacturing such a structure is also described in connection with FIGS. 25 and 26.

Embodiments of the present invention in this context are based on the fact that improvements in terms of the TC behavior of metal zones are implemented by lowering the respective conductor layer structures, metal structures, or metal lines deeper down, with at least one shielding structure for improving the behavior. For example, in addition to the above-described embodiments of the present invention, this provides the possibility of reducing or minimizing a proportion of the capacitance value of a transistor, namely the gate/drain capacitance of the respective transistor.

In addition, the method which was already mentioned above shall be discussed in more detail in connection with FIGS. 25 and 26, said method enabling the formation of deep and wide trenches independently of a cell field trench etching process. In the case of field-effect transistors, this may be of interest, for example, for low voltage classes ranging from 20-60 V, since in such a case the cell field trenches and the anchoring trenches may be optimized independently of one another. For example, it may be desirable, depending on the application, to design the cell field trenches specifically for small capacitance components and to therefore design these to be geometrically small and flat. By contrast, it may be desirable, depending on the application, to design the respective anchoring trenches to be particularly wide and deep to be able to receive the gate-runner metal structures, for example. If, in addition, the above-mentioned shielding structures, which may be polysilicon structures, for example, are also lowered down into the respective deep trenches along with oxides or other insulating layers which may possibly be used, trench depths of at least 5 µm-10 µm are desirable for this purpose in some applications. By contrast, trench depths of only 1 µm-2 µm may be implemented, for example, for the cell field trenches if what is dealt with are field-effect transistors for the so-called 25 V voltage class, for example. The method concerned shall be explained in more detail in connection with FIGS. 25 and 26.

A method of fabricating an intermeshing structure 800 for a conductor layer structure 810 in accordance with an embodiment of the present invention thus comprises producing a first trench 1000-1 and a second trench 1000-2 at a surface 830 of a substrate material 1010, the first trench and the second trench being arranged in parallel and spaced apart from each another, so that a mesa area 1020 of the substrate material 1010 remains between them. The method further includes performing a substance conversion of the substrate material at the surface of the mesa area 1020, substance-specific removal of the converted substrate material at the surface 1030 of the mesa area 1020, so that the first trench 1000-1 and the second trench 1000-2 are merged into a common trench 1050 comprising a projection 1060 at a trench bottom 1070 of same within the mesa area 1020, and depositing the conductor layer structure 810 so that the conductor layer structure 810 at least partly extends within the common trench 1050 and forms an indentation 1110 at an area facing the projection 1060.

In other embodiments, the above-described method may comprise producing a plurality of trenches, an outer trench comprising a first portion having a width which deviates from a second portion of the trench, so that the common trench in the first area comprises a width deviating from the second area. In further embodiments, the first and second trenches may be produced, in the method, with different depths, namely first and second depths with regard to the main surface. The common trench may be produced such that the difference in height of the projection does not exceed 90% of the depth of the common trench, i.e. is smaller than 90% of the depth. In other embodiments, this ratio may be limited to less than 75% or less than 50%.

Figure 23A:
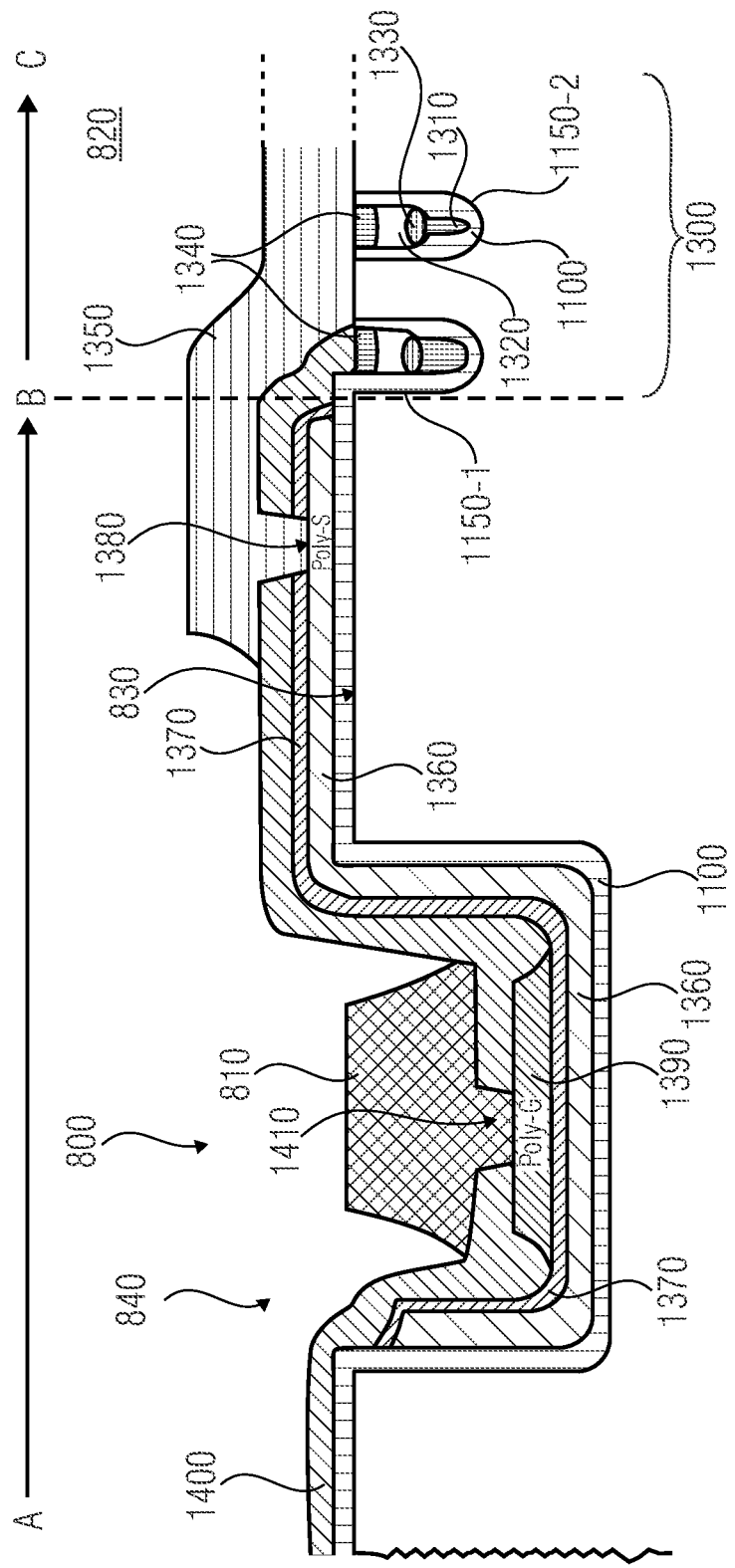
FIG. 23A shows a cross-section through a device comprising an anchoring structure in accordance with an embodiment of the present invention.

FIG. 23A shows a cross-section through a device 820 comprising an anchoring structure 800 in accordance with an embodiment of the present invention along a sectional direction A-B-C, which is also rendered in FIG. 23B, which again shows a top view of the device 820. The device 820 is a vertical trench field-effect transistor comprising a cell field 1300 having a plurality of trenches 1150-1, 1150-2, . . . , each of which comprises a lower electrode 1310 and an upper electrode 1320.

As the names indicate already, the two electrodes are arranged, within the respective trenches, to be vertically offset from each other, and are electrically separated from each other by an insulating layer 1330. In addition, the trenches 1150 are lined with an insulating layer 1100 in order to prevent, among other things, unintentional electrical contact of the two electrodes 1310, 1320 with the substrate material 1010 underlying the respective trenches 1150. Within the trenches 1150, the insulating layer, which frequently is also referred to as field oxide (FOX), may comprise a varying thickness, as is also indicated in FIG. 23A.

The upper electrode 1320, in turn, is electrically insulated from the overlying layers and structures by an insulating layer 1340. Thus, the two electrodes 1310, 1320 within the further trenches 1150 in the cell field 1300 are laterally electrically insulated from their respective environments by the insulating layer 1100, and in the vertical direction by the insulating layers 1330 and 1340.

The upper electrode 1320 represents the actual gate electrode of the vertical transistor and as such is also connected to a gate terminal of the device 820. Even though the lower electrode 1310 is also arranged within the trenches 1150, it nevertheless does not serve to control the channel of the field-effect transistor during operation, but is rather used for influencing the field. The lower electrode 1310 is therefore coupled to the terminal for the source potential of the device 820. The respective terminals for the upper and lower electrodes 1320, 1310 are realized outside the sectional plane A-B-C represented in FIG. 23A.

The lower electrode 1310 of the trenches 1150 as well as the source terminals which are arranged between the trenches 1150, respectively, but not drawn in FIG. 23A, are indirectly or directly connected to a source metallization 1350. The source metallization 1350 also serves as a bond pad, i.e. as a terminal pad of the device 820 for external circuits for respective contact wires, which may be connected to the terminal pad 1350 by means of bonding processes, for example. As is illustrated by the top view in FIG. 23B, said source metallization 1350 is arranged, over a large area, in a center of the device 820, it being worth noting that FIG. 23B shows a section of a corner of a chip of the device 820.

The further structures of the device 820 will be explained below along with FIGS. 23A and 23B so as to be able to further illustrate, using the schematic top view of FIG. 23B, the layered architecture of the device 820 in connection with FIG. 23A, on the one hand, and the lateral arrangement of the respective structures and their interaction, on the other hand. As was already briefly mentioned above, FIG. 23B shows a section of a corner of a chip on which the device 820 is realized. In addition, FIG. 23B is a schematically simplified representation, wherein individual structural features are not rendered for clarity's sake. These include, for example, the inner structure of the trenches 1150. Also, FIG. 23B does not depict all of the elements which are arranged periodically or otherwise, and come up several times. FIG. 23B shows only the first three trenches 1150-1, 1150-2, 1150-3 of the cell field 1300. The further continuation of the trenches 1150 is indicated by respective dots next to the third trench 1150-3.

The two electrodes 1310, 1320 are indirectly or directly coupled to the respective terminals of the device 820 by means of respective terminal structures. For the lower electrode 1310 of the trenches 1150, FIGS. 23A and 23B show a respective terminal structure 1360, which in the device 820 is made of polysilicon (poly-Si). Since the terminal structure 1360 serves to contact the lower electrode 1310, to which source potential is applied during the operation of the device 820, it is also referred to as "poly-S".

The terminal structure 1360 extends along the cross-section, shown in FIG. 23A, in the area between the points A and B, from the interior of a recess 840, along its side walls, and on the insulating layer 1100 on a main surface 830 of the device 820. FIG. 23B also shows that the terminal structure 1360 (poly-S) extends, starting from the recess 840, into the cell field 1300 below the area of the source metallization 1350. Here, the terminal structure 1360 is electrically insulated from the underlying substrate material by the insulating layer 1100, this insulating layer 1100 also being referred to as a field oxide (FOX) in the case of an oxide layer.

The terminal structure 1360 is electrically insulated from overlying structures by a further insulating layer 1370, which fully covers the terminal structure 1360, apart from openings and other contact holes. This further insulating layer 1370 is also frequently implemented as an oxide and therefore is given the designation "Polox", as an abbreviation for poly-oxide, which is borrowed from the designation of poly-S of the terminal structure 1360.

In order to allow electrical contacting of the terminal structure 1360 (poly-S) with the associated source metallization 1350, the further insulating layer 1370 comprises a contact hole 1380 which may possibly optionally also be filled with a doped, highly doped or undoped semiconducting material (e.g. poly-Si) or an additional metal structure.

As is also shown in FIG. 23B, the device 820 comprises, in its outer area, a conductor layer structure 810 which, in the specific embodiment shown in FIGS. 23A and B, is a metal line connected to a terminal of the device 820 for a gate potential. Therefore, the metal line 810 is also referred to as a so-called gate runner. In order to ensure the functionality of the device 820, said gate runner is frequently implemented in the context of so-called power metallization, wherein the respective metal structures are implemented to be clearly wider and thicker as compared to other conductive structures. The gate runner 810 thus is precisely such a metal structure which may possibly be subject to the above-described TC loads. For this reason, the gate runner 810—as an embodiment of a conductor layer structure 810—is at least partly arranged within the recess 840 formed on the basis of the respective trench. The recess 840 here is implemented on the basis of a trench designed to be appropriately wide, as is also shown in the top view of FIG. 23B.

The gate runner 810 is separated by an insulating layer 1400 from a further terminal structure 1390, which is arranged below the gate runner 810, apart from the areas of contact holes and other openings. The further terminal structure 1390 here serves, among other things, for indirect or direct contacting of the upper electrodes 1320 of the trenches 1150 in the cell field 1300. Said further terminal structure 1390 is also frequently made of polysilicon, as is the terminal structure 1360, so that it is also referred to as "poly-G", since it carries the gate potential. In order to allow, specifically, such an electrical contact between the gate runner 810 and the further terminal structure 1390, the insulating layer 1400, which is also frequently configured as an oxide, comprises a contact hole 1410, which in the present case is filled with the material of the gate runner 810. Thus, it is by means of the very contact hole 1410 that there is a connection between the gate runner 810 and the further terminal structure 1390. In the event of an implementation as an oxide layer, the insulating layer 1400 frequently is also referred to as intermediate oxide (INT OX).

It shall be noted in this context that, in order to simplify the representation, FIG. 23B neither depicts the further terminal structure (poly-G) 1390, nor the insulating layer 1400, nor the contact hole 1410. Since, as is also shown in FIG. 23A, the insulating layer 1400 also extends, in the area of the overlapping area, between the source metallization 1350 and the terminal structure 1360, the contact hole 1380 also comprises a respective opening in the insulating layer 1400 so as to enable the electrical contact between the source metallization 1350 and the further terminal structure 1360.

The embodiment of an anchoring structure 800 which is depicted in FIGS. 23A and 23B thus not only comprises, within the recess 840 (anchoring trench), the gate runner as a conductor layer structure 810, but also the poly-S 1360, the poly-G 1390, and the intermediate poly-oxide 1370. While the gate runner 810 is directly in electrical contact with the further terminal structure 1390 by means of the contact hole 1410, the underlying poly-S 1360, however, is electrically insulated both from the gate runner 810 and from the poly-G 1390, and is electrically connected to the source metallization 1350. Since, unlike the poly-G structure 1390, the poly-S structure 1360 additionally extends entirely below the gate runner 810 (conductor layer structure 810), and optionally along the side walls of the recess 840, said poly-S structure 1360 electrically shields the gate runner 810 and the underlying poly-G 1390 from a drain terminal of the device 820 on a rear side, facing away from the main surface 830, of the respective substrate.

In other words, the embodiment of an anchoring structure 800 which is depicted in FIGS. 23A and 23B provides the possibility of forming a metal line, or a metal zone 810, which is placed deeper down and comprises a shielding layer for improving the switching properties of the respective device 820. A corresponding method will be described in more detail with reference to FIGS. 25 and 26A to 26K.

FIGS. 23A and 23B show a cross-sectional image and a potential layout view of the shielding structure in the gate-runner area which is placed deeper down and wherein the terminals are realized by means of a planar poly-S layer 1360 which is drawn out from the deep gate-runner trench 840. The poly-S 1360 represented here serves to shield off the poly-G 1390 and the gate-runner metal 810 from the drain terminal arranged on the rear side of the device 820. The poly-S 1360 fully lines the side walls of the deep wide trench 840 as well as the bottom of the trench 840, and is drawn out from the trench on one side for contacting purposes.

However, the poly-S 1360 may also extend and be connected only in the deep trench 840 for direct shielding. In such a case, there is the possibility, for example, of contacting same directly via the trenches 1150 of the cell field 1300, which for their part lead into the deep trench 840, as is schematically shown in FIG. 24.

Figure 24:
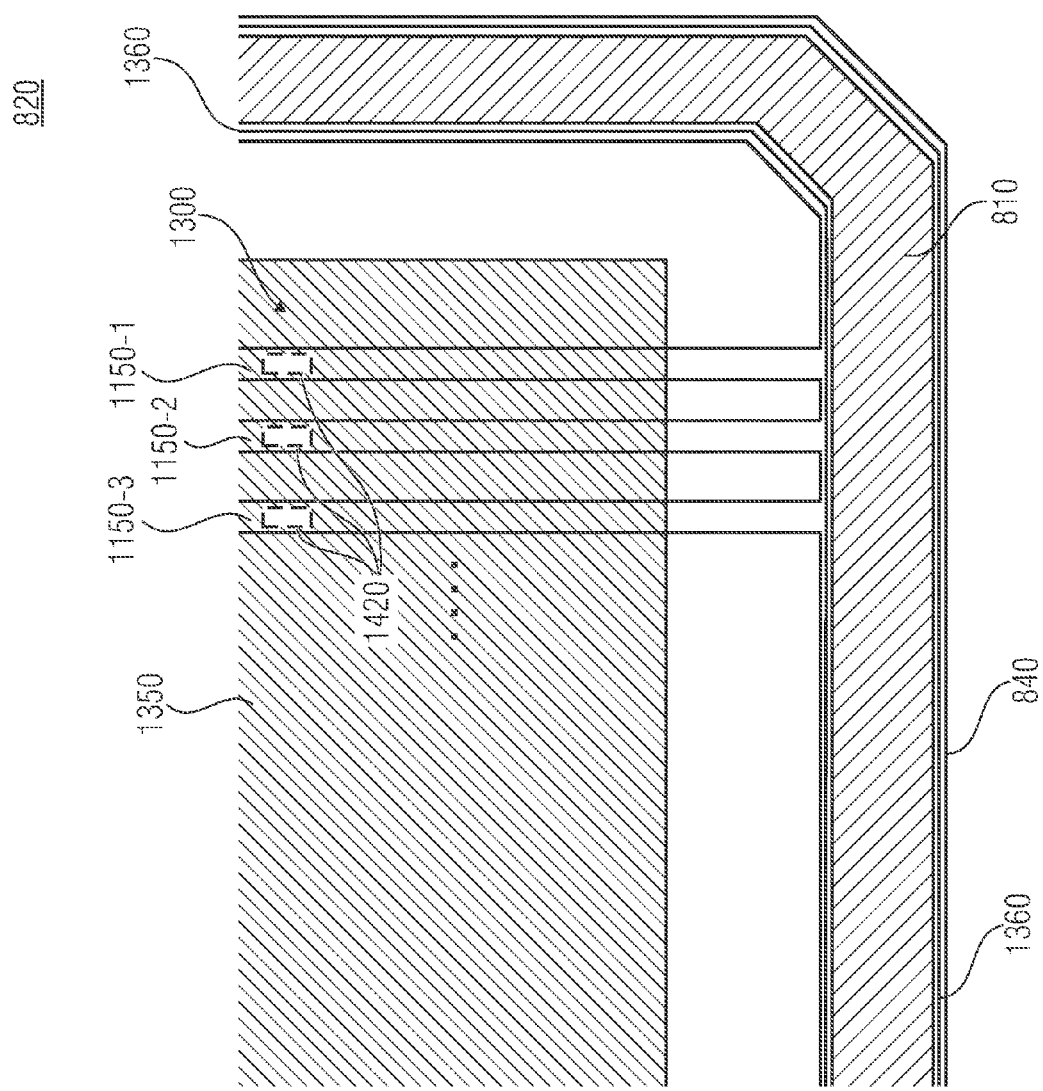
FIG. 24 shows a top view of a further device in accordance with an embodiment of the present invention.

FIG. 24 is a top view of such a further device 820 in the form of a vertical field-effect transistor having an anchoring structure 800 or a gate runner 810 in accordance with an embodiment of the present invention. The embodiment depicted in FIG. 24 differs only slightly from the embodiment shown in FIGS. 23A and 23B in terms of the layer structure. It also differs only slightly with regard to the layout of FIG. 23B, which is why the differences between the two embodiments shall be emphasized in the following. The terminal structure 1360, which again shall be referred to as poly-S, extends only within the trench 840. Electrical contacting of the poly-S, i.e. its terminals, is realized by means of cell field trenches 1150 which lead into the common trench 840.

The three cell field trenches 1150 shown in FIG. 24 thus extend as far as the trench 840, so that the lower electrodes 1310 arranged within the trenches 1150 are directly contacted with the poly-S 1360, implemented in a planar manner, within the trench 840. Electrical supply of the potentials from the source metallization 1350 to the poly-S 1360 in the device shown in FIG. 24 is effected, unlike the device 820 shown in FIGS. 23A and 23B, by means of respective contact holes 1420, directly in the area of the actual trenches 1150 of the cell field 1300. The terminals of the poly-S 1360 thus are effected directly via the contact holes 1420 to the source metal 1350 in the cell field 1300 in the context of a finger-type terminal by means of individual "source fingers".

A method of manufacturing gate runners which are placed deeper down and comprise a shield and an anchoring will be described in connection with FIGS. 25 and 26A to 26K below. However, prior to describing the actual process flow using different intermediate steps of the resulting structure in connection with FIGS. 26A to 26K, a top view of an anchoring structure 800 in accordance with an embodiment of the present invention shall be initially described in connection with FIG. 25.

The top view shown in FIG. 25 to some extent resembles that shown in FIG. 24. Here, too, a gate runner or a conductor layer structure 810 is arranged within a trench 840, for example. The poly-S structure 1360 is again represented below the gate runner 810 as a further conductor layer structure for shielding off the gate runner 810. A plurality of further structures and layers which shall be explained below are not shown in FIG. 25. A feed trench 1430 leads into the trench 840 in a perpendicular manner, said feed trench 1430 in turn leading into a trench 1150 of the cell field 1300. The feed trench 1430 has a polysilicon structure 1440 arranged therein which is electrically in contact with the poly-S structure 1360 within the recess 840 (anchoring trench). The interior of the anchoring trench 840, or of the recess 840, is sometimes also referred to as a low zone. The polysilicon structure 1440 additionally leads into the lower electrode 1310 of the trench 1150 of the cell field 1300.

With regard to the poly-G zones 1390, which shall re-occur in the further course, as well as to the associated upper electrodes 1320 of the trenches 1150 of the cell field 300, it shall be noted at this point that, in terms of quality, basically the same applies to these as applies to the respective poly-S structure 1360 with regard to the terminal. Here, too, connecting the cell field trenches 1150 in connection with drawing out the respective poly-G structure in a planar manner is also possible, as is shown in FIGS. 23A and 23B for the poly-S 1360. In addition, it is also possible to connect these by means of trenches which directly lead into same, as is shown in FIGS. 24 and 25.

The process flow of the manufacturing method shall be described below in connection with FIGS. 26A to 26J, along a sectional plane which is represented by an arrow A in FIG. 25. The cross-section along the cross-sectional area B of FIG. 25, which results during the same process flow, shall then be described in connection with FIG. 26K.

Figure 26A:
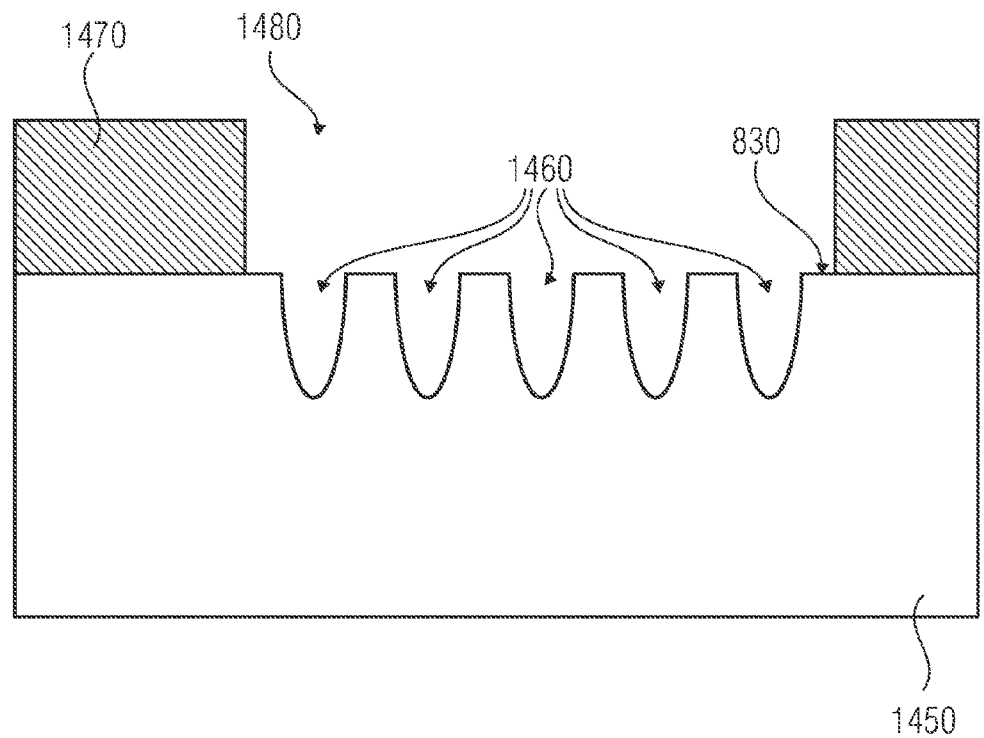
FIGS. 26A-26K show cross-sections through the device depicted in FIG. 25 in accordance with an embodiment of the present invention, in several phases of manufacturing for two different sections.

FIG. 26A shows a cross-section in the area of the gate runner resulting at a later point, as may be present after two optional process steps. Initially, one or several trenches 1460 with regard to a main surface 830 of the substrate material 1450 are etched into a substrate material 1450. The trenches 1460 may be etched, during trench etching, in the zone of the trench 840, which will form later on and is placed deeper down, for the gate runner 810. The trenches 1460 thus all in all serve to provide a possibility of creating a deeper structure. They are therefore sometimes also referred to as dummy trenches. The trenches 1460 here may be co-fabricated, for example, in the context of the manufacturing method for the trenches 1150 of the cell field 1300. They are frequently fabricated by means of an anisotropic etching process, for example by means of ion beam or reactive ion beam etching. Thereafter, or possibly prior to this, a resist 1470 is applied, exposed and developed. This results in an opening 1480 in the area of the trenches 1460. Of course, the trenches 1460 thus introduced may be used as trenches 1000 for bottom intermeshing structures as were described in connection with FIGS. 18 to 22.

Figure 26B:
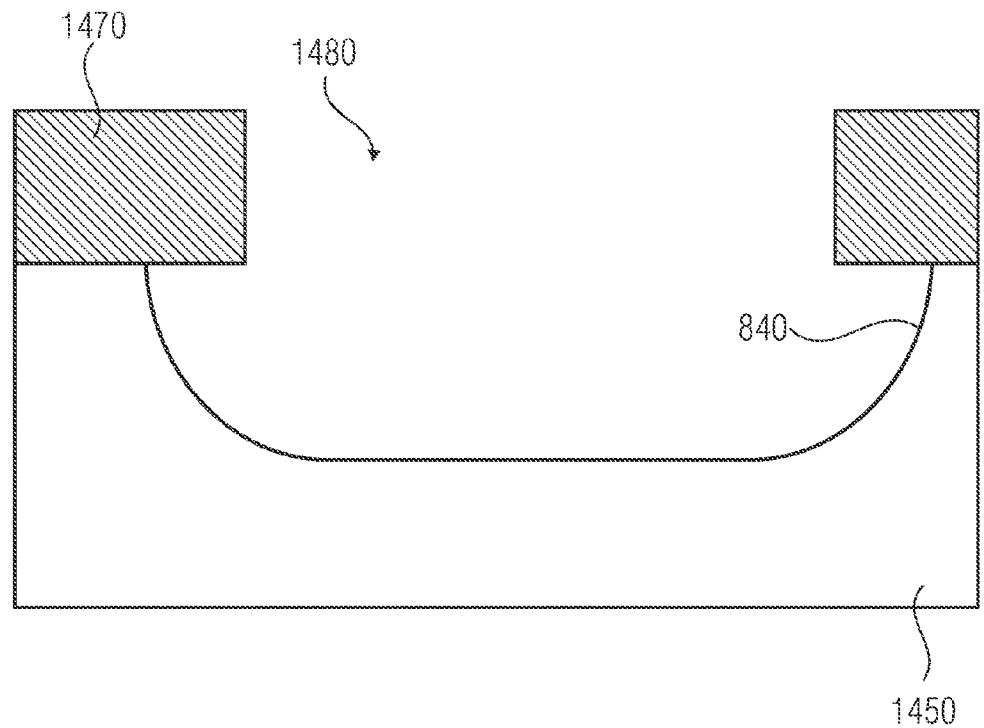

FIG. 26B shows a state after exposing a resist plane, or the resist 1470 arranged therein, in which state the respective area within the resist 1470 is opened, and wherein the substrate material 1450 is removed, by means of an etching process which tends to be isotropic in nature, in the area of the trenches 1460 of FIG. 26A. Thus, a recess 840 results, in the substrate material 1450, on the basis of corresponding trenches, or of the trenches 840 themselves.

Figure 26C:
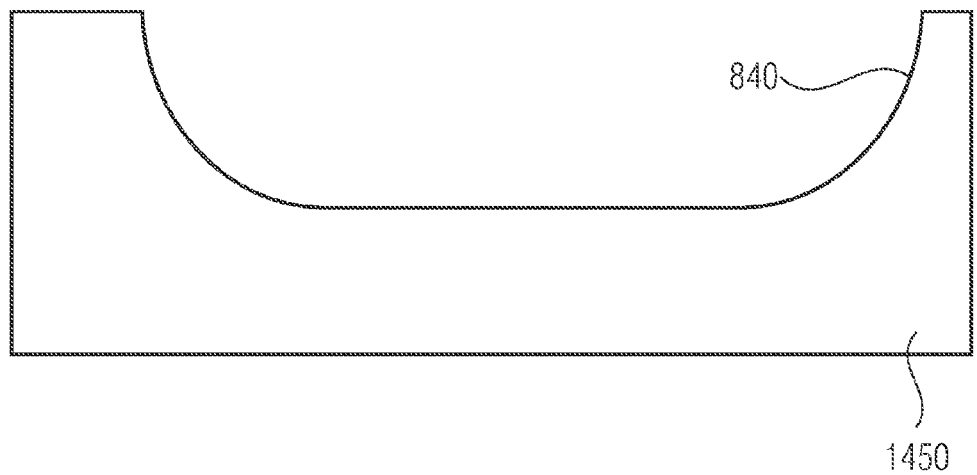
Figure 26D:
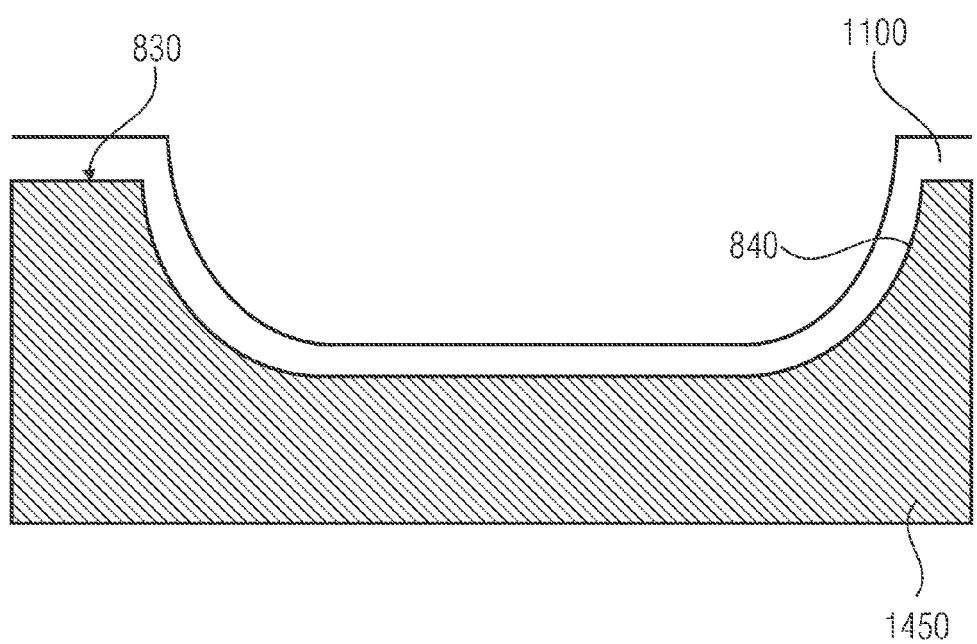

FIG. 26C shows the substrate material 1450 along with the resulting recess 840 after removal of the resist from the resist plane. By oxidizing the substrate material 1450, the insulating layer 1100 is created in the form of a field oxide on the main surface 830 and on the side walls and in the bottom area of the recess 840, as is shown in FIG. 26D. Thus, FIG. 26D shows the device after the field oxide 1100 has been oxidized.

Figure 26E:
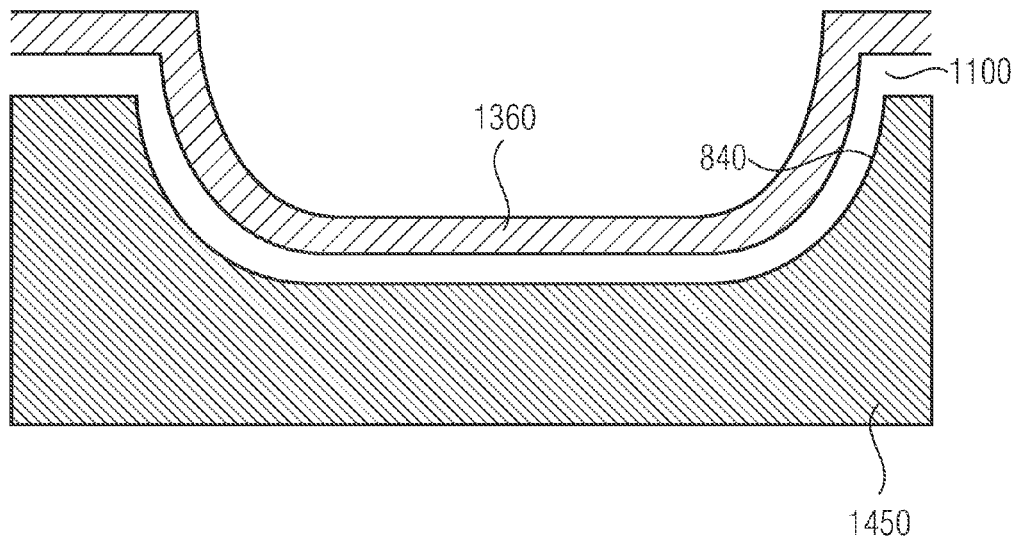
Figure 26F:
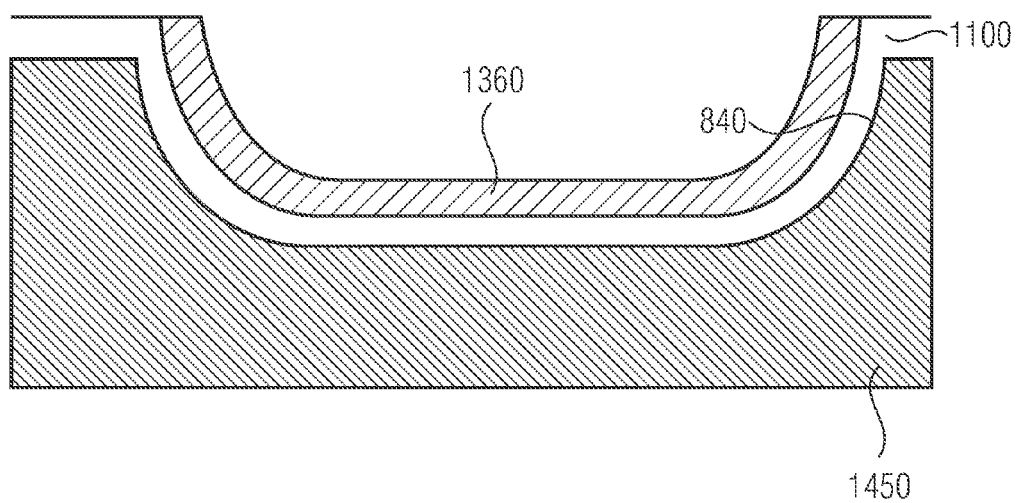

Thereafter, polysilicon is deposited onto the insulating layer 1100, said polysilicon forming, inside the trench 840, the terminal structure 1360 or the poly-S 1360, as is shown in FIG. 26E. FIG. 26F shows the device in a state after excessive material of the polysilicon layer, which forms the poly-S 1360 inside the trench 840, has been removed by means of chemical-mechanical polishing (CMP). Thus, after the CMP process step, the polysilicon 1360 remains only within the zone of the trench 840. Of course, different geometries may be taken into account and implemented.

Figure 26G:
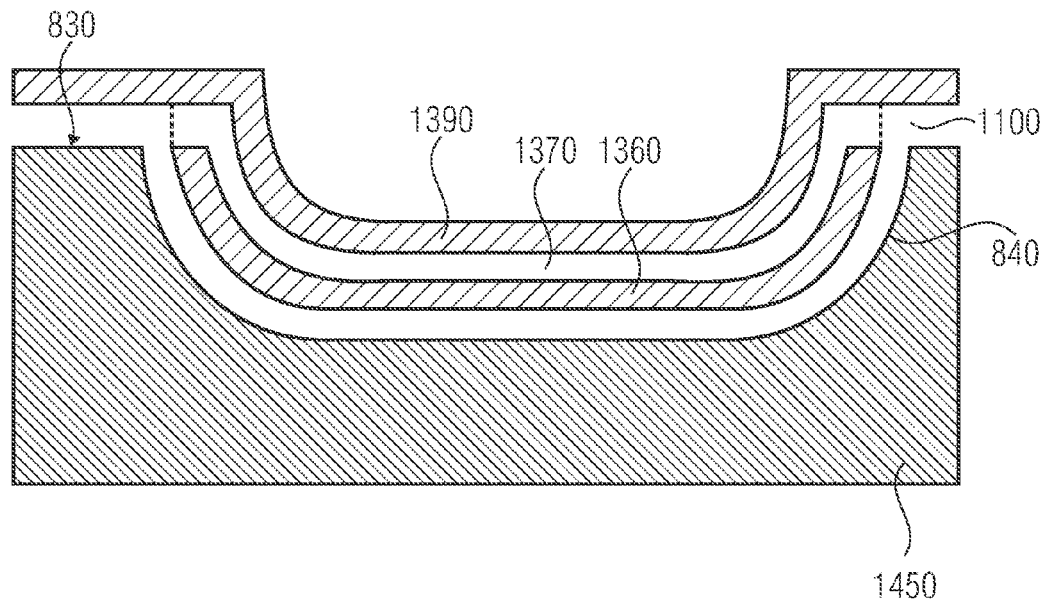
Figure 26H:
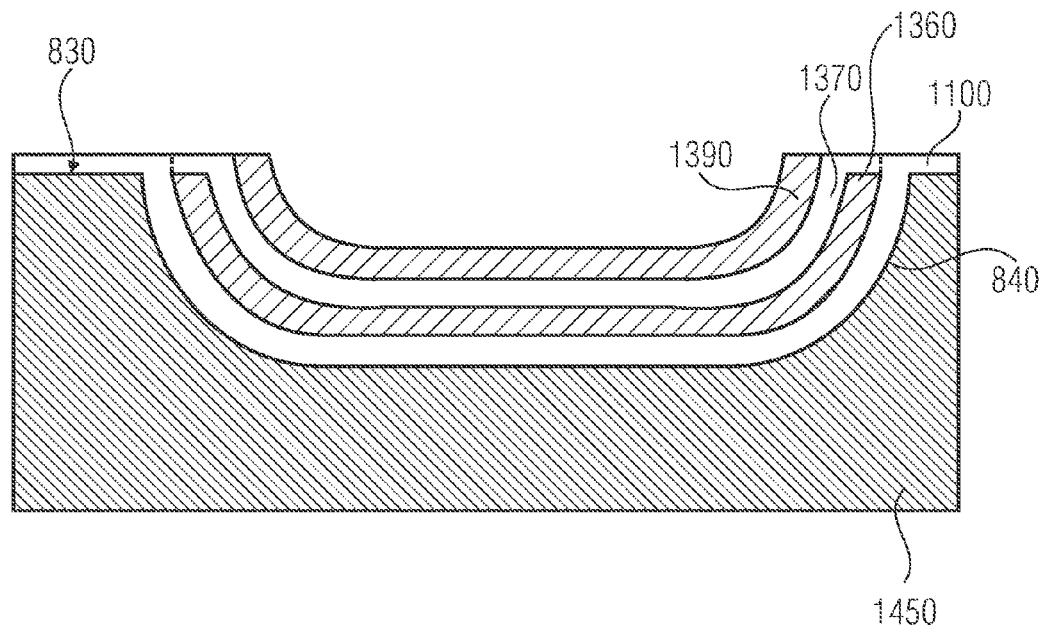
Figure 26I:
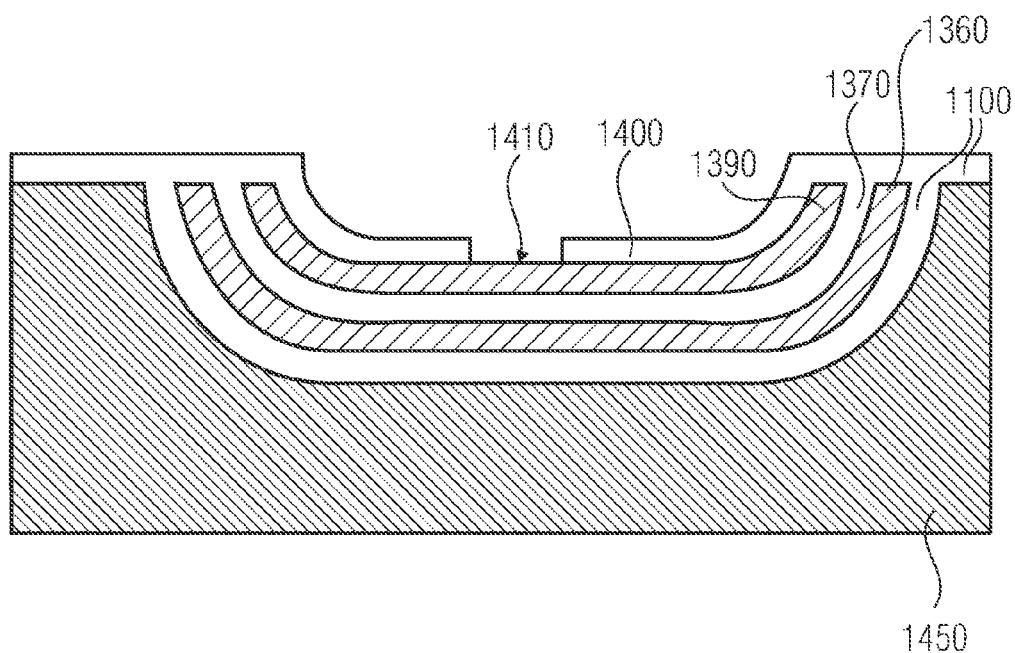

FIG. 26G shows the intermediate product forming after a further oxidation for providing the further insulating layer 1370 between the future poly-S 1360 and the poly-G 1390 which is deposited subsequently. Since the further insulating layer 1370 is arranged between these two polys 1360, 1390 and has resulted from the previously deposited polysilicon of the poly-S structure 1360 by means of an oxidation, it is also referred to as poly-oxide or "Polox". FIG. 26H shows the intermediate step of the device following a further CMP process step, in the context of which excessive polysilicon material of the poly-G 1390 and possibly excessive oxide was at least partly removed from the main surface 830.

Figure 26J:
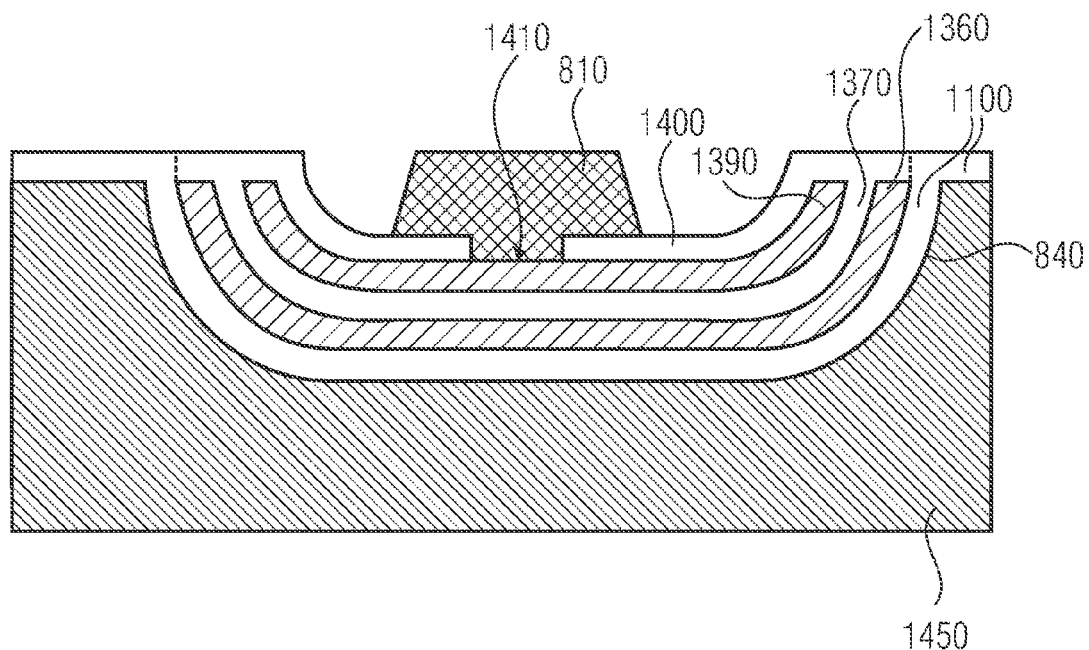

Subsequently, the further insulating layer 1400 is deposited, which in the case of an oxide is also referred to as an intermediate-oxide layer (INT OX). Subsequently, in a contact-hole etching step, a contact hole 1410 for contacting the poly G 1390 is introduced in the interior of the trench 840. After that, in the context of a deposition of the power metallization and of the structuring of the gate runner 810, the conductor layer structure 810 is created—in the form of the gate runner—inside the trench 840, on the previously structured layer structures, as is shown in FIG. 26J.

The deposition of the power metallization, which, in addition to the gate runner 810 as an example of a conductor layer structure 810, may also comprise the source metallization 1350 shown in FIGS. 23A, 23B and 24, may be realized, for example, using the sputtering method. Here, the respective metal also lines the contact hole 1410 and thus establishes electrical contact between the gate runner 810 and the underlying poly-G structure 1390.

As was already explained in connection with the overview of the respective device in the context of FIG. 25, the steps represented in FIGS. 26A to 26J refer to the position marked by A. By contrast, FIG. 26K shows a section through the device, prepared accordingly, along the direction marked as B in FIG. 25.

Figure 26K:
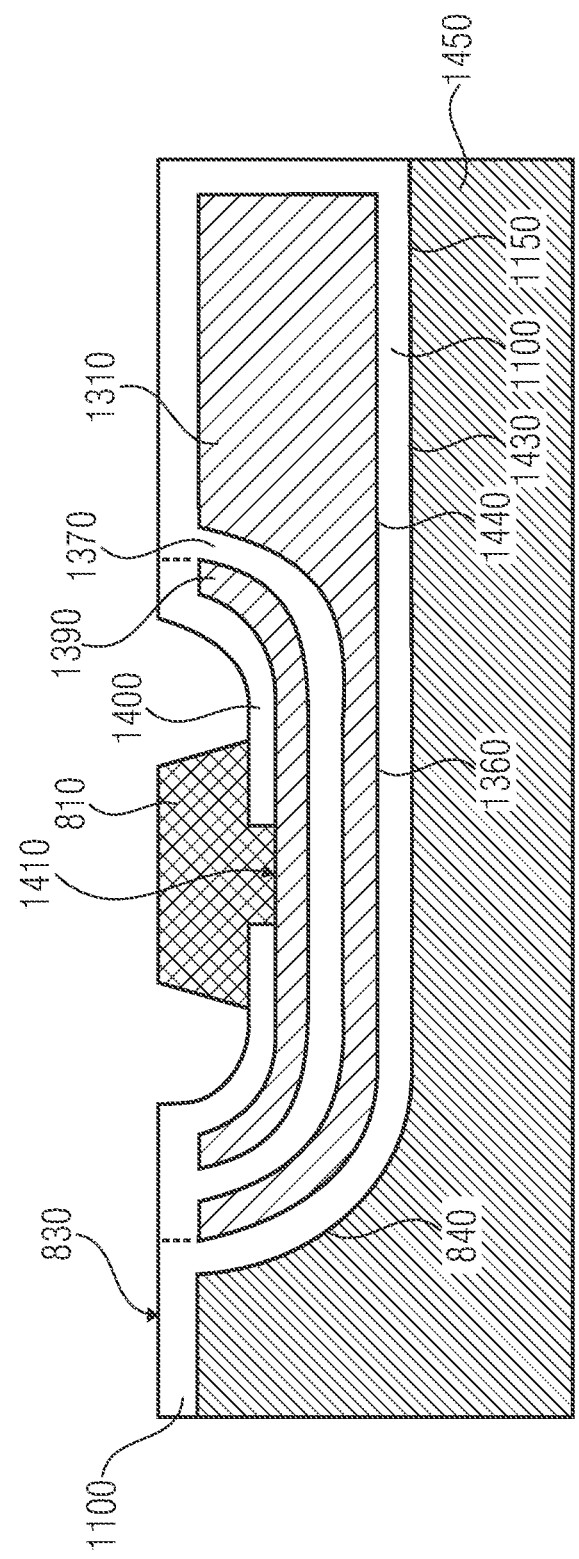

FIG. 26K shows a cross-section in the area of the terminal trench 1430 with a contacting of the source poly 1360. Essentially, the representation in FIG. 26K differs from that in FIG. 26J in that the feed trench 1430 along with the respective polysilicon structure 1440 leads into the trench 840. As was already shown in connection with FIG. 25, this feed trench 1430 in turn leads into the trench 1150 or a further feed trench, which extends perpendicularly to the cross-sectional plane shown in FIG. 26K. Thus, the latter then leads into the respective electrode 1310 of the trench 1150. Thus, FIG. 26K shows a section through orthogonal terminal trenches which connect the poly-S 1360 to a respective structure carrying the source potential.

Below, further embodiments will be discussed which enables a strong mechanical linkage of a metal structure of a semiconductor device to a semiconductor substrate. As described above, such linkages are realized by an intermeshing structure which comprises a structured device layer having at least one topology edge and by an adhesive connection between the metal structure and a polysilicon layer which is arranged between the substrate and the structured device layer. Due to miniaturization of the semiconductor device some semiconductor devices do not comprise the polysilicon layer. So, there is a need for an improved approach to enable good mechanical linkage of the metal layer without a plane polysilicon layer between the substrate and the structured device layer. This improved approach will be discussed in detail referring to the embodiments of FIGS. 27, 28A, 28B and 28C.

Figure 27:
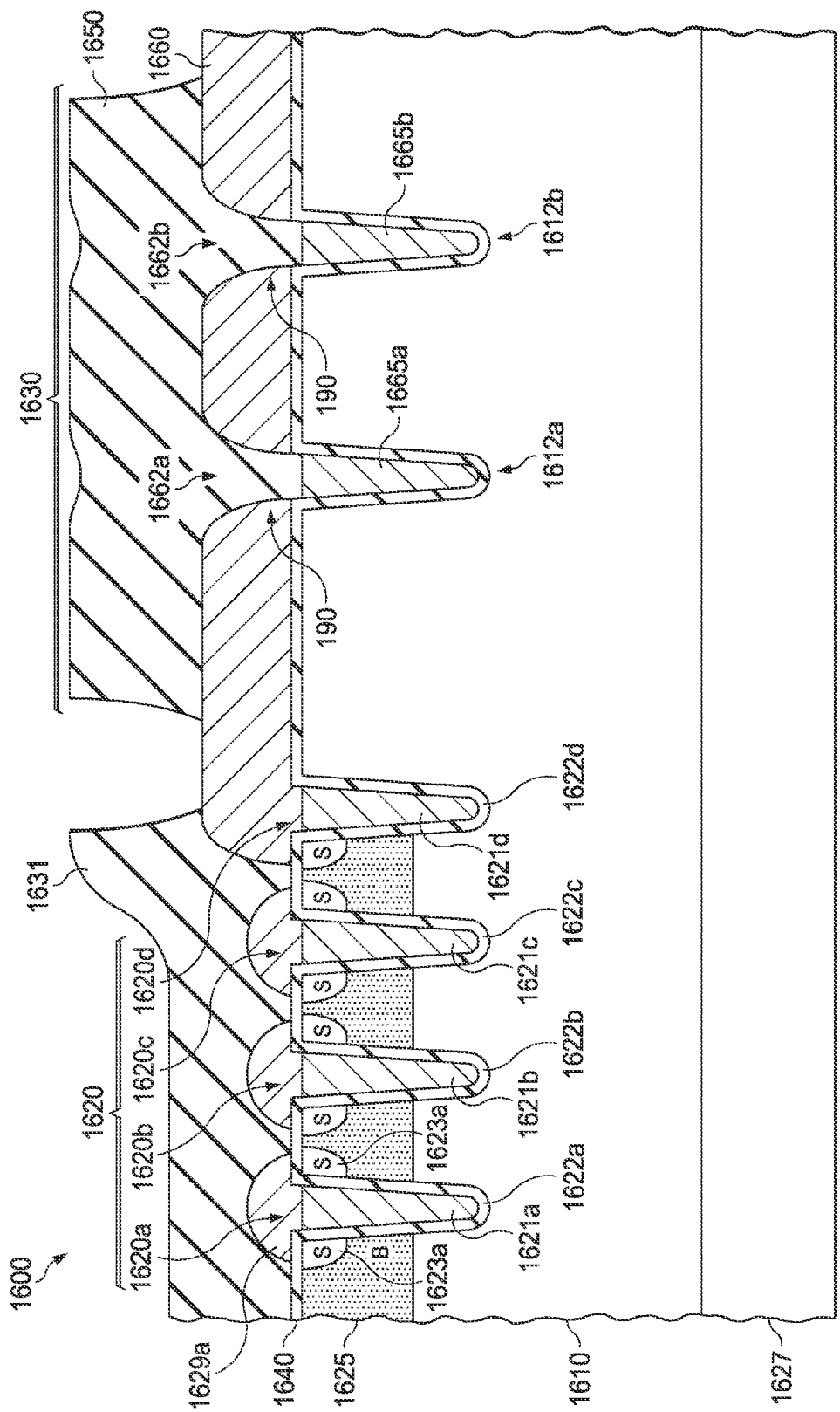
FIG. 27 exemplarily shows a cross-sectional view of a semiconductor device according to an embodiment.

FIG. 27 shows a semiconductor device 1600 which comprises a semiconductor substrate 1610 which may comprise a mono-crystalline material or an epitaxial material. The semiconductor device 1600 has a cell field 1620, also referred to as active area or chip area, and an outer area 1630, e.g. a peripheral area, formed on the semiconductor substrate 1610.

In this embodiment the cell field 1620 comprises four active cells 1620a, 1620b, 1620c and 1620d, for example, four transistors (e.g. MOSFET transistors). Here, portions of the active cells 1620a, 1620b, 1620c and 1620d, e.g. gates or other active cells are embedded in trenches 1622a, 1622b, 1622c and 1622d. Below, the structure of the active cells 1620a will exemplarily be discussed representatively of the active cells 1620b, 1620c and 1620d. In order to form the active cell 1620a and a vertical transistor structure, respectively, the trench 1622a is filled with a semiconductor material like polysilicon 1621a which forms the gate of the transistor structure. The gate, also referred to as polygate, is isolated from the substrate 1610 by an insulating layer 1640. The trench 1622a is surrounded by a source area 1623a of the transistor, wherein the source area 1623a (or source region 1623a) is arranged next to the main surface and electrically contacted by a metal source conductor 1631 which is arranged on the main surface of the substrate 1610 and on the insulating layer 1640, respectively. The source area 1623a and thus the trench 1622a are embedded in a bulk area 1625 forming a base of a vertical field effect transistor structure. A drain area 1627 of the vertical transistor structure 1620a is arranged within the substrate 1610 opposing to the main surface of the substrate 1610 such that a low doped area (compared to the drain area 1627 or drain region 1627) is formed between the drain area 1627 and the bulk area 1625 which is formed by a doped well (and thus between the drain area 1627 and the source area 1623a). Furthermore, each trench 1622a, 1622b, 1622c and 1622d filled with polysilicon 1621a is covered by an oxide 1629a for isolating same against the metal source conductor 1631.

In the outer area 1630 an intermeshing structure is formed to ensure the reliability of the semiconductor device 1600 in case of temperature cycling (TC). Temperature cycling may cause lifted metal lines or shifted metal lines of a metal structure, as explained above. In this embodiment, the intermeshing structure comprises a metal structure 1650, an intermediate insulating layer 1660, and two support structures 1665a and 1665b which are embedded in two recesses 1612a and 1612b of the substrate 1610.

The metal structure 1650 is arranged on the main surface of the intermediate insulating layer 1660 which may comprise an oxide, wherein same is structured such that it is interrupted by contact holes 1662a and 1662b. The intermediate insulating layer 1660 is arranged on the semiconductor substrate 1610 which comprises the two recesses 1612a and 1612b. The two recesses 1612a and 1612b are aligned with the contact holes 1662a and 1662b. The two recesses 1612a and 1612b are filled with polysilicon in order to form the two support structures 1665a and 1665b of the intermeshing structure. It should be noted that the two recesses 1612a and 1612b and thus the two support structures 1665a and 1665b are separated from the cell field 1620 and thus not part of same. In other words, the polysilicon of the support 1665a or 1665b does not form an active area or a portion of a transistor structure or a transistor structure. Therefore, such support structures 1665a and 1665b are typically not arranged adjacent to an active area (e.g. source area or gate area of a transistor structure) and are not connected to a polysilicon layer of the layout of the semiconductor device 1600. I.e. the area of the substrate 1610 abutting the recess 1612a and 1612b is un-connected and/or floating so that this region does not form any basis, drain or source region of any transistor.

A distance between the recesses 1612a or 1612b and the trenches 1622a, 1622b, 1622c and 1622d of the cell field 1620 may be larger than 25 µm, 50 µm or even larger than 250 µm. This distance enables that impedance between the respective recesses 1612a or 1612b and the cell field 1620 is basically infinite so that a voltage of the support structures 1665a and 1665b does not influence the active cells 1620a, 1620b, 1620c and 1620d.

The metal structure 1650, e.g. comprising a titanium-titanium-azote-tungsten-aluminum-copper material or a titanium-azote material, extends through the contact holes 1662a and 1662b up to the support structure 1665a and 1665b. In other words, the metal structure 1650 and a portion of the metal structure 1650, respectively, is embedded into the contact holes 1662a and/or 1662b and a material junction between the metal structure 1650 and the support structure 1665a and 1665b is formed. Due to the material junction between titanium-titanium-azote material and polysilicon an adherent connection between the metal structure 1650 and the support structure 1665a and 1665b is generated. It should be noted that the source conductor 1631 is arranged in parallel to the metal structure 1650, but isolated from same by a gap.

Due to the intermeshing structure, which forms a topology edge 190 between the metal structure 1650 and the contact holes 1662a and 1662b of the intermediate insulating layer 1660, and the material junctions between the metal structure 1650 and the support structures 1665a and 1665b, respectively, the mechanical linkage is improved. Consequently, the risk of failures of the semiconductor device 1600 caused by temperature cycling is reduced. Such an intermeshing structure may preferably be applied to metal structures which are arranged at peripheral areas, like a gate-runner structure or a contact region which surrounds the cell field 1620. The background thereon is that the temperature cycling stress occurs at peripheral areas due to different coefficients of extension of a semiconductor material, the material of the metal structure and/or of the housing. Therefore, according to further embodiments, the metal structure in the outer area 1630 may be a gate-runner structure or a contact region of the peripheral region.

In this embodiment, the intermeshing structure exemplarily comprises two support structures 1665*a* and 1665*b*, and thus two recesses 1612*a* and 1612*b* as well as two contact holes 1662*a* and 1662*b*, but it should be noted that the intermeshing structure may also comprise just one support structure 1665*a* and consequently just one recess 1612*a* and one contact hole 1662*a* or more than two support structures, recesses and contact holes.

According to another embodiment, the support structure 1665*a* and 1665*b* is isolated by the insulating layer 1640 which is arranged on the substrate 1610 and within the recess 1612*a* and 1612*b* such that the support structure is not electrically connected to the cell field 1620 via or within the semiconductor substrate 1610.

Figure 28A:
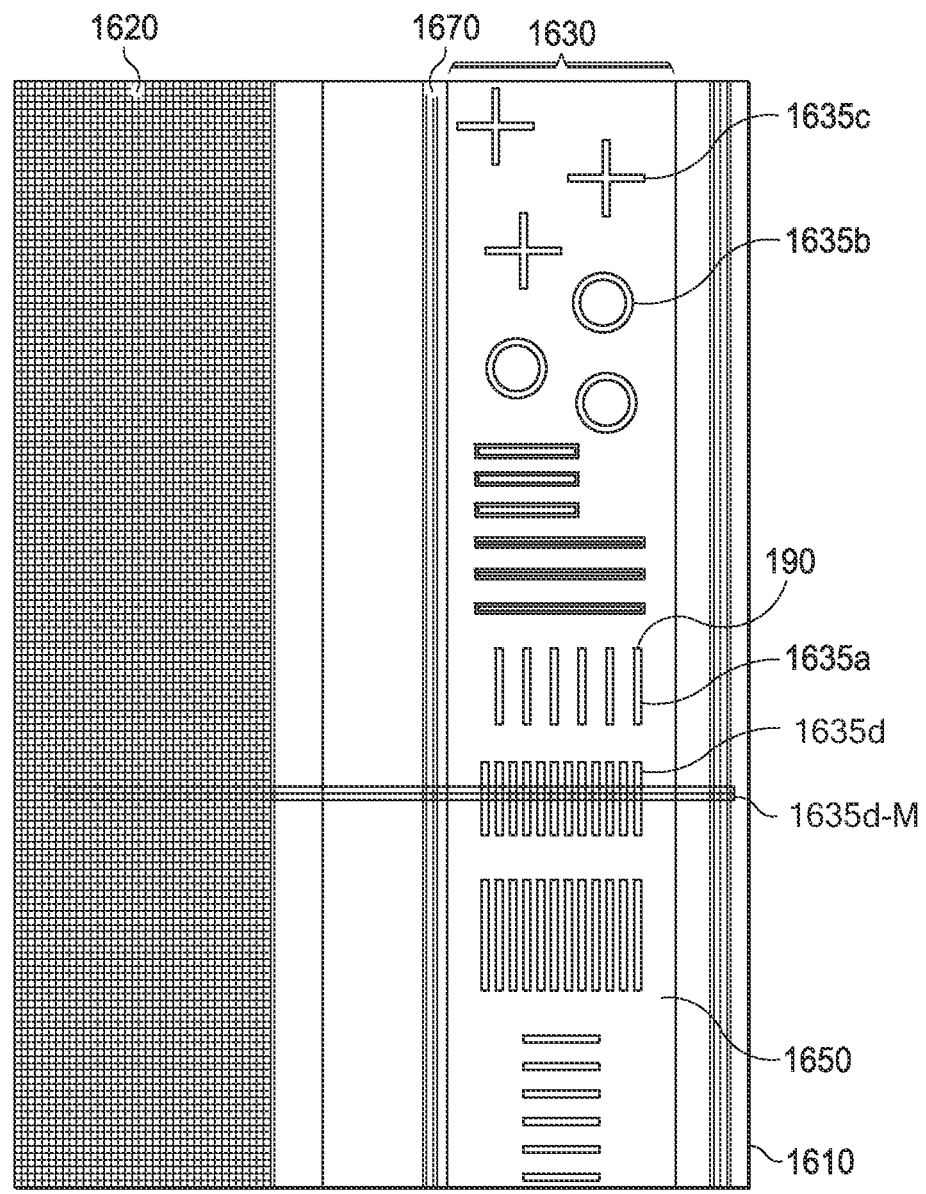
FIG. 28A exemplarily shows the top view of a semiconductor device according to an embodiment.

FIG. 28A shows a layer of a semiconductor device which comprises the cell field 1620 and the outer area 1630 in which the one or more intermeshing structures are arranged. In the outer area 1630 the metal structure 1650 is arranged in parallel to the cell field 1620 and attached to the substrate 1610 by a plurality of different intermeshing structures. The different intermeshing structures may have a different shape and/or a different orientation related to the metal structure 1650. Below, three intermeshing structures 1635*a*, 1635*b* and 1635*c* will exemplarily be discussed.

The intermeshing structure 1635*a* comprises six parallel, oblong contact holes which are arranged in parallel to the metal structure 1650. Here, the six oblong contact holes are provided into an intermediate insulating layer which is arranged between the metal structure 1650 and the substrate 1610. These oblong contact holes are aligned to six oblong recesses formed by parallel oblong trenches which are filled with polysilicon. These trenches differ from the trenches of the cell field 1620 regarding its lengths so that the lengths of the trenches of the intermeshing structure 1635*a* may be at least 20% or 50% smaller compared to the trenches of the cell field 1620. It should be noted that the trenches may have a different width (e.g. 0.01 µm to 25 µm) and a different distance from each other so that the respective intermeshing structure may be adapted to the respective requirements. According to the embodiment of FIG. 27 the metal structure 1650 extends through the oblong contact holes up to the support structure formed by the polysilicon in the tranches so that the topology of the metal structure 1650 forms topology edges 190.

The intermeshing structure 1635*b* has a cycle shape, wherein the intermeshing structure 1635*c* has a cross-shape. As discussed above, each of these intermeshing structures 1635*b* and 1635*c* comprise at least one recess 1612 formed by a trench, a support structure and a metal structure 1650 which are aligned to each other so that the respective topology edges are formed.

The cell field 1620 and the outer area 1630, e.g. a peripheral area or gate-runner structure or contact region, are separated by a channel stop 1670. This channel stop 1670 may be formed by a further trench which extends from a main surface of a substrate 1610 at least partially into the substrate so that the outer area 1630 is (electrically) isolated from the cell field 1670 within the substrate 1610. The channel stop 1670 may comprise at least one electrode which is arranged in the channel stop trench.

Below, a further intermeshing structure 1635*d* will be discussed in detail referring to FIG. 28B, wherein the sectional plane of FIG. 28B is illustrated by a marker 1635*d*-M in FIG. 28A.

FIG. 28B shows in a first view (1) a cross-sectional view through the intermeshing structure 1635*d* and in a second view (2) a top view on the intermeshing structure 1635*d*. Here, the intermeshing structure comprises twelve elongated trenches 1612, twelve contact holes 1662 and twelve support structures 1665. The metal structure 1650 is arranged on the intermediate insulating layer 1660 and within the contact holes 1662. According to the embodiment of FIG. 27 the metal structure 1650 is clawed to the underground, namely to the substrate 1610 and to the trenches 1612 of the substrate 1610, due to the support structures 1665 and the topology edges 190 formed by the contact holes 1662 and adhered to the support structure 1665.

As described above, the gate-runner structure 1630 is separated from the cell field 1620 by the channel stop 1670. The cell field 1620 comprises a plurality of active cells which are contacted via a further metal structure 1666. This contact structure 1666 may be connected to the metal structure 1650 above the surface of the substrate 1610.

FIG. 28C shows a current semiconductor device (Cf. SFET5 base sense variant, successor of the SFET5). This semiconductor device 1680 comprises a cell field 1682 and a peripheral area 1684. The semiconductor device 1680 further comprises a channel stop 1683 between the cell field 1682 and the peripheral area 1684. The above discussed intermeshing structure may be applied in this peripheral area 1684.

Even if, in the context of the above-described embodiments of the present invention, the further terminal structure has included, as a further conductor layer structure 1360, only one, semiconducting layer (polysilicon) in each case, same may basically be replaced by any conductor layer structure, which may only comprise a metal layer, an alloy layer, a semiconducting layer or any combination of the above-mentioned layers. Likewise, it may possibly also be advisable to insert insulating materials into the respective conductor layer structure 1360, in turn, as long as the fundamental capacity of the respective conductor layer structure of conducting an electrical voltage or an electrical current is at least not fully suppressed.

Even if, in the above embodiments of the present invention, the conductor layer structure 810 was described in the form of a single metal line, more specifically in the form of a gate runner, any conductor layer structures 810 comprising at least one metal layer may basically be employed in this respect. In this context, it should be noted that layers which comprise an alloy shall also be considered as metal layers for the purposes of the present description.

The conductor layer structure 810 as is shown in the embodiments previously described here may at least partly fill the respective trench or recess 840 such that a width of the respective recess is entirely filled by the conductor layer structure 810, at least over part of the depth of the recess 840. Likewise, the conductor layer structure may project beyond the main surface 830 of the device.

Generally speaking, the structures which are placed deeper down basically may be stand-alone structures. Thus, the respective structures which are placed deeper down, and which are to be anchored, may be exclusively a metal or exclusively a polysilicon structure. The structure which is placed deeper down, i.e. the conductor layer structure 810, may just as well be only a poly-S structure or a poly-G structure, for example, which is arranged within the deep trench 840, respectively. As was already mentioned before, however, these may also be formed in any combination. The process for their production, respectively, may basically be combined and used in any manner desired. If, for example, relatively flat trenches are used for performing the operation of lowering at rather high voltage classes, the cell field trench etching described in connection with FIG. 26A may possibly also be used for the anchoring structures. If comparatively deep trenches are necessitated for lowering one or several polysilicon layers and/or metal lines at medium to low voltage classes, the process described here may possibly be employed. In variations, the method described here may also be configured, in principle, such that it may fully dispense with a first cell field trench etching, for example if very flat cell field trenches having depths of less than 1.5 µm or planar transistors are to be produced, to list only two potential examples of a multitude of potential further implementations. In such a case, the deep anchoring trenches may be realized by the method described here alone.

Thus, for manufacturing the trenches and recesses within the context of embodiments of the present invention, there are the possibilities of manufacturing same, for example, by cell field trench etching alone, i.e. by an etching process which tends to be anisotropic in nature, or by means of resist etching alone, i.e. by a more isotropic etching which is performed, for example, by means of wet-chemistry, or also by any combinations of these different etching approaches. By using these etching methods, layouts comprising almost any type of overlap or undercut—sometimes also referred to as underlap—may be realized for the respective etching process.

Depending on the specific implementation, the above-described method may be implemented in an almost cost-neutral manner, since in many processes of manufacturing devices, a respective resist process is already part of the associated process flow. In addition, there is the possibility of rationalizing the entire chip-rim design, in the case of vertical field-effect transistors, by placing the gate runner structure deeper down, which may allow, in particular for relatively small chip surface areas, a considerable reduction in cost.

Of course, the above-described embodiments and methods for manufacturing anchoring and intermeshing structures may be combined with each other in a wide field of application. For example, the trench 840 may be produced, in the embodiments of FIGS. 23 to 26, such that projections as are described in connection with FIGS. 18 to 22 are formed in the respective bottom area of the trench 840. Also, the respective contact holes, for example contact hole 1410, may be realized as in the context of FIGS. 5 to 7. Likewise, respective other edges, for example edges of oblong contact holes, may be configured as in the context of FIGS. 8 to 11. Also, anchoring and intermeshing structures as are described in FIGS. 12 and 13 may be employed in the context of insulating layers or conductive structures, for example conductor layer structures. Depending on the specific implementation, the respective trenches may naturally also be implemented to comprise overhanging side walls, as is described in connection with FIGS. 2 to 4.

An anchoring structure 800 in accordance with an embodiment of the present invention comprises a device 820 having a main surface 830, a recess 840 extending into the device 820 starting from the main surface 830 of the device 820, and a conductor layer structure 810 extending, over a length of the conductor layer structure 810 and in a proportion of at least 20% of a cross-sectional area of the conductor layer structure 810, within the recess 840 below the main surface 830 of the device 820. Here, the conductor layer structure 810 comprises at least one metal layer 870.

With such an anchoring structure 800, the conductor layer structure 810 may entirely run, over the length, within the recess 840 below the main surface 830 of the device 820. Likewise, the recess 840 may be a trench within the device 820, or the conductor layer structure 810 may comprise a main surface 850 which faces away from the bottom of the recess 840 and which lies exposed at least with regard to part of the conductor layer structure 810.

In further embodiments of the present invention in the form of an anchoring structure 800, part of the conductor layer structure 810 may not entirely run within the recess 840 with regard to a length of the recess 840. However, this part amounts to a maximum of 5% of an overall length of the conductor layer structure 810 in relation to the recess 840. With an anchoring structure 800, the recess 840 may comprise a bottom, the anchoring structure 800 then further comprising a further conductor layer structure arranged between the conductor layer structure 810 and the bottom of the recess 840. In such a case, the further conductor layer structure 1360 is coupled to a terminal structure, so that the further conductor layer structure 1360 may be connected to an electrical potential.

In such a case, with the anchoring structure 800, an insulating layer 1370 may be arranged between the conductor layer structure 810 and the further conductor layer structure 1360, so that the conductor layer structure 810 is electrically insulated from the further conductor layer structure.

With anchoring structures 800 in accordance with an embodiment of the present invention, the recess 840 may be a trench 840 comprising a trench bottom 1070, the trench bottom 1070 comprising a projection 1060, and the conductor layer structure 810 being a metal structure comprising an indentation 1110 at an area facing the projection. Here, a maximum difference in height between the trench bottom 1070 of the recess 840 and the projection may amount to at least 200 nm or at least 5% of a depth of the recess or the trench 840. In these cases, the recess 840 may also comprise a plurality of projections 1060. Here, the conductor layer structure 810 may fill a width of the recess over at least 30% of a depth of the recess. Also, with such an anchoring structure 800, the recess 840 may comprise at least one portion having a width which deviates from a further portion of the recess 840. In addition, with an anchoring structure 800 in accordance with an embodiment of the present invention, a smallest width of the recess 840 may be larger than or equal to a width of the conductor layer structure 810. Likewise, with an anchoring structure 800, the conductor layer structure 810 may be arranged on a bottom of the recess 840.

In addition to the embodiments, described in the present application, of the different anchoring structures and intermeshing structures, these may naturally be combined with one another in various ways. For example, the embodiments, described in FIGS. 5 to 11, of intermeshing structures may be employed both in combination with each other, in any manner desired, and with embodiments of anchoring structures as are described, for example, in FIGS. 2 to 4 and 12 to 17. Likewise, the various embodiments of anchoring structures may quite possibly be combined with one another. Depending on the specific field of application, it is possible, for example, to employ embodiments of anchoring structures as were discussed in FIGS. 1 to 4 with those as were discussed in connection with FIG. 17. Likewise, a combination of the embodiments of anchoring structures as were discussed in connection with FIGS. 14 to 16 and of an embodiment of an anchoring structure as is depicted in FIG. 17 may be implemented and realized. Additionally, the recesses of the corresponding embodiments of the anchoring structures may naturally comprise topology edges as are additionally described also in terms of the embodiments of intermeshing structures. Anchoring and intermeshing structures as are illustrated in the context of the present description may thus be employed in any combinations as the above list of different possibilities of combinations may only partly indicate.

By these combinations, a significantly improved loading capability toward stress and other loads, which tend to shift conductor layer structures, metal surfaces, metal zones, metal lines or other metal faces along the surface of a device or a substrate by means of lateral forces, may be achieved. Likewise, increased resistance to vertical forces, or forces acting perpendicularly to the surfaces of the respective devices and substrates, may be provided by a corresponding combination or by individual implementations of different anchoring structures and/or intermeshing structures, so that a significantly improved loading capability and resistance to lifted metal lines, metal surfaces, metal zones and other conductor layer structures may be realized.

In addition, it shall be noted at this point that for all embodiments of anchoring structures and/or intermeshing structures, as well as their combinations, i.e. in particular for all devices, chips and substrates, metal layers, metal zones, metal structures and conductor layer structures typically lie exposed, so that they may be contacted, using bond wires or other contact wires, from that side which faces away from the substrate or device. In addition to bond wires, which may be applied, for example, by thermal bonding or by ultrasonic-aided bonding, the respective metal zones or conductor layer structures may also be electrically contacted by press-contacts or spring-loaded contacts. Optionally, at least part of the respective metal structures and/or conductor layer structures may possibly be covered by an (organic) protective layer, such as PMMA, BPSG or a different organic compound. In particular, however, the respective metal zones or conductor layer structures are generally hardly, or not at all, covered by oxide layers and/or nitride layers, as is the case, for example, in connection with CMOS devices (CMOS=complementary metal oxide semiconductor).

As was already explained before, summarizing reference numerals will be used below to simplify the following descriptions.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations and equivalents as fall within the true spirit and scope of the present invention.

Referring to FIG. 27, it should be noted that the support structure 1665a and 1665b, respectively, may be part of the metal structure 1650. Furthermore, it should be noted that the support structure 1665a and 1665b, respectively, may comprise a plurality of polysilicon portions, for example, to form a so-called dual-poly-trench. The plurality of the polysilicon portions which are separately provided may be isolated from each other so that at least one portion forms a floating portion.

Referring to FIG. 27, it should further be noted that the cell field 1620 may alternatively comprise lateral transistor structures.

According to a further embodiment, the metal structure 1650 may be formed as a layer stack, for example, for the purpose of combining different material properties. The metal structure 1650 and the metal stack may be formed by depositing.

Referring to the embodiment of FIG. 27 should be noted that the metal structure 1650 may be connected to the cells 1620a, 1620b, 1620c and 1620d via the metal source conductor 1631, wherein the intermeshing structure or, in more detail, the support structures 1665a and 1665b are separated from the cell field 1620 such that the support structure 1665a and 1665b is not part of the cell field 1620 or does not form a transistor structure.

What is claimed is:

1. An anchoring structure for a metal structure of a semiconductor device, the anchoring structure comprising:
    an anchoring recess structure comprising at least one overhanging sidewall, wherein the metal structure is at least partly arranged within the anchoring recess structure and below an overhang of the overhanging sidewall, wherein the overhanging sidewall is formed by a semiconductor substrate of the semiconductor device, wherein the semiconductor substrate comprises monocrystalline semiconductor in which the anchoring recess structure is formed so that the overhanging sidewall is formed by the semiconductor.

2. The anchoring structure according to claim 1, wherein the anchoring recess structure is partially filled with polysilicon.

3. The anchoring structure according to claim 1, wherein the overhanging sidewall has an angle of at least −3° related to a normal direction perpendicular to a main surface of the semiconductor device.

4. The anchoring structure according to claim 1, wherein the metal structure comprises deposited conforming metal such that the metal structure is anchored by the anchoring recess structure and abuts the overhanging sidewall.

5. The anchoring structure according to claim 1, wherein the metal structure is arranged such that the metal structure is adapted to the semiconductor substrate by an undercut tight fit.

6. An intermeshing structure for a device comprising a cell field and formed on a substrate, the intermeshing structure comprising:
    an intermediate insulating layer which is structured such that the intermediate insulating layer is interrupted by at least one contact hole;
    a metal structure on the intermediate insulating layer for connecting the cell field; and
    a support structure comprising polysilicon and embedded in a recess formed in the substrate and aligned with the contact hole, wherein the support structure is not part of the cell field,
    wherein the metal structure extends through the contact hole up to the support structure to which the metal structure is adherently connected.

7. The intermeshing structure according to claim 6, wherein the intermediate insulating layer is structured such that the intermediate insulating layer is interrupted by a plurality of contact holes,
    and wherein a plurality of support structures not being part of the cell field is embedded in a plurality of recesses formed in the substrate and aligned with a respective contact hole, and
    wherein the metal structure extends through the plurality of contact holes up to the plurality of support structures to which the metal structure is adherently connected.

8. The intermeshing structure according to claim 6, wherein the recess is formed by a trench in which the support structure is embedded, wherein the trench is aligned with the contact hole.

9. The intermeshing structure according to claim 6, wherein the recess is coated by an insulating layer so as to insulate the support structure against the substrate.

10. The intermeshing structure according to claim 6, wherein the recess is arranged within a peripheral area of the device, wherein the peripheral area surrounds the cell field.

11. The intermeshing structure according to claim 10, wherein the peripheral area comprises a gate-runner structure and/or a contact region.

12. The intermeshing structure according to claim 10, wherein the peripheral area is separated from the cell field by a channel stop trench.

13. The intermeshing structure according to claim 12, wherein the channel stop is formed by a trench which extends from a main surface of the substrate at least partially into the substrate, wherein at least one electrode is arranged in the channel stop trench.

14. The intermeshing structure according to claim 6, wherein the metal structure comprises titanium and azote and/or titanium-titanium-azote-tungsten-aluminum-copper.

15. An intermeshing structure for a device comprising a cell field and formed on a substrate, the intermeshing structure comprising:
- an intermediate insulating layer which is structured such that the intermediate insulating layer is interrupted by at least one contact hole;
- a metal structure on the intermediate insulating layer for connecting the cell field; and
- a support structure comprising polysilicon and embedded in a recess formed in the substrate and aligned with the contact hole, wherein the support structure is not part of the cell field,
- wherein the metal structure extends through the contact hole up to the support structure to which the metal structure is adherently connected,
- wherein the recess is coated by an insulating layer so as to insulate the support structure against the substrate,
- wherein the cell field is composed of at least one vertical transistor structure or at least one lateral transistor structure, and
- wherein the support structure is connected to the at least one vertical transistor structure or to the at least one lateral transistor merely via the metal structure.

16. The intermeshing structure according to claim 6, wherein the support structure is not part of a transistor.

17. The intermeshing structure according to claim 6, wherein the intermediate insulating layer comprises oxide.

18. An intermeshing structure comprising:
- a substrate comprising a main surface and a mono-crystalline semiconductor abutting the main surface of the substrate;
- a recess formed in the mono-crystalline semiconductor within the main surface of the substrate;
- an insulating layer formed on the main surface of the substrate; and
- a conductor layer structure comprising
- a metal layer which is formed on the insulating layer and extends through a hole of the insulating layer into the recess, and
- polysilicon at a bottom of the recess, wherein the polysilicon abuts the metal layer.

19. A semiconductor device comprising:
- a substrate;
- an active area formed in the substrate;
- an insulating layer formed on a surface of the substrate; and
- a metal layer formed on the insulating layer and contacting the active area, wherein a recess is formed in the substrate and filled with polysilicon, and
- wherein the metal layer extends through a hole in the insulating layer and adheres to the polysilicon.

* * * * *